United States Patent
Carroll et al.

(10) Patent No.: US 8,723,260 B1
(45) Date of Patent: May 13, 2014

(54) SEMICONDUCTOR RADIO FREQUENCY SWITCH WITH BODY CONTACT

(75) Inventors: Michael Carroll, Jamestown, NC (US); Daniel Charles Kerr, Oak Ridge, NC (US); Christian Rye Iversen, Vestbjerg (DK); Philip Mason, Greensboro, NC (US); Julio Costa, Oak Ridge, NC (US); Edward T. Spears, Oak Ridge, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 852 days.

(21) Appl. No.: 12/723,257

(22) Filed: Mar. 12, 2010

Related U.S. Application Data

(60) Provisional application No. 61/159,668, filed on Mar. 12, 2009.

(51) Int. Cl.
*H01L 21/00* (2006.01)

(52) U.S. Cl.
USPC .......................................... 257/347; 257/401

(58) Field of Classification Search
USPC ................................................. 257/347, 401
See application file for complete search history.

(56) References Cited

U.S. PATENT DOCUMENTS

| | | | |
|---|---|---|---|
| 3,699,359 A | 10/1972 | Shelby | |
| 3,975,671 A | 8/1976 | Stoll | |
| 3,988,727 A | 10/1976 | Scott | |
| 4,244,000 A | 1/1981 | Ueda et al. | |
| 4,256,977 A | 3/1981 | Hendrickson | |
| 4,316,101 A | 2/1982 | Minner | |
| 4,317,055 A | 2/1982 | Yoshida et al. | |
| 4,367,421 A | 1/1983 | Baker | |
| 4,456,888 A * | 6/1984 | Ayasli | 330/277 |
| 4,748,485 A | 5/1988 | Vasudev | |
| 4,809,056 A | 2/1989 | Shirato et al. | |
| 4,810,911 A | 3/1989 | Noguchi | |

(Continued)

FOREIGN PATENT DOCUMENTS

| | | |
|---|---|---|
| DE | 19832565 A1 | 8/1999 |
| EP | 0385641 A3 | 2/1990 |

(Continued)

OTHER PUBLICATIONS

Kelly, Dylan, "The State-of-the-Art of Silicon-on-Sapphire CMOS RF Switches," 2005, Compound Semiconductor Integrated Circuit Symposium, Oct. 30-Nov. 2, 2005, pp. 200-203, IEEE.

(Continued)

*Primary Examiner* — Eugene Lee
(74) *Attorney, Agent, or Firm* — Withrow & Terranova, P.L.L.C.

(57) ABSTRACT

The present disclosure relates to a radio frequency (RF) switch that includes multiple body-contacted field effect transistor (FET) elements coupled in series. The FET elements may be formed using a thin-film semiconductor device layer, which is part of a thin-film semiconductor die. Conduction paths between the FET elements through the thin-film semiconductor device layer and through a substrate of the thin-film semiconductor die may be substantially eliminated by using insulating materials. Elimination of the conduction paths allows an RF signal across the RF switch to be divided across the series coupled FET elements, such that each FET element is subjected to only a portion of the RF signal. Further, each FET element is body-contacted and may receive reverse body biasing when the RF switch is in an OFF state, thereby reducing an OFF state drain-to-source capacitance of each FET element.

25 Claims, 20 Drawing Sheets

(56) References Cited

U.S. PATENT DOCUMENTS

| | | | |
|---|---|---|---|
| 4,849,651 A | 7/1989 | Estes, Jr. |
| 4,890,077 A | 12/1989 | Sun |
| 4,906,587 A | 3/1990 | Blake |
| 4,929,855 A | 5/1990 | Ezzeddine |
| 4,984,040 A | 1/1991 | Yap |
| 4,985,647 A | 1/1991 | Kawada |
| 5,001,528 A | 3/1991 | Bahraman |
| 5,012,123 A | 4/1991 | Ayasli et al. |
| 5,061,911 A | 10/1991 | Weidman et al. |
| 5,081,706 A | 1/1992 | Kim |
| 5,095,348 A | 3/1992 | Houston |
| 5,124,762 A | 6/1992 | Childs et al. |
| 5,146,178 A | 9/1992 | Nojima et al. |
| 5,148,393 A | 9/1992 | Furuyama |
| 5,157,279 A | 10/1992 | Lee |
| 5,272,457 A | 12/1993 | Heckaman et al. |
| 5,283,457 A | 2/1994 | Matloubian |
| 5,285,367 A | 2/1994 | Keller |
| 5,306,954 A | 4/1994 | Chan et al. |
| 5,313,083 A | 5/1994 | Schindler |
| 5,345,422 A | 9/1994 | Redwine |
| 5,350,957 A | 9/1994 | Cooper et al. |
| 5,375,257 A | 12/1994 | Lampen |
| 5,405,795 A | 4/1995 | Beyer et al. |
| 5,416,043 A | 5/1995 | Burgener et al. |
| 5,442,327 A | 8/1995 | Longbrake et al. |
| 5,448,207 A | 9/1995 | Kohama |
| 5,477,184 A | 12/1995 | Uda et al. |
| 5,488,243 A | 1/1996 | Tsuruta et al. |
| 5,492,857 A | 2/1996 | Reedy et al. |
| 5,493,249 A | 2/1996 | Manning |
| 5,528,056 A * | 6/1996 | Shimada et al. ............ 257/72 |
| 5,548,239 A | 8/1996 | Kohama |
| 5,553,295 A | 9/1996 | Pantelakis et al. |
| 5,559,368 A | 9/1996 | Hu et al. |
| 5,572,040 A | 11/1996 | Reedy et al. |
| 5,578,853 A | 11/1996 | Hayashi et al. |
| 5,581,106 A | 12/1996 | Hayashi et al. |
| 5,594,371 A | 1/1997 | Douseki |
| 5,596,205 A | 1/1997 | Reedy et al. |
| 5,597,739 A | 1/1997 | Sumi et al. |
| 5,600,169 A | 2/1997 | Burgener et al. |
| 5,600,588 A | 2/1997 | Kawashima |
| 5,610,533 A | 3/1997 | Arimoto et al. |
| 5,616,935 A * | 4/1997 | Koyama et al. ............ 257/69 |
| 5,629,655 A | 5/1997 | Dent |
| 5,663,570 A | 9/1997 | Reedy et al. |
| 5,681,761 A | 10/1997 | Kim |
| 5,689,144 A | 11/1997 | Williams |
| 5,694,308 A | 12/1997 | Cave |
| 5,699,018 A | 12/1997 | Yamamoto et al. |
| 5,717,356 A | 2/1998 | Kohama |
| 5,723,885 A * | 3/1998 | Ooishi ............ 257/295 |
| 5,729,039 A | 3/1998 | Beyer et al. |
| 5,731,607 A | 3/1998 | Kohama |
| 5,748,016 A | 5/1998 | Kurosawa |
| 5,748,053 A | 5/1998 | Kameyama et al. |
| 5,753,955 A | 5/1998 | Fechner |
| 5,760,652 A | 6/1998 | Maemura et al. |
| 5,767,549 A | 6/1998 | Chen et al. |
| 5,774,411 A | 6/1998 | Hsieh et al. |
| 5,774,792 A | 6/1998 | Tanaka et al. |
| 5,777,530 A | 7/1998 | Nakatuka |
| 5,784,311 A | 7/1998 | Assaderaghi et al. |
| 5,784,687 A | 7/1998 | Itoh et al. |
| 5,793,246 A | 8/1998 | Vest et al. |
| 5,801,577 A | 9/1998 | Tailliet |
| 5,804,858 A | 9/1998 | Hsu et al. |
| 5,807,772 A | 9/1998 | Takemura |
| 5,812,939 A | 9/1998 | Kohama |
| 5,814,899 A | 9/1998 | Okumura et al. |
| 5,818,099 A | 10/1998 | Burghartz |
| 5,818,278 A | 10/1998 | Yamamoto et al. |
| 5,818,283 A | 10/1998 | Tonami et al. |
| 5,818,766 A | 10/1998 | Song |
| 5,821,769 A | 10/1998 | Douseki |
| 5,821,800 A | 10/1998 | Le et al. |
| 5,825,227 A | 10/1998 | Kohama et al. |
| 5,861,336 A | 1/1999 | Reedy et al. |
| 5,863,823 A | 1/1999 | Burgener |
| 5,874,836 A | 2/1999 | Nowak et al. |
| 5,874,849 A | 2/1999 | Marotta et al. |
| 5,877,978 A | 3/1999 | Morishita et al. |
| 5,878,331 A | 3/1999 | Yamamoto et al. |
| 5,883,396 A | 3/1999 | Reedy et al. |
| 5,883,541 A | 3/1999 | Tahara et al. |
| 5,892,260 A | 4/1999 | Okumura et al. |
| 5,892,382 A | 4/1999 | Ueda et al. |
| 5,895,957 A | 4/1999 | Reedy et al. |
| 5,903,178 A | 5/1999 | Miyatsuji et al. |
| 5,912,560 A | 6/1999 | Pasternak |
| 5,917,362 A | 6/1999 | Kohama |
| 5,920,233 A | 7/1999 | Denny |
| 5,926,466 A | 7/1999 | Ishida et al. |
| 5,930,605 A | 7/1999 | Mistry et al. |
| 5,930,638 A | 7/1999 | Reedy et al. |
| 5,945,867 A | 8/1999 | Uda et al. |
| 5,969,560 A | 10/1999 | Kohama et al. |
| 5,973,363 A | 10/1999 | Staab et al. |
| 5,973,382 A | 10/1999 | Burgener et al. |
| 5,973,636 A | 10/1999 | Okubo et al. |
| 5,990,580 A | 11/1999 | Weigand |
| 6,020,778 A | 2/2000 | Shigehara et al. |
| 6,049,110 A | 4/2000 | Koh |
| 6,057,555 A | 5/2000 | Reedy et al. |
| 6,057,723 A | 5/2000 | Yamaji et al. |
| 6,061,267 A | 5/2000 | Houston |
| 6,064,872 A | 5/2000 | Vice |
| 6,066,993 A | 5/2000 | Yamamoto et al. |
| 6,081,694 A | 6/2000 | Matsuura et al. |
| 6,084,255 A | 7/2000 | Ueda et al. |
| 6,087,893 A | 7/2000 | Oowaki et al. |
| 6,094,088 A | 7/2000 | Yano |
| 6,100,564 A | 8/2000 | Bryant et al. |
| 6,104,061 A | 8/2000 | Forbes et al. |
| 6,111,778 A | 8/2000 | MacDonald et al. |
| 6,114,923 A | 9/2000 | Mizutani |
| 6,118,343 A | 9/2000 | Winslow |
| 6,133,752 A | 10/2000 | Kawagoe |
| 6,160,292 A | 12/2000 | Flaker et al. |
| 6,172,378 B1 | 1/2001 | Hull et al. |
| 6,173,235 B1 | 1/2001 | Maeda |
| 6,177,826 B1 | 1/2001 | Mashiko et al. |
| 6,188,247 B1 | 2/2001 | Storino et al. |
| 6,188,590 B1 | 2/2001 | Chang et al. |
| 6,191,449 B1 | 2/2001 | Shino |
| 6,201,761 B1 | 3/2001 | Wollesen |
| 6,215,360 B1 | 4/2001 | Callaway, Jr. |
| 6,218,248 B1 | 4/2001 | Hwang et al. |
| 6,218,724 B1 * | 4/2001 | Ukita et al. ............ 257/538 |
| 6,218,890 B1 | 4/2001 | Yamaguchi et al. |
| 6,218,892 B1 | 4/2001 | Soumyanath et al. |
| 6,222,394 B1 | 4/2001 | Allen et al. |
| 6,239,649 B1 | 5/2001 | Bertin et al. |
| 6,249,027 B1 | 6/2001 | Burr |
| 6,249,029 B1 | 6/2001 | Bryant et al. |
| 6,255,695 B1 * | 7/2001 | Kubota et al. ............ 257/351 |
| 6,281,737 B1 | 8/2001 | Kuang et al. |
| 6,288,458 B1 | 9/2001 | Berndt |
| 6,300,796 B1 | 10/2001 | Troutman et al. |
| 6,304,110 B1 | 10/2001 | Hirano |
| 6,308,047 B1 | 10/2001 | Yamamoto et al. |
| 6,320,225 B1 | 11/2001 | Hargrove et al. |
| 6,341,087 B1 | 1/2002 | Kunikiyo |
| 6,356,536 B1 | 3/2002 | Repke |
| 6,365,488 B1 | 4/2002 | Liao |
| 6,380,793 B1 | 4/2002 | Bancal et al. |
| 6,387,739 B1 | 5/2002 | Smith, III |
| 6,392,440 B2 | 5/2002 | Nebel |
| 6,392,467 B1 | 5/2002 | Oowaki et al. |
| 6,396,325 B2 | 5/2002 | Goodell |
| 6,407,427 B1 | 6/2002 | Oh |
| 6,407,614 B1 | 6/2002 | Takahashi |
| 6,429,487 B1 | 8/2002 | Kunikiyo |

(56) References Cited

U.S. PATENT DOCUMENTS

| | | | |
|---|---|---|---|
| 6,433,587 B1 | 8/2002 | Assaderaghi et al. | |
| 6,433,589 B1 | 8/2002 | Lee | |
| 6,452,232 B1 | 9/2002 | Adan | |
| 6,461,902 B1 | 10/2002 | Xu et al. | |
| 6,466,082 B1 | 10/2002 | Krishnan | |
| 6,469,568 B2 | 10/2002 | Toyoyama et al. | |
| 6,486,511 B1 | 11/2002 | Nathanson et al. | |
| 6,498,058 B1 | 12/2002 | Bryant et al. | |
| 6,498,370 B1 | 12/2002 | Kim et al. | |
| 6,504,212 B1 | 1/2003 | Allen et al. | |
| 6,504,213 B1 | 1/2003 | Ebina | |
| 6,512,269 B1 | 1/2003 | Bryant et al. | |
| 6,518,645 B2 | 2/2003 | Bae et al. | |
| 6,521,959 B2 | 2/2003 | Kim et al. | |
| 6,537,861 B1 | 3/2003 | Kroell et al. | |
| 6,563,366 B1 | 5/2003 | Kohama | |
| 6,573,533 B1* | 6/2003 | Yamazaki | 257/72 |
| 6,608,785 B2 | 8/2003 | Chuang et al. | |
| 6,608,789 B2 | 8/2003 | Sullivan et al. | |
| 6,631,505 B2 | 10/2003 | Arai | |
| 6,632,724 B2 | 10/2003 | Henley et al. | |
| 6,642,119 B1* | 11/2003 | Pelella et al. | 438/303 |
| 6,642,578 B1 | 11/2003 | Arnold et al. | |
| 6,646,305 B2 | 11/2003 | Assaderaghi et al. | |
| 6,653,697 B2 | 11/2003 | Hidaka et al. | |
| 6,677,803 B1 | 1/2004 | Chiba | |
| 6,693,326 B2 | 2/2004 | Adan | |
| 6,693,498 B1 | 2/2004 | Sasabata et al. | |
| 6,698,082 B2 | 3/2004 | Crenshaw et al. | |
| 6,698,498 B1 | 3/2004 | Ziegelaar et al. | |
| 6,703,863 B2 | 3/2004 | Gion | |
| 6,711,397 B1 | 3/2004 | Petrov et al. | |
| 6,762,477 B2 | 7/2004 | Kunikiyo | |
| 6,774,701 B1 | 8/2004 | Heston et al. | |
| 6,781,805 B1 | 8/2004 | Urakawa | |
| 6,790,747 B2 | 9/2004 | Henley et al. | |
| 6,803,680 B2 | 10/2004 | Brindle et al. | |
| 6,804,502 B2* | 10/2004 | Burgener et al. | 455/333 |
| 6,830,963 B1 | 12/2004 | Forbes | |
| 6,836,172 B2 | 12/2004 | Okashita | |
| 6,870,241 B2 | 3/2005 | Nakatani et al. | |
| 6,897,701 B2 | 5/2005 | Chen et al. | |
| 6,898,778 B2 | 5/2005 | Kawanaka | |
| 6,908,832 B2 | 6/2005 | Farrens et al. | |
| 6,917,258 B2 | 7/2005 | Kushitani et al. | |
| 6,933,744 B2 | 8/2005 | Das et al. | |
| 6,969,668 B1 | 11/2005 | Kang et al. | |
| 6,975,271 B2 | 12/2005 | Adachi et al. | |
| 6,978,122 B2 | 12/2005 | Kawakyu et al. | |
| 6,978,437 B1 | 12/2005 | Rittman et al. | |
| 7,045,873 B2 | 5/2006 | Chen et al. | |
| 7,056,808 B2 | 6/2006 | Henley et al. | |
| 7,057,472 B2 | 6/2006 | Fukamachi et al. | |
| 7,058,922 B2 | 6/2006 | Kawanaka | |
| 7,082,293 B1 | 7/2006 | Rofougaran et al. | |
| 7,092,677 B1 | 8/2006 | Zhang et al. | |
| 7,132,873 B2 | 11/2006 | Hollmer | |
| 7,138,846 B2 | 11/2006 | Suwa et al. | |
| 7,173,471 B2 | 2/2007 | Nakatsuka et al. | |
| 7,187,028 B2* | 3/2007 | King | 257/314 |
| 7,199,635 B2* | 4/2007 | Nakatsuka et al. | 327/308 |
| 7,269,392 B2 | 9/2007 | Nakajima et al. | |
| 7,345,521 B2 | 3/2008 | Takahashi et al. | |
| 7,404,157 B2 | 7/2008 | Tanabe | |
| 7,405,982 B1 | 7/2008 | Flaker et al. | |
| 7,460,852 B2 | 12/2008 | Burgener et al. | |
| 7,515,882 B2 | 4/2009 | Kelcourse et al. | |
| 7,561,853 B2 | 7/2009 | Miyazawa | |
| 7,616,482 B2 | 11/2009 | Prall | |
| 7,619,462 B2 | 11/2009 | Kelly et al. | |
| 7,910,993 B2* | 3/2011 | Brindle et al. | 257/347 |
| 7,927,934 B2* | 4/2011 | Min et al. | 438/162 |
| 2001/0015461 A1 | 8/2001 | Ebina | |
| 2001/0040479 A1 | 11/2001 | Zhang | |
| 2001/0045602 A1 | 11/2001 | Maeda et al. | |
| 2002/0195623 A1 | 12/2002 | Horiuchi | |
| 2003/0002452 A1 | 1/2003 | Sahota | |
| 2003/0181167 A1 | 9/2003 | Iida | |
| 2003/0222313 A1* | 12/2003 | Fechner | 257/348 |
| 2004/0080364 A1 | 4/2004 | Sander et al. | |
| 2004/0242182 A1 | 12/2004 | Hidaka et al. | |
| 2005/0079829 A1 | 4/2005 | Ogawa et al. | |
| 2005/0127442 A1 | 6/2005 | Veeraraghavan et al. | |
| 2006/0009164 A1 | 1/2006 | Kataoka | |
| 2006/0194558 A1 | 8/2006 | Kelly | |
| 2006/0199563 A1 | 9/2006 | Kelly et al. | |
| 2007/0018247 A1 | 1/2007 | Brindle et al. | |
| 2008/0265978 A1 | 10/2008 | Englekirk | |
| 2009/0039438 A1* | 2/2009 | Liu | 257/369 |

FOREIGN PATENT DOCUMENTS

| | | |
|---|---|---|
| EP | 0625831 A2 | 5/1994 |
| EP | 0782267 A2 | 7/1997 |
| EP | 0913939 A2 | 5/1999 |
| JP | 5299995 A | 11/1993 |
| JP | 6112795 A | 4/1994 |
| JP | 6314985 A | 11/1994 |
| JP | 7046109 A | 2/1995 |
| JP | 7106937 A | 4/1995 |
| JP | 8023270 A | 1/1996 |
| JP | 8070245 A | 3/1996 |
| JP | 8251012 A | 9/1996 |
| JP | 8307305 A | 11/1996 |
| JP | 8330930 A | 12/1996 |
| JP | 9008627 A | 1/1997 |
| JP | 9041275 A | 2/1997 |
| JP | 9055682 A | 2/1997 |
| JP | 9092785 A | 4/1997 |
| JP | 9148587 A | 6/1997 |
| JP | 9163721 A | 6/1997 |
| JP | 9181641 A | 7/1997 |
| JP | 9186501 A | 7/1997 |
| JP | 9200021 A | 7/1997 |
| JP | 9200074 A | 7/1997 |
| JP | 9238059 A | 9/1997 |
| JP | 9243738 A | 9/1997 |
| JP | 9270659 A | 10/1997 |
| JP | 9284170 A | 10/1997 |
| JP | 9298493 A | 11/1997 |
| JP | 9326642 A | 12/1997 |
| JP | 10079467 A | 3/1998 |
| JP | 10093471 A | 4/1998 |
| JP | 10242477 A | 9/1998 |
| JP | 10242826 A | 9/1998 |
| JP | 10242829 A | 9/1998 |
| JP | 10335901 A | 12/1998 |
| JP | 11026776 A | 1/1999 |
| JP | 11112316 A | 4/1999 |
| JP | 11136111 A | 5/1999 |
| JP | 11163642 A | 6/1999 |
| JP | 11163704 A | 6/1999 |
| JP | 11205188 A | 7/1999 |
| JP | 11274804 A | 10/1999 |
| JP | 2000031167 A | 1/2000 |
| JP | 2000183353 A | 6/2000 |
| JP | 2000188501 A | 7/2000 |
| JP | 2000208614 A | 7/2000 |
| JP | 2000223713 A | 8/2000 |
| JP | 2000243973 A | 9/2000 |
| JP | 2000277703 A | 10/2000 |
| JP | 2000294786 A | 10/2000 |
| JP | 2000311986 A | 11/2000 |
| JP | 2001007332 A | 1/2001 |
| JP | 2001156182 A | 6/2001 |
| JP | 2001157487 A | 6/2001 |
| JP | 2001274265 A | 10/2001 |
| JP | 2002156602 A | 5/2002 |
| JP | 2003101407 A | 4/2003 |
| JP | 2003143004 A | 5/2003 |
| JP | 2003167615 A | 6/2003 |
| JP | 2003332583 A | 11/2003 |
| JP | 2004166470 A | 6/2004 |
| JP | 2004199950 A | 7/2004 |

(56) References Cited

FOREIGN PATENT DOCUMENTS

| | | |
|---|---|---|
| JP | 2004288978 A | 10/2004 |
| WO | 9806174 A1 | 2/1998 |
| WO | 9935695 A1 | 7/1999 |
| WO | 2007033045 A2 | 3/2007 |

OTHER PUBLICATIONS

Tinella, C. et al., "0.13μm CMOS SOI SP6T Antenna Switch for Multi-Standard Handsets," 2006 Topical Meeting on Silicon Monolithic Integrated Circuits in RF Systems, Jan. 2006, pp. 58-61, IEEE.

Gil, J. et al., "A high speed and low power SOI inverter using active body-bias," Proceedings of the International Symposium on Low Power Electronics and Design, Aug. 10-12, 1998, pp. 59-63.

Huang, F. et al., "A 0.5μm CMOS T/R switch for 900-MHz wireless applications, " IEEE Journal of Solid-State Circuits, vol. 36 No. 3, Mar. 2001, pp. 486-492.

Ohnakado, et al., "21.5dBm power-handling 5GHz transmit/receive CMOS switch realized by voltage division effect of stacked transistor configuration with depletion-layer-extended transistors (DETs)," 2003 Symposium on VLSI Circuits Digest of Technical Papers, Jun. 12-14, 2003, pp. 25-28.

Ohnakado et al., "A 1.4dB insertion-loss, 5GHz transmit/receive switch utilizing novel depletion-layer-extended transistors (DETS) in 0.18μm CMOS process," 2002 Symposium on VLSI Technology Digest of Tecnical Papers, Jun. 11-13, 2002, pp. 162-163.

Tinella, C. et al., "A high-performance CMOS-SOI antenna switch for the 2.5-5-GHz band," IEEE Journal of Solid-State Circuits, vol. 38 No. 7, Jul. 2003, pp. 1279-1283.

Shifrin, M. et al., "Monolithic FET structures for high-power control component application," IEEE Transactions on Microwave Theory and Techniques, vol. 37 No. 12, Dec. 1989, pp. 2134-2141.

Koh, Y. et al., "Body-contacted SOI MOSFET structure and its application to DRAM," IEEE Transactions on Electron Devices, vol. 45 No. 5, May 1998, pp. 1063-1070.

Maeda, S. et al., "Substrate-bias effect and source-drain breakdown characteristics in body-tied short channel SOI MOSFET's," IEEE Transactions on Electron Devices, vol. 46 No. 1, Jan. 1999, pp. 151-158.

Lee, H. et al., "A new SOI structure for mixed mode IC's and its body-related characteristics," Proceedings of the IEEE International SOI Conference, Oct. 1998, pp. 63-64.

Casu, Mario et al., "Synthesis of Low-Leakage PD-SOI Circuits with Body-Biasing," International Symposium on Low Power Electronics and Design '01, Aug. 6-7, 2001, pp. 287-290, Huntington Beach, California.

Casu, M.R. et al., "Comparative Analysis of PD-SOI Active Body-Biasing Circuits," IEEE International SOI Conference, Oct. 2-5, 2000, pp. 94-95, Wakefield, Massachusetts.

Caverly, Robert H., "Distortion in GaAs MESFET Switch Circuits. (Gallium Arsenide Metal Semiconductor Field Effect Transistors)," Microwave Journal, Sep. 1, 1994, pp. 106-114.

Caverly, Robert H.,"Linear and Nonlinear Characteristics of the Silicon CMOS Monolithic 50-Ω Microwave and RF Control Element," IEEE Journal of Solid-State Circuits, vol. 34, No. 1, Jan. 1999, pp. 124-126.

Caverly, Robert H., "A Project Oriented Undergraduate CMOS Analog Microelectronic System Design Course," IEEE International Conference on Microelectronic Systems Education, presented Jul. 21-23, 1997, pp. 87-88.

Savla, Hemant, "Design and Simulation of a Low Power Bluetooth Transceiver," Technical Report from the University of Wisconsin, Published: 2001, 90 pages, India.

Caverly, Robert H., "Development of a CMOS Cell Library for RF Wireless and Telecommunications Applications," Proceedings of the 8th Great Lakes Symposium on VLSI, Dec. 21, 1998, pp. 258-263, Lafayette, Louisiana.

Devlin, Liam, "The Design of Integrated Switches and Phase Shifters," IEEE Tutorial Colloquium: Design of RFICS and MMICS, Nov. 24, 1999, 14 pages.

Couch, II, Leon W., "Digital and Analog Communication Systems," Sixth Edition, Copyright: 2000, 398 pages, Prentice Hall, Upper Saddle River, New Jersey.

Keys, Cynthia Diane, "Low-Distortion Mixers for RF Communications," Published: 1994, 135 pages, Berkeley, California.

Damiano, J. et al., "Integrated Dynamic Body Contact for H-gate PD-SOI MOSFETs for High Performance/Low Power," IEEE International SOI Conference, presented Oct. 4, 2004, pp. 115-116.

Das, Koushik, K. et al., "A Novel Sub-1 V High Speed Circuit Design Technique in PD-SOI CMOS Technology with Ultra Low-Leakage Power," Powerpoint Presentation, Presented: 2002, 22 pages, Ann Arbor, Michigan.

Das, Koushik, K. et al., "A Novel Sub-1 V High Speed Circuit Design Technique in Partially Depleted SOI-CMOS Technology with Ultra Low-Leakage Power," Solid-State Circuits Conference, 2002, pp. 267-270.

Das, Koushik, K. et al., "Ultra Low-Leakage Power Strategies for Sub-1 V VLSI: Novel Circuit Styles and Design Methodologies for Partially Depleted Silicon-On-Insulator (PD-SOI) CMOS Technology," Proceedings of the 16th International Conference on VLSI Design, Copyright: 2003, pp. 291-296.

De Boer, A. et al., "Highly-Integrated X-band Multi-function MMIS with Integrated LNA and Driver Amplifier," TNO Physics and Electronics Laboratory, Copyright: 2002, 4 pages.

Caverly, Robert H. et al., "CMOS RF Circuits for Integrated Wireless Systems," IEE MTT-S Digest, 1998, vol. 3, pp. 1851-1854.

Caverly, Robert H., "High Power Gallium Nitride Devices for Microwave and RF Control Applications," Final Project Report for Contract No. N00014-98-1-0895, Mar. 10, 2000, 35 pages, Villanova, Pennsylvania.

Caverly, Robert H. "Nonlinear Properties of Gallium Arsenide and Silicon FET-based RF and Microwave Switches," Proceedings of the 1998 IEEE International Symposium on Circuits and Systems, Copyright: 1998, vol. 4, pp. 337-340.

Caverly, Robert H. et al., "SPICE Modeling of Microwave and RF Control Diodes," Proceedings of the 2000 IEEE Midwest Symposium on Circuits and Systems, Aug. 8-11, 2000, pp. 28-31.

Caverly, Robert H. et al, "A Silicon CMOS Monolithic RF and Microwave Switching Element," Proceedings of the 1997 European Microwave Conference, Sep. 1997, pp. 1046-1051.

Chan, Mansum et al., "Comparative Study of Fully Depleted and Body-Grounded Non Fully Depleted SOI MOSFET's for High Performance Analog and Mixed Signal Circuits," IEEE Transactions of Electron Devices, Nov. 1995, vol. 42, No. 11, pp. 1975-1981.

Pylarinos, Louie, "Charge Pumps: An Overview," Proceedings of the IEEE International Symposium on Circuits and Systems, 2003, 7 pages.

Chen, Fred et al., "Low Power, Multi-Gigabit DRAM Cell Design Issues Using SOI Technologies," Article—Uniersity of California at Berkeley, May 14, 1999, 6 pages.

Cho, Geun Rae et al., "Comparative Assessment of Adaptive Body-Bias SOI Pass-Transistor Logic," Fourth International Symposium on Quality Electronic Design, Mar. 2003, pp. 55-60.

Choumei, K. et al., "A High Efficiency, 2V Single Supply Voltage Operation RF Front End MMIC for 1.9GHz Personal Handy Phone Systems," IEEE, Copyright: 1998, pp. 73-76.

Chuang, Ching Te et al., "SOI for Digital CMOS VLSI Design: Design Consideration and Advances," Proceedings of the IEEE, vol. 86, No. 4, Apr. 1998, pp. 689-720.

Chung, In-Young et al., "A New SOI Inverter for Low Power Applications," Proceedings of the 1996 IEEE International SOI Conference, Oct. 1996, pp. 20-21.

Chung, In-Young et al., "A New SOI Inverter Using Dynamic Threshold for Low-Power Applications," IEEE Electron Device Letters, vol. 18, No. 6, Jun. 1997, pp. 248-250.

Chung, In-Young et al., "A New SOI MOSFET Structure with Junction Type Body Contact," International Electron Device Meeting (IEDM), Copyright: 1999, pp. 59-62.

Leenaerts, Dominic et al., "Circuits Design for RF Transceivers," Copyright: 2001, 179 pages, Kluwer Academic Publishing, Boston, MA.

Doyama, Jason, "Class E Power Amplifier for Wireless Transceivers," Thesis: University of Toronto, Copyright: 1999, 59 pages.

(56) References Cited

OTHER PUBLICATIONS

O, Kenneth K. et al., "CMOS Components for 802.11b Wireless LAN Applications," IEEE Radio Frequency Integrated Circuits Symposium, Copyright: 2002, pp. 103-106.
Burgener, Mark L., "CMOS SOS Switches Offer Useful Features, High Integration," Microwaves & RF, Aug. 2001, pp. 107-118.
Crols, Jan et al., "CMOS Wireless Transceiver Design," Copyright: 1997, 132 pages, Kluwer Academic Publishers, The Netherlands.
Colinge, Jean-Pierre, "Fully Depleted SOI CMOS for Analog Applications," IEEE Transactions on Electron Devices, May 1998, vol. 45, No. 5, pp. 1010-1016.
Colinge, J.P. et al., "A Low Voltage Low Power Microwave SOI MOSFET," Proceedings of the 1996 IEEE International SOI Conference, Copyright: 1996, pp. 128-129.
Barker, Forrest, "Communications Electronics—Systems, Circuits, and Devices," Copyright: 1987, 347 pages, Prentice-Hall.
Paulraj, Arogyaswami et al., "Communications, Computations, Control, and Signal Processing," Copyright: 1997, 308 pages, Kluwer Academic Publishers, U.S.A.
Sayre, Cotter W., "Complete Wireless Design," Copyright: 2001, 284 pages, McGraw-Hill Telecom.
Caverly, Robert H., "Distortion Properties of Gallium Arsenide and Silicon RF and Microwave Switches," IEEE, Copyright: 1997, pp. 153-156.
Douseki, Takakuni et al., "A 0.5v SIMOX-MTMCOS Circuit with 200ps Logic Gate," 1996 IEEE International Solid-State Circuits Conference, Session 5, Feb. 8, 1996, pp. 84-85.
Douseki, Takakuni et al., "A 0.5-V MTCMOS/SIMOX Logic Gate," IEEE Journal of Solid-State Circuits, vol. 32, No. 10, Oct. 1997, pp. 1604-1609.
Drake, Alan J., et al., "Dynamic-Threshold Logic for Low-Power VLSI Design," Article—University of Michigan, Copyright: 2001, 5 pages.
Chen, Tzu-Hung et al., "Dual-Gate GaAs FET: A Versatile Circuit Component for MMICs," Microwave Journal, Jun. 1989, pp. 125-135.
Dunga, Mohan V. et al., "Analysis of Floating Body Effects in Thin Film SOI MOSFET's Using the GIDL Current Technique," Proceedings of the 8th International Symposium on Physical and Failure Analysis of Integrated Circuits, Copyright: 2001, pp. 254-257.
Duyet, Tran Ngoc et al., "Suppression of Geometric Component of Charge Pumping Current in Thin Film Silicon on Insulator Metal-Oxide-Semiconductor Field-Effect Transistors," Japanese Journal of Applied Physics, vol. 37, Jul. 1998, pp. L855-L858.
Duyet, Tran Ngoc et al., "Effects of Body Reverse Pulse Bias on Geometric Component of Charge Pumping Current in FD SOI MOSFETs," Proceedings 1998 IEEE International SOI Conference, Oct. 1998, pp. 79-80.
Wang, Chi-Chang et al., "Efficiency Improvement in Charge Pump Circuits", IEEE Journal of Solid-State Circuits, vol. 32, No. 6, Jun. 1997, pp. 852-860.
Eggert, Dietmar et al., "A SOI-RF-CMOS Technology on High Resistivity SIMOX Substrates for Microwave Applications to 5 GHz," IEEE Transactions on ELectron Devices, vol. 44, No. 11, Nov. 1997, pp. 1981-1989.
De Boer, A. et al., "Highly-Integrated X-band Multi-function MMIC with Integrated LNA and Driver Amplifier," TNO Physics and Electronics Laboratory, Copyright: 2002, 4 pages.
Eggert, D. et al., "CMOS/SIMOX-RF-Frontend for 1.7GHz," Proceedings of the 22nd European Solid-State Circuits Conference, ESSCIRC, presented Sep. 17-19, 1996, pp. 208-211, Neuchatel, Switzerland.
Montoriol, Gilles et al., "3.6 V and 4.8 V GSM/DCS1800 Dual-Band PA Application with DECT Capability Using Standard Motorola RFIC's," Motorola Semiconductor Application Note, AN1602/D, Motorola, Inc., 2000, 20 pages.
Author Unknown, "uPG13×G Series: L-Band SPDT Switch GaAs MMIC," NEC Corporation: Application Note, 1st Edition, Feb. 1996, 30 pages, Japan.
Author Unknown, "Silicon and GaAs Semiconductors," RF & Microwave Device Overview 2003, NEC Electronics (Europe), Jun. 2003, 73 pages.
McGrath, Finbar et al., "A 1.9GHz GaAs Chip Set for the Personal Handyphone System," IEEE Transactions on Microwave Theory and Techniques, vol. 43, No. 7, Jul. 1995, pp. 1733-1744.
Darabi, H. et al., "A 2.4 GHz CMOS Transceiver for Bluetooth," Digest of Papers, 2001 IEEE Radio Frequency Integrated Circuits Symposium, Copyright: 2001, pp. 89-91.
Devlin, L.M. et al., "A 2.4 GHz Single Chip Transceiver," Digest of Papers, 1993 IEEE Microwave and Millimeter-Wave Monolithic Circuits Symposium, Copyright: 1993, pp. 23-26.
Madihian, Mohammad et al., "A 2-V, 1-10 GHz BiCMOS Transceiver Chip for Multimode Wireless Communications Networks," IEEE Journal of Solid-State Circuits, vol. 32, No. 4, Apr. 1997, pp. 521-525.
Ajjikuttira, Aruna et al., "A Fully-Integrated CMOS RFIC for Bluetooth Applications," 2001 IEEE International Solid-State Circuits Conference, presented Feb. 5-7, 2001, Session 13, pp. 198-199, 446, San Francisco, California.
Apel, T. et al., "A GaAs MMIC Transceiver for 2.45 GHz Wireless Commercial Products," Digest of Papers, 1994 IEEE Microwave and Millimeter-Wave Monolithic Circuits Symposium, Copyright: 1994, pp. 15-18.
Puechberty, Eric et al., "A GaAs Power Chip Set for 3 V Cellular Communications," Gallium Arsenide Applications Symposium, GAAS, presented Apr. 28-30, 1994, pp. 265-268, Turin, Italy.
Yamamoto, Kazuya et al., "A GaAs RF Transceiver IC for 1.9GHz Digital Mobile Communication Systems," 1996 IEEE International Solid-State Circuits Conference, presented Feb. 10, 1996, Session 21, pp. 340-341, 469, San Francisco, California.
Gu, Zeji et al., "A High Power DPDT MMIC Switch for Broadband Wireless Applications," 2003 IEEE MTT-S International Microwave Symposium Digest, vol. 1, presented Jun. 8-13, 2003, pp. A173-A176, Philadelphia, Pennsylvania.
Uda, Hisanori et al., "A High-Performance and Miniaturized Dual-Use (Antenna/Local) GaAs SPDT Switch IC Operating at +3V/0V," 1996 IEEE Microwave and Millimeter-Wave Monolithic Circuits Symposium, presented Jun. 16-18, 1996, pp. 159-162, San Francisco, California.
Gu, Zeji et al., "A High-Performance GaAs SP3T Switch for Digital Cellular Systems," 2001 IEEE MTT-S International Microwave Symposium Digest, vol. 1, IEEE, 2001, presented May 20-25, 2001, pp. 241-244, Phoenix, Arizona.
Madihian, M. et al., "A High-Speed Resonance-Type FET Transceiver Switch for Millimeter-Wave Band Wireless Networks," 26th European Microwave Conference (EuMC), presented Sep. 9-12, 1996, pp. 941-944, vol. 2, Prague, Czech Republic.
Ishida, Hidetoshi et al., "A Low Power GaAs Front-end IC with Current-Reuse Configuration Using 0.15 um Gate MODFETs," IEEE MTT-S International Microwave Symposium Digest, vol. 2, presented Jun. 8-13, 1997, pp. 669-672, Denver, Colorado.
Johnson, Mark C. et al., "A Model for Leakage Control by MOS Transistor Stacking," Technical Report TR-ECE 97-12, Purdue University, School of Electrical and Computer Engineering,Dec. 1997, 34 pages, West Lafayette, Indiana.
Shifrin, M. et al., "A New Power Amplifier Topology with Series Biasing and Power Combining of Transistors," IEEE 1992 MWSYM Digest, Copyright: 1992, pp. 39-41.
Matsumoto, Satoshi et al., "A Novel High-Frequency Quasi-SOI Power MOSFET for Multi-Gigahertz Applications," IEEE Electron Devices Meeting (IEDM '98), presented Dec. 6-9, 1998, pp. 945-948, San Francisco, CA.
Giugni, Stephen, "A Novel Multi-Port Microwave/Millimeter-Wave Switching Circuit," Microwave Conference, 2000, pp. 677-680, Asia-Pacific.
Harjani, Ramesh et al., "A Prototype Framework for Knowledge-Based Analog Circuit Synthesis," DAC '87 Proceedings of the 24th ACM/IEEE Design Automation Conference, 1987, pp. 42-49.
Park, Jooyoun, "A Regulated, Charge-Pump CMOS DC/DC Converter for Low-Power Applications," Massachusetts Institute of Technology, Department of Electrical Engineering and Computer Science, Apr. 1, 1998, 62 pages.

(56) References Cited

OTHER PUBLICATIONS

De Rossi, Alfredo et al., "A Routing Switch Based on a Silicon-on-Insulator Mode-Mixer," IEEE Photonics Technology Letters, vol. 11, No. 2, Feb. 1999, pp. 194-196.

Kumar, Mahender et al., "A Simple, High Performance Complementary TFSOI BiCMOS Technology with Excellent Cross-talk Isolation and High-Q Inductors for Low Power Wireless Applications," 2000 IEEE International SOI Conference, Oct. 2000, pp. 142-143.

Yamamoto, Kazuya et al., "A Single-Chip GaAs RF Transceiver for 1.9-GHz Digial Mobile Communication Systems," IEEE Journal of Solid-State Circuits, vol. 31, No. 12, Dec. 1996, pp. 1964-1973.

Wambacq, Piet et al., "A Single-Package Solution for Wireless Transceivers," Design, Automation and Test in Europe Conference and Exhibition 1999 Proceedings, Mar. 9-12, 1999, pp. 425-429, Munich, Germany.

Author Unknown, "A Voltage Regulator for GaAs FETs," Microwave Journal, May 1995, p. 120, Bohemia, New York.

Abidi, Asad, "Low-Power Radio-Frequency IC's for Portable Communications," Proceedings of the IEEE, vol. 83, No. 4, Apr. 1995, pp. 544-569.

Adan, A.O. et al., "Linearity and Low-Noise Performance of SOIMOSFETs for RF Applications," 2000 IEEE International SOI Conference, Oct. 2000, pp. 30-31.

Hanzo, L. et al., "Adaptive Wireless Transceivers: Turbo-Coded, Turbo-Equalized and Space-Time Coded TDMA, CDMA and OFDM Systems," Copyright: Aug. 2002, 379 pages, John Wiley & Sons, Ltd., West Sussex, England.

Johnson, Eric E. et al., "Advanced High-Frequency Radio Communications," 1997, 205 pages, Artech House, Inc., Norwood, Massachusetts.

Szedon, J.R. et al., "Advanced Silicon Technology for Microwave Circuits," Naval Research Laboratory Contract No. N00014-91-C-2313, Mar. 8, 1994, 122 pages, Westinghouse Science and Technology Center, Pittsburgh, Pennsylvania.

Willert-Porada (Ed.), M., "Advances in Microwave and Radio Frequency Processing," Report from the 8th International Conference on Microwave and High-Frequency Heating, Sep. 3-7, 2001, 408 pages, Bayreuth, Germany.

Kwok, Siang-Ping "An X-Band SOS Resistive Gate-Insulator-Semiconductor (RIS) Switch," IEEE Transactions on Electron Devices, Feb. 1980, vol. ED-27, No. 2, pp. 442-448.

Author Unknown, "ADG751 CMOS, Low Voltage RF/Video, SPST Switch," Analog Devices, Inc., Copyright: 1999, 10 pages, Norwood, Massachusett.

Caverly, Robert H., "First Annual Report: High Power Gallium Nitride Devices for Microwave and RF Control Applications," Office of Naval Research Contract No. N00014-98-1-0895, Jul. 23, 1999, 30 pages, Villanova, Pennsylvania.

Armijos, Jack "AN301: High-Speed DMOS FET Analog Switches and Switch Arrays," TEMIC SEmiconductors, Jun. 22, 1994, 10 pages, Siliconix.

Assaderaghi, Fariborz et al., "A Dynamic Threshold Voltage MOSFET (DTMOS) for Ultra-Low Voltage Operation," Electron Devices Meeting (IEDM '94), Dec. 11-14, 1994. pp. 809-812.

Assaderaghi, F. et al., "History Dependence of Non-Fully Depleted (NFD) Digital SOI Circuits," 1996 Symposium VLSI Technology Digest of Technical Papers, Copyright: 1996, p. 122.

Assaderaghi, Fariborz et al., "DTMOS: Its Derivatives and Variations, and Their Potential Applications," The Twelfth International Conference on Microelectronics, Oct. 31-Nov. 2, 2000, pp. 9-10, Tehran, Iran.

Assaderaghi, Fariborz et al., "Dynamic Threshold-Voltage MOSFET (DTMOS for Ultra-Low Voltage VLSI," IEEE Transactions on Electron Devices, vol. 44, No. 3, Mar. 1997, pp. 414-422.

Assaderaghi, F. et al., "Transient Pass-Transistor Leakage Current in SOI MOSFET's," IEEE Electron Device Letters, vol. 18, No. 6, Jun. 1997, pp. 241-243.

Baker, R.J. et al., "Stacking Power MOSFETs for Use in High Speed Instrumentation," American Institute of Physics, vol. 63, No. 12, Dec. 1992, pp. 5799-5801.

Baker, R.J. et al., "Designing Nanosecond High Voltage Pulse Generators Using Power MOSFETs," Electronics Letters, vol. 30, No. 20, Sep. 29, 1994, pp. 1634-1635.

Bonkowski, James et al., "Integration of Triple-Band GSM Antenna Switch Module Using SOI CMOS," 2004 IEEE Radio Frequency Integrated Circuits Symposium, presented Jun. 6-8, 2004, pp. 511-514.

Botto, G. et al., "Series Connected Soft Switched IGBT's for High Power, High Voltage Drives Applications: Experimental Results," in PESC Record, IEEE Annual Power Electronics Specialists Conference, Copyright: 1997, pp. 3-7.

Burghartz, Joachim N. et al., "Integrated RF and Microwave Components in BiCMOS Technology," IEEE Transactions on Electron Devices, vol. 43, No. 9, Sep. 1996, pp. 1559-1570.

Carr, Joseph J. "Secrets of RF Circuit Design," Second Edition, 1997, 292 pages, TAB Books, McGraw-Hill.

Heller, Lawrence G. et al., "Cascode Volatge Switch Logic: A Differential CMOS Logic Family," 1984 IEEE International Solid-State Circuits Conference Digest of Technical Papers (ISSCC '84), presented Feb. 22, 1984, pp. 16-17.

Eisenberg, John A. et al., "High Isolation 1-20GHz MMIC Switches with On-Chip Drivers", IEEE Microwave and Millimeter-Wave Monolithic Circuits Symposium, Copyright: 1989, pp. 41-45.

Huang, Feng-Jung et al., "A 2.4-GHz Single-Pole Double Throw T/R Switch with 0.8-dB Insertion Loss Implemented in a CMOS Process, (Powerpoint Presentation)," Silicon Microwave Integrated Circuits and Systems Research Group (SiMICS), Copyright: 2001, pp. 1-16.

Flandre, D. et al., "Fully Depleted SOI CMOS Technology for Low Voltage Low Power Mixed Digital/Analog/Microwave Circuits," Analog Integrated Circuits and Signal Processing, vol. 21, Copyright: 1999, pp. 213-228, Kluwer Academic Publishers Boston, MA.

Freeman, Roger L. "Radio System Design for Telecommunications," Second Edition, Wiley Series in Telecommunications and Signal Processing, Copyright: 1997, 461 pages, John Wiley & Sons, Inc.

Fukuda, Yasuhiro et al., "SOI CMOS Device Technology," Special Edition on 21st Century Solutions, Copyright: 2001, pp. 54-57, John Wiley & Sons, Inc.

Fuse, Tsuneaki et al., "0.5V SOI CMOS Pass-Gate Logic," 1996 IEEE International Solid-State Circuits Conference, Session 5, Feb. 1996, pp. 88-89.

Fuse, Tsuneaki et al., "A 0.5V 200MHz 1-Stage 32b ALU Using a Body Bias Controlled SOI Pass-Gate Logic," IEEE International Solid-State Circuits Conference, Feb. 1997, pp. 286-287, 472.

Gopinath, Anand et al., "GaAs FET RF Switches," IEEE Transactions on Electron Devices, vol. ED-32, No. 7, Jul. 1985, pp. 1272-1278.

Iwata, Toru et al., "Gate Over Driving CMOS Architecture for 0.5V Single Power Supply Operated Devices," 1997 IEEE International Solid-State Circuits Conference, Session 17, Copyright: 1997, pp. 290-291, 473.

Gautier, Jacques et al., "Body Charge Related Transient Effects in Floating Body SOI NMOSFETs," IEDM Technical Digest, Copyright: 1995, pp. 623-626.

Gibson, Jerry D., "The Communication Handbook," Copyright: 1997, 812 pages, CRC Press, Inc.

Giffard, B. et al., "Dynamic Effects in SOI MOSFETs," IEEE SOS/SOI Technology Conference, Oct. 1991, pp. 160-161.

Gil, Joonho et al., "A High Speed and Low Power SOI Inverter Using Active Body-Bias", Proceedings International Symposium on Low Power Electronics and Design, Aug. 1998, pp. 59-63.

Gil, Joonho et al., "A High Speed and Low Power SOI Inverter Using Active Body-Bias," Solid-State Electronics, vol. 43, Copyright: 1999, pp. 791-799.

Goldman, D. et al., "0.15um SOI DRAM Technology Incorporating Sub-Volt Dynamic Threshold Devices for Embedded Mixed-Signal & RF Circuits," 2001 IEEE SOI Conference, Oct. 2001, pp. 97-98.

Gould, P. et al, "NMOS SPDT Switch MMIC with >48dB Isolation and 30dBm IIP3 for Applications within GSM and UMTS Bands," Article—Bell Laboratories, Copyright: 2001, pp. 1-4.

Gu, Zeji et al., "Low Insertion Loss and High Linearity PHEMT SPDT and SP3T Switch Ics for WLAN 802.11a/b/g Application," 2004 IEEE Radio Frequency Integrated Circuits Symposium, Copyright: 2004, pp. 505-508.

(56) References Cited

OTHER PUBLICATIONS

Gu, Zeji et al., "A 2.3V PHEMT Power SP3T Antenna Switch IC for GSM Handsets," IEEE GaAs Digest, Copyright: 2003, pp. 48-51.
Author Unknown, "An Ultra-Thin Silicon Technology that Provides Integration Solutions on Standard CMOS," Peregine Semiconductor, Copyright: 1998, 8 pages.
Author Unknown, "Positive Bias GaAs Multi-Throw Switches with Integrated TTL Decoders," Microwave Journal, Sep. 1, 2000, 7 pages.
Hirota, Takanori et al., "0.5V 320MHz 8b Multiplexer/Demultiplexer Chips Based on a Gate Array with Regular-Structured DTMOS/SOI," International Solid-State Circuit Conference (ISSCC), Feb. 1998, pp. 12.2-1-12.2-11.
Author Unknown, "Wireless Symposium 2000 is Stage for New Product Introductions," Hittite Microwave, Feb. 2000, pp. 1-8.
Author Unknown, "HRF-SW1000: Honeywell SPDT Absorptive RF Switch," Honeywell, Jun. 2002, pp. 1-6.
Author Unknown, "HRF-SW1010 Honeywell SPDT Reflective RF Switch," Honeywell Advance Information, May 2001, pp. 1-3.
Author Unknown, "CMOS SOI RF Switch Family," Honeywell, Dec. 2002, pp. 1-4.
Author Unknown, "CMOS SOI Technology," Honeywell, Oct. 2001, pp. 1-7.
Huang, Feng Jung et al., "A 0.5-um CMOS T/R Switch for 900-MHz Wireless Applications," IEEE Journal of Solid-State Circuits, vol. 36, No. 3, Mar. 2001, pp. 486-492.
Huang, W.M. et al., "TFSOI Can It Meet the Challenge of Single Chip Portable Wireless Systems," Proceedings of the 1997 IEEE International SOI Conference, Oct. 1997, pp. 1-3.
Huang, Feng Jung, "Schottky Clamped MOS Transistors for Wireless CMOS Radio Frequency Switch Application," Dissertation—University of Florida, 2001, pp. 1-167.
Huang, Feng Jung et al., "A 900-MHz T/R Switch with a 0.8-dB Insertion Loss Implemented in a 0.5-um CMOS Process," IEEE Custom Integrated Circuits Conference, Copyright: 2000, pp. 341-344.
Huang. Feng Jung et al., "A 2.4-GHz Single-Pole Double Throw T/R Switch with 0.8-dB Insertion Loss Implemented in a CMOS Process", Silicon Microwave Integrated Circuits and Systems Research, Copyright: 2001, pp. 1-4.
Hagen, Jon B., "Radio Frequency Electronics: Circuits and Appliances," Copyright: 1996, 194 pages, Cambridge University Press.
Hameau, Frederic et al., "Radio-Frequency Circuits Integration Using CMOS SOI 0.25.mu.m Technology", 2002 RF IC Design Workshop Europe, Mar. 19-22, 2002, Grenoble, France.
Author Unknown, "CMOS Analog Switches", Harris Corporation, Copyright: 1999, pp. 1-9.
Henshaw, Bob, "Design of an RF Transceiver", IEEE Colloquium on Analog Signal Processing, Copyright: 1998, 6 pages.
Iyama, Yoshitada et al., "L-Band SPDT Switch Using Si-MOSFET", IEICE Trans. Electron, vol. E79-C, No. 5, May 1996, pp. 636-643.
Johnson, Robb A. et al., "Advanced Thin-Film Silicon-on-Sapphire Technology: Microwave Circuit Applications", IEEE Transactions on Electron Devices, vol. 45, No. 5, May 1998, pp. 1047-1054.
Johnson, R.A. et al., "Silicon-On-Sapphire MOSFET Transmit/Receive Switch for L and S Band Transceiver Applications", Electronic Letters, Jul. 17, 1997, pp. 1324-1326.
Kanda, Atsushi et al., "A Si RF Switch MMIC for the Cellular Frequency Band Using SOI-CMOS Technology", Institute of Electronics, Information and Communication Engineers Technical Report, vol. 100, No. 152, Jun. 2000, pp. 79-83.
Kanda, Atsushi et al., "High Performance 19GHz Band GaAs FET Switches Using LOXI (Layerd Oxide Isolation)—MESFETs", Copyright: IEEE, 1997, pp. 62-65.
Kanda, Atsushi et al., "A Si RF Switch MMIC for the Cellular Frequency Band Using SOI-CMOS Technology", The Institute of Electronics, Information and Communication Engineers, Copyright: 2000, pp. 79-83.
Hickman, Ian, "Practical Radio Frequency (RF) Handbook," Copyright: 1997, 160 pages, Newnes.
Shimura, Tadayuki et al., "High Isolation V-Band SPDT Switch MMIC for High Power Use", IEEE MTT-S International Microwave Symposium Digest, Copyright: 2001, pp. 245-248.
Caverly, Robert H. et al., "Gallium Nitride-Based Microwave and RF Control Devices", Microwave Journal, Feb. 1, 2001, 14 pages.
Author Unknown, "Miniature Dual Control SP4T Switches for Low Cost Multiplexing", Microwave Journal, Oct. 4, 1995, 4 pages.
Kelly, Dylan "Integrating Ultra CMOS Designs in GSM Front Ends", Wireless Design Magazine, Copyright: 2004, pp. 18-22.
Author Unknown, "HS-302RH-T: Radiation Hardened CMOS Dual DPST Analog Switch", Intersil America, Inc., Copyright: 2002, pp. 1-2.
Newman, Warren H., "Radiation Hardened Power Electronics", Intersil America, Inc., Copyright: 1999, pp. 1-4.
Ippoushi, Takashi, "SOI Structure Avoids Increases in Chip Area and Parasitic Capacitance Enables Operational Control of Transistor Threshold Voltage", Renesas Edge, vol. 2004.5, Jul. 2004, p. 15.
Caverly, Robert H. et al., "On-State Distortion in High Electron Mobility Transistor Microwave and RF Switch Control Circuits," IEEE Transactions on Microwave Theory and Techniques, vol. 48, No. 1, Jan. 2000, pp. 98-103.
Katzin, Peter et al., "High Speed 100+ W RF Switches Using GaAs MMICs", IEEE Transactions on Microwave Theory and Techniques, vol. 40, No. 11, Nov. 1992, pp. 1989-1996.
Kawakyu, Kátsue K. et al., "A 2-V Operation Resonant Type T/R Switch with Low Distortion Characteristics for 1.9GHz PHS", IEICE Trans Electron, vol. E81-C, No. 6, Jun. 1998, pp. 862-867.
Kohama, Kazumasa et al., "High Power DPDT Antenna Switch MMIC for Digital Cellular Systems", GaAs IC Symposium, Copyright: 1995, pp. 75-78.
Kohama, Kazumasa et al., "High Power DPDT Antenna Switch MMIC for Digital Cellular Systems", IEEE Journal of Solid-State Circuits, vol. 31, No. 10, Oct. 1996, pp. 1406-1411.
Koh, Yo-Hwan et al., "Body-Contacted SOI MOSFET Structure with Fully Bulk CMOS Compatible Layout and Process", IEEE Electron Device Letters, vol. 18, No. 3, Mar. 1997, pp. 102-104.
Koh, Yo-Hwan et al., "Body-Contracted SOI MOSFET Structure and its Application to DRAM", IEEE Transactions on Electron Devices, vol. 45, No. 5, May 1998, pp. 1063-1070.
Koudymov, Alexei et al., "Low Loss High Power RF Switching Using Multifinger AlGaN/GaN MOSHFETs", University of South Carolina Scholar Commons: Faculty Publications, Aug. 1, 2002, pp. 449-451.
Krishnan, Srinath, "Efficacy of Body Ties Under Dynamic Switching Conditions in Partially Depleted SOI CMOS Technology," Proceedings 1997 IEEE International SOI Conference, Oct. 1997, pp. 140-141.
Kuang, J.B. et al., "A Dynamic Body Discharge Technique for SOI Circuit Applications," 1999 IEEE International SOI Conference, Oct. 1999, pp. 77-78.
Kuang, J.B. et al., "A High-Performance Body-Charge-Modulated SOI Sense Amplifier," 2000 IEEE International SOI Conference, Oct. 2000, pp. 100-101.
Kuge, Shigehiro et al., "SOI-DRAM Circuit Technologies for Low Power High Speed Multigiga Scale Memories", IEEE Journal of Solid-State Circuits, vol. 31, No. 4, Apr. 1996, pp. 586-591.
Kusunoki, S. et al., "SPDT Switch MMIC Using E/D Mode GaAs JFETs for Personal Communications", IEEE GaAs IC Symposium, Copyright: 1992, pp. 135-138.
Larson, Lawrence E., "RF and Microwave Circuit Design for Wireless Communications", Mobile Communication Series, Copyright: 1997, 218 pages, Artech House, Inc.
Larson, Lawrence E., "Integrated Circuit Technology Options for-RFIC's—Present Status and Future Directions," IEEE Journal of Solid-State Circuits, vol. 33, No. 3, Mar. 1998, pp. 387-399.
Lee, Thomas H., "CMOS RF: (Still) No Longer an Oxymoron (Invited)", 1999 IEEE Radio Frequency Integrated Circuits Symposium, Copyright: 1999, pp. 3-6.
Lee, Bjung-Jin et al., "Effects of Gate Structures on the RF Performance in PD SOI MOSFETs", IEEE Microwave and Wireless Components Letters, vol. 15, No. 4, Apr. 2005, pp. 223-225.
Lindert, Nick et al., "Dynamic Threshold Pass-Transistor Logic for Improved Delay at Lower Power Supply Voltages," IEEE Journal of Solid-State Circuits, vol. 34, No. 1, Jan. 1999, pp. 85-89.

(56) References Cited

OTHER PUBLICATIONS

Losee, Ferrill "RF Systems, Components, and Circuits Handbook", Copyright: 1997, 314 pages, Artech House, Inc.
Lovelace, David et al., "Silicon MOSFET Technology for RF ICs," 6th IEEE International Symposium on Personal, Indoor & Mobile Radio Communications, vol. 3, Sep. 27-29, 1995, pp. 1238-1241.
Nagayama, Akira et al., "Low-Insertion-Loss DP3T MMIC Switch for Dual-Band Cellular Phones," IEEE Journal of Solid State Circuits, vol. 34, No. 8, Aug. 1999, pp. 1051-1055.
Lu, P.F. et al., "Floating Body Effects in Partially-Depleted SOI CMOS Circuits", ISPLED, Aug. 1996, pp. 1-6.
Bahl, I.J., "Chapter 12: Lumped Elements for RF and Microwave Circuits", Lumped-Element Circuits, Copyright 2003, pp. 353-394, Artech House, Inc.
Madihian, M. et al., "CMOS RF ICs for 900MHz-2.4GHz Band Wireless Communication Networks," IEEE Radio Frequency Integrated Circuits Symposium, Copyright: 1999, pp. 13-16.
Marenk, M. et al., "Layout Optimization of Cascode RF SOI Transistors," 2001 IEEE International SOI Conference, Copyright: 2001, pp. 105-106.
Mashiko, Koichiro et al., "Ultra-Low Power Operation of Partially-Depleted SOI/CMOS Integrated Circuits", IEICE Transactions on Electronic Voltage, vol. E83-C, No. 11, Nov. 2000, pp. 1697-1704.
Masuda, Michitaka et al., "High Power Heterojunction GaAs Switch IC with P-1dB of more than 38dBm for GSM Application," 20th Annual Gallium Arsenide Integrated Circuit Symposium (GaASICS), Copyright: 1998, pp. 229-232.
Matloubian, Mishel, "Smart Body Contact for SOI MOSFETs," 1989 IEEE SOS/SOI Technology Conference, Oct. 1999, pp. 128-129.
Matsumoto, Satoshi et al., "Fully Depleted 30-V-Class Thin Film SOI Power MOSFET," IEDM 95-979, Copyright: 1995, pp. 38.6.1-38.6.4.
McGrath, F. et al., "Multi Gate FET Power Switches," Applied Microwave, Summer 1991, pp. 77-88.
De La Houssaye, P.R. et al., "Microwave Performance of Optically Fabricated T-Gate Thin Film Silicon on Sapphire Based MOSFET's," IEEE Electron Device Letters, vol. 16, No. 6, Jun. 1995, pp. 289-292.
Ayasli, Yalcin "Microwave Switching with GaAs FETs: Device and Critical Design Theory and Applications," Microwave Journal, Nov. 1982, pp. 719-723.
Miller, Gary M., "Modern Electronic Communications," Sixth Edition, Copyright: 1999, 412 pages, Prentice-Hall, U.S.A.
Slobodnik, Jr., A.J. et al., "Millimeter Wave GaAs Switch FET Modeling," Microwave Journal, Aug. 1989, pp. 93-104.
Minoli, Daniel, "Telecommunications Technology Handbook," Second Edition, Copyright: 2003, 408 pages, Artech House, Inc.
Misra, Devendra K., "Radio Frequency and Microwave Communication Circuits: Analysis and Design," Copyright: 2001, 297 pages, John Wiley & Sons, Inc.
Miyatsuji, Kazuo et al., "A GaAs High Power RF Single Pole Dual Throw Switch IC for Digital Mobile Communication System," IEEE Journal of Solid-State Circuits, vol. 30, No. 9, Sep. 1995, pp. 979-983.
Miyatsuji, Kazuo et al., "A GaAs High Power RF Single Pole Double Throw Switch IC for Digital Mobile Communication System," IEEE International Solid-State Circuits Conference, Session 2, Copyright: 1994, pp. 34-35.
Couch, II, Leon W. "Modern Telecommunication System: Principles and Applications," Copyright: 1995, 316 pages, Prentice-Hall, New Jersey.
Morishita, F. et al., "Leakage Mechanism Due to Floating Body and Countermeasure on Dynamic Retention Mode of SOI-DRAM," 1995 Symposium on VLSI Technology Digest of Technical Papers, Apr. 1995, pp. 141-142.
Nakatani, Toshifumi et al., "A Wide Dynamic Range Switched-LNA in SiGe BICMOS," IEEE Radio Frequency Integrated Circuits Symposium, Copyright: 2001, pp. 223-226.
Nakayama, Masatoshi et al., "A 1.9GHz Single-Chip RF Front End GaAs MMIC with Low-Distortion Cascode FET Mixer for Personal Handy-Phone System Terminals," 1998 IEEE Radio Frequency Integrated Circuits Symposium, Copyright: 1998, pp. 205-208.
Nakayama, Masatoshi et al., "A 1.9GHz Single-Chip RF Front End GaAs MMIC for Personal Communications," 1996 IEEE Microwave and Millimeter-Wave Monolithic Circuits Symposium, Copyright: 1996, pp. 69-72.
Narendra, Siva et al., "Scaling of Stack Effects and its Application for Leakage Reduction," ISLPED 2001, Copyright: 2001, pp. 195-200.
Nishijima, Masaaki et al., "A High Performance Transceiver Hybrid IC for PHS Hand Set Operating with Single Positive Voltage Supply," 1997 IEEE MTT-S Digest, Copyright: 1997, pp. 1155-1158.
Imai, Nobuaki et al., "Novel High Isolation FET Switches," IEEE Transactions on Microwave Theory and Techniques, vol. 44, No. 5, May 1996, pp. 685-691.
Numata, Keiichi et al., "A +2.4/0 V Controlled High Power GaAs SPDT Antenna Switch IC for GSM Application," 2002 IEEE Radio Frequency Integrated Circuits Symposium, Copyright: 2002, pp. 141-144.
Numata, Keiichi et al., "A High Power Handling GSM Switch IC with New Adaptive Control Voltage Generator Circuit Scheme," 2003 IEEE Radio Frequency Integrated Circuits Symposium, Copyright: 2003, pp. 233-236.
Ohnakado, T. et al., "A 1.4dB Insertion-Loss, 5GHz Transmit/Receive Switch Utilizing Novel Depletion-Layer Extended Transistors (DETs) in 0.18um CMOS Process," 2002 Symposium on VLSI Circuits Digest of Technical Papers, Copyright: 2002, pp. 162-163.
Ueda, Kimio et al., "A CAD Compatible SOI/CMOS Gate Array Having Body Fixed Partially Depleted Transistors," IEEE International Solid-State Circuits Conference, Session 17, Feb. 8, 1997, pp. 288-289.
Ueda, K. et al, "Floating-Body Effects on Propagation Delay in SOI/CMOS LSIs," Proceedings 1996 IEEE International SOI Conference, Oct. 1996, pp. 142-143.
Valeri, Stephen J. et al., "A Composite High-Voltage Device Using Low-Voltage SOI MOSFETs," 1990 IEEE SOS/SOI Technology Conference, Oct. 2-4, 1990, pp. 169-170.
Valeri, Stephen J. et al., "A Silicon-On-Insulator Circuit for High-Temperature, High-Voltage Applications," IEEE International SOI Conference, Oct. 1-3, 1991, pp. 60-61.
Van Der Puije, Patrick D., "Telecommunication Circuit Design," Second Edition, Copyright: 2002, 225 pages, John Wiley & Sons, Inc., New York.
Van Der Puije, Patrick D. "Telecommunication Circuit Design," Copyright: 1992, 187 pages, John Wiley & Sons, Inc.
Wada, Yoshiki et al., "Active Body-Bias SOI-CMOS Driver Circuits," 1997 Symposium on VLSI Circuits Digest of Technical Papers, Copyright: 1997, pp. 29-30.
Wang, Janet et al., "Theshold Voltage Instability at Low Temperatures in Partially Dpeleted Thin Film SOI MOSFET's," 1990 IEEE SOS/SOI Technology Conference, Oct. 2-4, 1990, pp. 91-92.
Wang, Bo-Ting et al., "A Novel Low-Voltage Silicon-On-Insulator (SOI) CMOS Complementary Pass-Transistor Logic (CPL) Circuit Using Asymmetrical Dynamic Threshold Pass-Transistor (AIDTPT) Technique," Proceedings of the 43rd IEEE Midwest Symposium on Circuits and Systems, Lansing MI, Aug. 8-11, 2000, pp. 694-697.
Wei, Andy et al., "Effect of Floating-Body Charge on SOI MOSFET Design," IEEE Transactions on Electron Devices, vol. 45, No. 2, Feb. 1998, pp. 430-438.
Wei, Andy, "Measurement and Modeling of Transient Effects in Partially-Depleted SOI MOSFET's," Thesis—Massachusetts Institute of Technology, Jun. 1996, 76 pages.
Yamamoto, Kazuya et al., "A 2.4-GHz-Band 1.8-V Operation Single-Chip Si-CMOS T/R-MMIC Front-End with a Low Insertion Loss Switch," IEEE Journal of Solid State Circuits, vol. 36, No. 8, Aug. 2001, pp. 1186-1196.
Yamamoto, Kazuya et al, "A2.2-V Operation, 2.4 GHz Single-Chip GaAs MMIC Transceiver for Wireless Applications," IEEE Journal of Solid-State Circuits, vol. 34, No. 4, Apr. 1999, pp. 502-512.
Yamamoto, Kazuya et al., "Design and Experimental Results of a 2V-Operation Single-Chip GaAs T/R-MMIC Front-End for 1.9-GHz Personal Communications," Proceedings of the ASP-DAC '98 Design Automation Conference, Feb. 10-13, 1998, pp. 7-12.

(56) References Cited

OTHER PUBLICATIONS

Yamao, Yasushi et al., "GaAs Broadband Monolithic Switches," Electronics and Communications in Japan, Part 2, vol. 69, No. 1, Copyright: 1986, pp. 63-72.

Yun, Yong-Hoon et al., "High Power GaAs MMIC Switches with Planar Semi-Insulated-Gate FETs (SIGFETs)," Proceedings of 1990 International Symposium on Power Semiconductor Devices & ICs, Copyright: 1990, pp. 55-58, Tokyo, Japan.

Pelella, Mario M. et al., "Low-Voltage Transient Bipolar Effect Induced by Dynamic Floating-Body Charging in Scaled PD/SOI MOSFET's," IEEE Electron Device Letters, vol. 17, No. 5, May 1996, pp. 196-198.

Pelella, Mario M. et al., "Control of Off-State Current in Scaled PD/SOI CMOS Digital Circuits," Proceedings 1998 IEEE International SOI Conference, Oct. 1998, pp. 147-148.

Pelloie, J.L. et al., "WP 25.2: SOI Technology Performance and Modeling," 1999 IEEE International Solid-State Circuits Conference, Feb. 1999, 9 pages.

Author Unknown, "SA630 Single Pole Double Throw (SPDT) Switch," Philips Semiconductors, Nov. 7, 1997, pp. 1-14.

Pozar, David M. "Microwave and RF Design of Wireless Systems," Copyright: 2001, 192 pages, John Wiley & Sons, Inc.

Rauly, E. et al., "Investigation of Single and Double Gate SOI MOSFETs in Accumulation Mode for Enhanced Performances and Reduced Technological Drawbacks," Proceedings 30th European Solid-State Device Research Conference, Sep. 2000, pp. 540-543.

Razavi, Behzad, "Next Generation RF Circuits and Systems," 17th IEEE Conference on Advanced Research in VLSI, Copyright: 1997, pp. 270-282.

Razavi, Behzad, "RF Microelectronics," Copyright: 1998, 179 pages, Prentice-Hall Communications Engineering & Emerging Technology Series.

Reedy, R. et al., "UTSi CMOS: A Complete RF SOI Solution," Peregrine Semiconductor, Copyright: 2001, pp. 1-6.

Reedy, R. et al., "Single Chip Wireless Systems Using SOI," 1999 IEEE International SOI Conference, Oct. 1999, pp. 8-11.

Fiorenza, James G. et al., "RF Power Performance of LDMOSFETs on SOI: An Experimental Comparison with Bulk Si LDMOSFETs," 2001 IEEE Radio Frequency Integrated Circuits Symposium, Copyright: 2001, pp. 43-46.

Peczalski, Andy et al., "RF/Analog/Digital SOI Technology GPS Receivers and Other Systems on a Chip," IEEE Aerospace Conference Proceedings, Copyright: 2002, pp. 4-2013-4-2017.

Rodgers, Paul et al., "Silicon UTSi COMS RFIC for CDMA Wireless Communications Systems," 1999 IEEE MTT-S Digest, Copyright: 1999, pp. 485-488.

Saccamango, M.J. et al., "An SOI Floating Body Charge Monitor Technique," 2000 IEEE International SOI Conference, Oct. 2000, pp. 88-89.

Sanders, Dr. Thomas J., "Statistical Modeling of SOI Devices for the Low Power Electronics Program," Advanced Engineering Technology, Inc. (AET), Sep. 1995, pp. 1-109.

Schindler, M.J. et al., "A High Power 2-18 GHz T/R Switch," 1990 IEEE MTT-S Digest, Copyright: 1990, pp. 453-456.

Shahidi, Ghavam et al., "Partially Depleted SOI Technology for Digital Logic," 1999 IEEE International Solid-State Circuits Conference, SEssion 25, Copyright: 1999, pp. 426-427.

Shifrin, M. et al., "High Power Control Components Using a New Monolithic FET Structure," IEEE 1989 Microwave and Millimeter-Wave Monolithic Circuits Symposium, Copyright: 1988, pp. 51-56.

Shifrin, Mitchell B. et al., "Monolithic FET Structures for High-Power Control Component Applications," IEEE Transactions on Microwave Theory and Techniques, vol. 37, No. 12, Dec. 1989, pp. 2134-2141.

Shimomura, Ken'Ichi et al., "TP 4.3: A 1V 46ns 16Mb SOI-DRAM with Body Control Technique", 1997 IEEE International Solid-State Circuits Conference, Feb. 1997, 9 pages.

Shimomura, Ken'Ichi et al., "A 1-V 46-ns 16-mb SOI-DRAM with Body Control Technique," IEEE Journal of Solid-State Circuits, vol. 32, No. 11, Nov. 1997, pp. 1712-1720.

Shoucair, F.S. "Modeling, Decoupling and Supression of MOSFET Distortion Components," IEEE Proceeding Circuit Devices Systems, vol. 146, No. 1, Feb. 1999 pp. 37-43.

Author Unknown, "Silicon Wave SiW1502 Radio Modem IC", Silicon Wave, Nov. 3, 2000, pp. 1-21.

Smuk, J. et al., "Monolithic GaAs Multi-Throw Switches with Integrated Low-Power Decoder/Driver Logic," 1997 IEEE Radio Frequency Integrated Circuits Symposium, Copyright: 1997, pp. 47-50.

Smuk, J. et al., "Multi-Throw Plastic MMIC Switches up to 6GHz with Integrated Positive Control Logic," 21st Annual GaAs IC Symposium, Copyright: 1999, pp. 259-262.

Author Unknown, "RF Amplifier Design Using HFA3046, HFA3096, HFA3127, HFA3128 Transistor Arrays," Intersil Corporation, Copyright: 2000, pp. 3-1-3-4.

McGrath, F. et al., "Novel High Performance SPDT Power Switches Using Multi-Gate FET's," 1991 IEEE MTT-S Digest, Copyright: 1991, pp. 839-842.

Baker, R.J. et al., "Series Operation of Power MOSFETs for High-Speed, High-Voltage Switching Applications," American Institute of Physics, Jun. 1993, pp. 1655-1656.

Stuber, Michael et al., "SOI CMOS with High Performance Passive Components for Analog, RF and Mixed Signal Designs," Proceedings 1998 IEEE International SOI Conference, Oct. 1998, pp. 99-100.

Sudhama, C. et al., "Compact Modeling and Circuit Impact of a Novel Frequency Dependence of Capacitance in RF MOSFETs", Nano Science and Technology Institute, Technical Proceedings of the 2001 International Conference of Modeling and Simulation of Microsystems, Copyright: 2001, 4 pages.

Suematsu, Norihanu et al., "L-Band Internally Matched Si-MMIC Front-End," IEEE Transactions on Microwave Theory and Techniques, vol. 44, No. 12, Dec. 1996, pp. 2375-2378.

Suematsu, Noriharu, "On-Chip Matching Si-MMIC for Mobile Communication Terminal Application," 1997 IEEE Radio Frequency Integrated Circuits Symposium, Copyright: 1997, pp. 9-12.

Karandikar, Shirang K. et al., "Technology Mapping for SOI Domino Logic Incorporating Solutions for the Parasitic Bipolar Effect," IEEE Transaction on Very Large Scale Integration (VLSI) Systems, vol. 11, No. 6, Dec. 2003, pp. 1-14.

Terauchi, Mamone "A Novel 4T SRAM Cell Using 'Self-Body-Biased' SOI MUSFET Structure Operating at 0.5 Volt," 2000 IEEE International SOI Conference, Oct. 2000, pp. 108-109.

Weisman, Carl J., "The Essential Guide to RF and Wireless," Copyright: 2000, pp. 1-133, Prentice Hall PTR, New Jersey.

Maas, Stephen A., "The RF and Microwave Circuit Design Cookbook," Copyright: 1998, 149 pages, Artech House, Inc.

Tinella, Carlo et al., "A High-Performance CMOS-SOI Antenna Switch for the 2.5-5-GHz Band," IEEE Journal of Solid-State Circuits, vol. 38, No. 7, Jul. 2003, pp. 1279-1283.

Tinella, Carlo et al., "A 0.7dB Insertion Loss CMOS—SOI Antenna Switch with More Than 50dB Isolation Over the 2.5 to 5GHz Band," ESSCIRC, Copyright: 2002, pp. 483-486.

Tokumitsu, Tsuneo et al., "A Low-Voltage, High-Power T/R-Switch MMIC Using LC Resonators," IEEE Transactions on Microwave Theory and Techniques, vol. 43, No. 5, May 1995, pp. 997-1003.

Bullock, Scott R., "Transceiver and System Design for Digital Communications," Second Edition, Copyright: 1995, 142 pages, Noble Publishing Corp.

McRory, John G. et al., "Transformer Coupled Stacked FET Power Amplifiers," IEEE Journal of Solid-State Circuits, vol. 34, No. 2, Feb. 1999, pp. 157-161.

Hess, Herbert L. et al., "Transformerless Capacitive Coupling of Gate Signals for Series Operation of Power MOS Devices," IEEE Transactions on Power Electronics, Copyright: 1999, pp. 673-675.

Tseng, Ting-Che et al., "AC Floating Body Effects and the Resultant Analog Circuit Issues in Submicron Floating Body and Body-Grounded SOI MOSFET's," IEEE Transactions on Electron Devices, vol. 46, No. 8, Aug. 1999, pp. 1685-1692.

(56) References Cited

OTHER PUBLICATIONS

Tseng, Y.C. et al., "Comprehensive Study on AC Characteristics in SOI MOSFETs for Analog Applications," 1998 Symposium on VLSI Technology Digest of Technical Papers, Copyright: 1998, pp. 112-113.

Tseng, Ying-Che "Characterization of Floating Body and Body-Grounded Thin Film Silicon-on-Insulator MOSFETs for Analog Circuit Applications," Ph.D. Thesis, UCLA, Copyright: 1999, 240 pages.

Tseng, Ying-Che et al., "AC Floating-Body Effects in Submicron Fully Depleted (FD) SOI nMOSFET's and the Impact on Analog Applications," IEEE Electron Device Letters, vol. 19, No. 9, Sep. 1998, pp. 351-353.

Shafi, Mansoor et al, "Wireless Communications in the 21st Century," 2002, Institute of Electrical and Electronics Engineers, Inc, Copyright: 2002, 230 pages, Wiley Interscience.

Tsutsumi, T. et al., "A Single Chip PHS Front End MMIC with a True Single +3 Voltage Supply," 1998 IEEE Radio Frequency Integrated Circuits Symposium, Copyright: 1998, pp. 105-108.

Uda, Hisanori et al., "High-Performance GaAs Switch ICs Fabricated Using MESFETs with Two Kinds of Pinch-off Voltages," GaAs IC Symposium, Copyright: 1993, pp. 247-250.

Uda, Hisanori et al., "High-Performance GaAs Switch IC's Fabricated Using MESFET's with Two Kinds of Pinch-off Voltages and a Symmetrical Pattern Configuration," IEEE Journal of Solid-State Circuits, vol. 29, No. 10, Oct. 1994, pp. 1262-1269.

\* cited by examiner

SEMICONDUCTOR RADIO FREQUENCY SWITCH WITH BODY CONTACT

This application claims the benefit of provisional patent application Ser. No. 61/159,668, filed Mar. 12, 2009, the disclosure of which is hereby incorporated herein by reference in its entirety.

FIELD OF THE DISCLOSURE

Embodiments of the present disclosure relate to semiconductor and silicon-on-insulator (SOI) technologies and semiconductor-based radio frequency (RF) switches, both of which may be used in RF communications circuits.

BACKGROUND OF THE DISCLOSURE

As technology progresses, wireless communications devices, such as smart phones, wireless capable computers, or the like, are becoming increasingly integrated, feature rich, and complex. Such wireless communications devices rely on semiconductor technologies, such as silicon based technologies, which are evolving toward smaller circuit geometries, lower power consumption, higher operating speeds, and increased complexity. Complementary metal oxide semiconductor (CMOS) technology is an example of a silicon based technology. Further, wireless communications devices may need to support multiple communications bands, multiple communications modes, multiple communications protocols, and the like. As such, wireless communications devices may need multiple RF switches to select between different RF circuits depending on which communications bands, modes, and protocols are in use. Such complex RF systems may place strict linearity, insertion loss, and isolation demands on the RF switches.

In general, RF switches having semiconductor-based switching elements may have a trade-off between insertion loss and isolation. RF switches that must handle high power levels may require low insertion losses. In order to achieve low insertion loss and high power handling capability, the size of circuit elements within an RF switch may be relatively large. However, such large circuit elements may be associated with relatively large capacitances, which may decrease isolation. Further, multiple large capacitances may have non-linearities, which may degrade linearity of the RF switch. Thus, there is a need for a silicon based RF switch that improves the trade-off between insertion loss and isolation, has good linearity performance, operates over multiple frequency bands, or any combination thereof.

SUMMARY OF THE EMBODIMENTS

The present disclosure relates to an RF switch that includes multiple body-contacted field effect transistor (FET) elements coupled in series. The FET elements may be formed using a thin-film semiconductor device layer, which is part of a thin-film semiconductor die. Conduction paths between the FET elements through the thin-film semiconductor device layer and through a substrate of the thin-film semiconductor die may be substantially eliminated by using insulating materials. Elimination of the conduction paths allows an RF signal across the RF switch to be divided across the series coupled FET elements, such that each FET element is subjected to only a portion of the RF signal. Further, each FET element is body-contacted and may receive reverse body biasing when the RF switch is in an OFF state, thereby reducing an OFF state drain-to-source capacitance of each FET element. The combination of dividing the RF signal and reverse body biasing each FET element when the RF switch is in an OFF state may improve the trade-off between insertion loss and isolation, may improve linearity performance, and may enable the RF switch to operate over multiple frequency bands.

Thin-film semiconductor dies may typically be used in conjunction with complementary metal oxide semiconductor (CMOS) processes, which may be used to fabricate high performance microprocessors due to comparatively low source-to-body and drain-to-body junction capacitances. However, low source-to-body and drain-to-body junction capacitances may be beneficial in certain RF circuits, such as RF switches. Low source-to-body and drain-to-body junction capacitances may provide a low OFF state drain-to-source capacitance of an FET element. Further, by using insulating materials to completely surround each FET element in the RF switch, a body, a source, and a drain of each FET element may be isolated from the substrate and may be isolated from other devices, including other FET elements, via the thin-film semiconductor device layer.

During the OFF state of the RF switch, a voltage may be applied between the body and the source of each FET element to reverse bias the body and the source, and a voltage may be applied between the body and the drain of each FET element to reverse bias the body and the drain to body-contact and reverse body bias the FET element. By reverse biasing the body and the source, the source-to-body junction capacitance may be further reduced, and by reverse biasing the body and the drain, the drain-to-body junction capacitance may be further reduced, thereby further reducing the OFF state drain-to-source capacitance of each FET element. Such junction capacitance reductions may further improve the trade-off between insertion loss and isolation, may further improve linearity performance, and may further enable the RF switch to operate over multiple frequency bands. The improved linearity performance of the RF switch may be based on reduced harmonic distortion of the RF switch or reduced intermodulation distortion.

In addition, for CMOS processes, maximum drain-to-source voltage ratings may be between about one volt and about five volts, depending on the technology. However, the RF signal across the RF switch when the RF switch is in the OFF state may be significantly larger than the maximum drain-to-source voltage ratings. Therefore, the RF switch may include multiple body-contacted FET elements coupled in series to divide the RF signal across the series-coupled FET elements. The division of the RF signal needs to be reasonably balanced during the OFF state and during transitions between the OFF state and an ON state to avoid exceeding maximum drain-to-source voltage ratings. As mentioned above, conduction paths between the FET elements through the thin-film semiconductor device layer and through the substrate of the thin-film semiconductor die may be substantially eliminated by using insulating materials, thereby helping to avoid exceeding maximum drain-to-source voltage ratings.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION OF THE PREFERRED EMBODIMENTS

Figure 1:
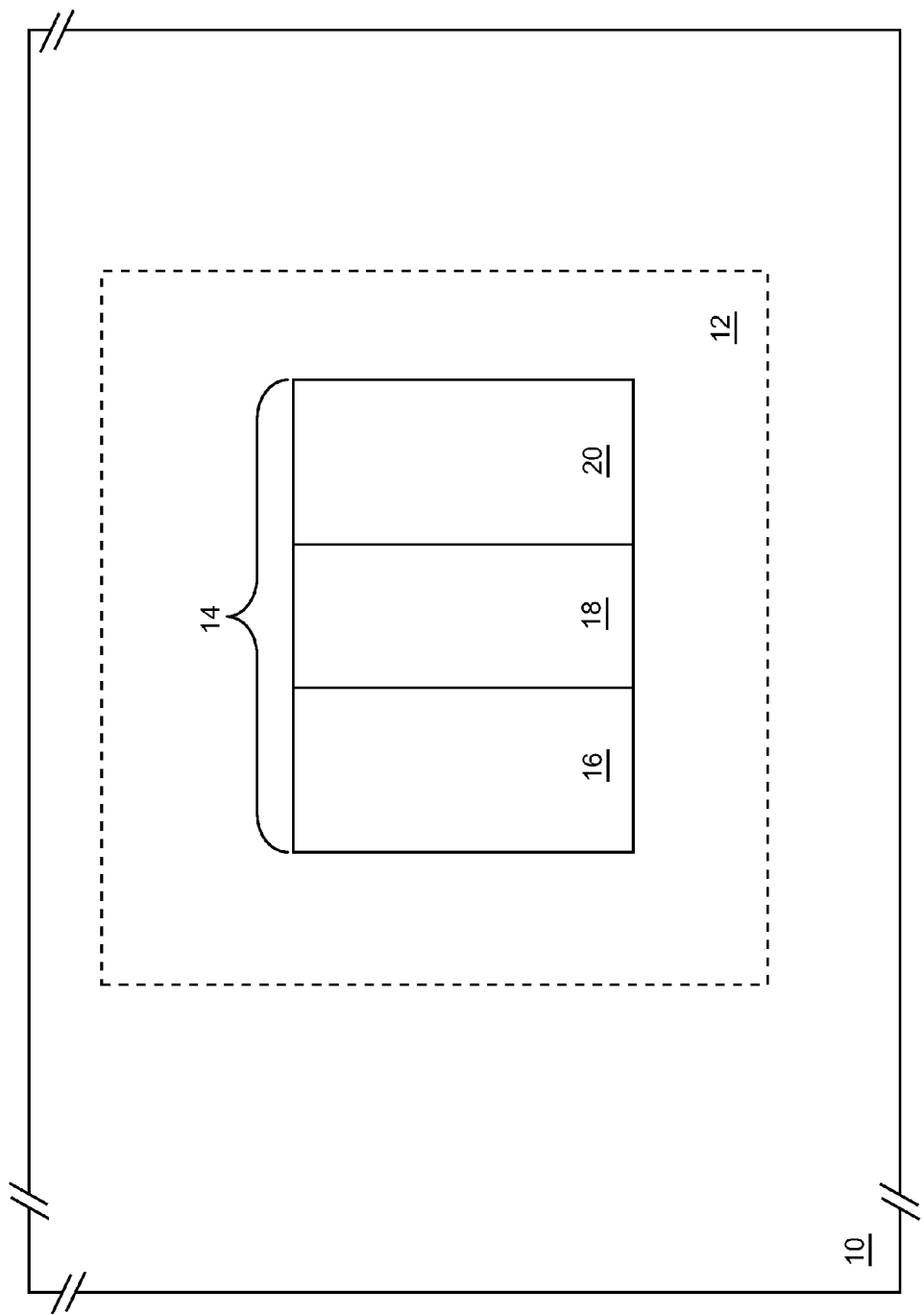
FIG. 1 shows a top view of a conventional substrate, which is used to form a floating-body field effect transistor (FET) element according to the prior art.

The embodiments set forth below represent the necessary information to enable those skilled in the art to practice the disclosure and illustrate the best mode of practicing the disclosure. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The present disclosure relates to an RF switch that includes multiple body-contacted field effect transistor (FET) elements coupled in series. The FET elements may be formed using a thin-film semiconductor device layer, which is part of a thin-film semiconductor die. Conduction paths between the FET elements through the thin-film semiconductor device layer and through a substrate of the thin-film semiconductor die may be substantially eliminated by using insulating materials. Elimination of the conduction paths allows an RF signal across the RF switch to be divided across the series coupled FET elements, such that each FET element is subjected to only a portion of the RF signal. Further, each FET element is body-contacted and may receive reverse body biasing when the RF switch is in an OFF state, thereby reducing an OFF state drain-to-source capacitance of each FET element. The combination of dividing the RF signal and reverse body biasing each FET element when the RF switch is in an OFF state may improve the trade-off between insertion loss and isolation, may improve linearity performance, and may enable the RF switch to operate over multiple frequency bands.

Thin-film semiconductor dies may typically be used in conjunction with complementary metal oxide semiconductor (CMOS) processes, which may be used to fabricate high performance microprocessors due to comparatively low source-to-body and drain-to-body junction capacitances. However, low source-to-body and drain-to-body junction capacitances may be beneficial in certain RF circuits, such as RF switches. Low source-to-body and drain-to-body junction capacitances may provide a low OFF state drain-to-source capacitance of an FET element. Further, by using insulating materials to completely surround each FET element in the RF switch, a body, a source, and a drain of each FET element may be isolated from the substrate and may be isolated from other devices, including other FET elements, via the thin-film semiconductor device layer.

Reverse bias of a PN junction occurs when a positive voltage is applied to the N-type material relative to the P-type material and a magnitude of the positive voltage is greater than zero. During the OFF state of the RF switch, a voltage may be applied between the body and the source of each FET element to reverse bias the body and the source, and a voltage may be applied between the body and the drain of each FET element to reverse bias the body and the drain to body-contact and reverse body bias the FET element. By reverse biasing the body and the source, the source-to-body junction capacitance may be further reduced, and by reverse biasing the body and the drain, the drain-to-body junction capacitance may be further reduced, thereby further reducing the OFF state drain-to-source capacitance of each FET element. Such junction capacitance reductions may further improve the trade-off between insertion loss and isolation, may further improve linearity performance, and may further enable the RF switch to operate over multiple frequency bands. The improved linearity performance of the RF switch may be based on reduced harmonic distortion of the RF switch.

In addition, for CMOS processes, maximum drain-to-source voltage ratings may be between about one volt and about five volts, depending on the technology. However, the RF signal across the RF switch when the RF switch is in the OFF state may be significantly larger than the maximum drain-to-source voltage ratings. Therefore, the RF switch may include multiple body-contacted FET elements coupled in series to divide the RF signal across the series-coupled FET elements. The division of the RF signal needs to be reasonably balanced during the OFF state and during transitions between the OFF state and an ON state to avoid exceeding maximum drain-to-source voltage ratings. As mentioned above, conduction paths between the FET elements through the thin-film semiconductor device layer and through the substrate of the thin-film semiconductor die may be substantially eliminated by using insulating materials, thereby helping to avoid exceeding maximum drain-to-source voltage ratings.

FIG. 1 shows a top view of a conventional substrate 10, which is used to form a floating-body FET element 12 according to the prior art. The floating-body FET element 12 includes an active region 14, which is formed in the conventional substrate 10. The active region 14 includes a conventional source 16, a floating body 18, and a conventional drain 20. The floating body 18 is between the conventional source 16 and the conventional drain 20 and provides a channel for the floating-body FET element 12. In one configuration, the conventional source 16 and the conventional drain 20 include N-type semiconductor material, and the floating body 18 includes P-type semiconductor material. In an alternate configuration, the conventional source 16 and the conventional drain 20 include P-type semiconductor material, and the floating body 18 includes N-type semiconductor material.

Figure 2:
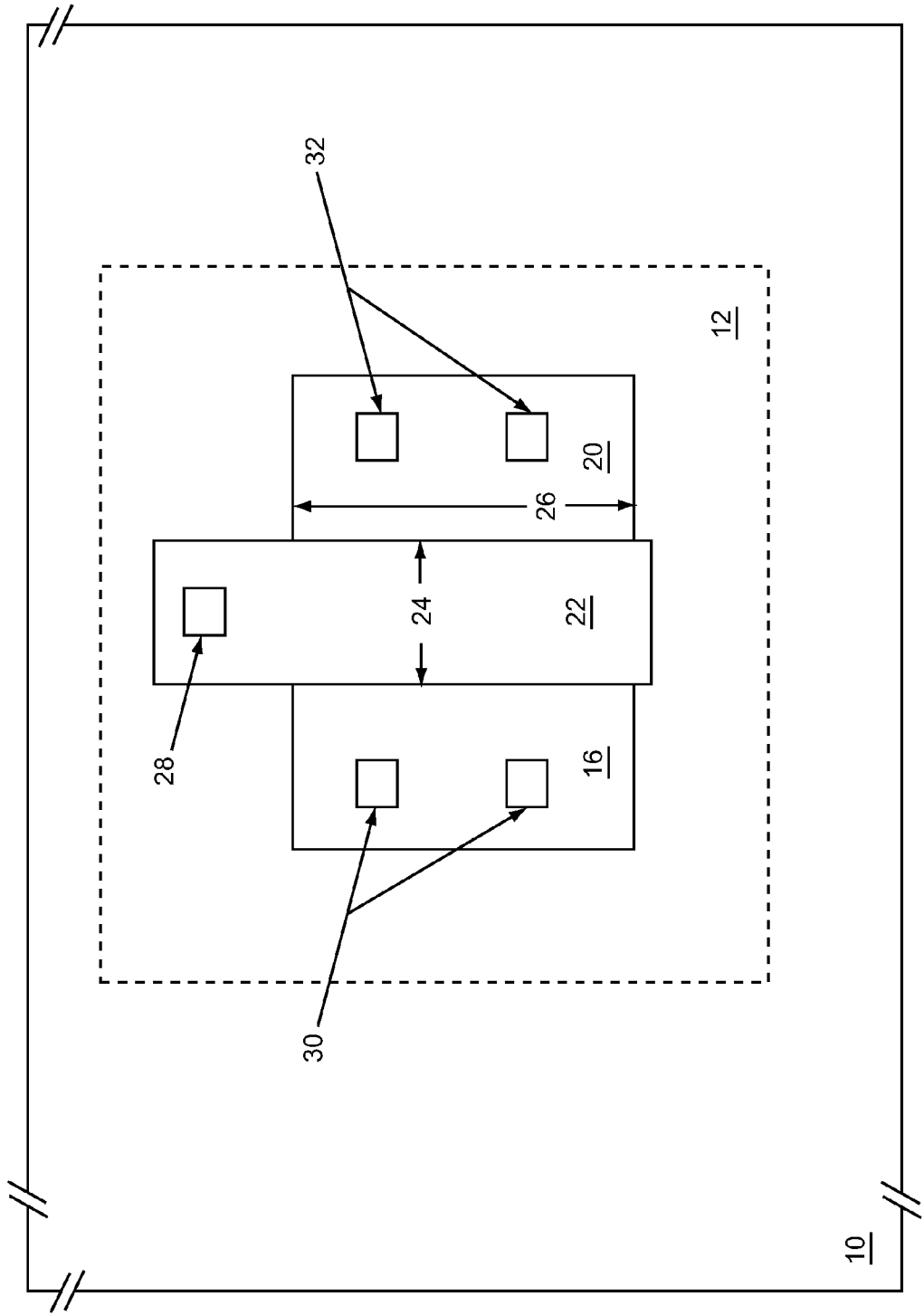
FIG. 2 shows a top view of details of the floating-body FET element illustrated in FIG. 1 according to the prior art.

FIG. 2 shows a top view of details of the floating-body FET element 12 illustrated in FIG. 1 according to the prior art. The floating-body FET element 12 includes a conventional gate 22 over the conventional substrate 10. The conventional gate 22 has a gate length 24 and a gate width 26 over the channel of the floating-body FET element 12. Further, the conventional gate 22 may completely cover the floating body 18 as shown. The conventional gate 22 may have a gate contact 28, the conventional source 16 may have source contacts 30, and the conventional drain 20 may have drain contacts 32. The gate, the source, and the drain contacts 28, 30, 32 provide electrical connectivity to the conventional gate 22, the conventional source 16, and the conventional drain 20, respectively. The floating body 18 has no electrical contacts and is electrically coupled to other devices only through the conventional substrate 10, the conventional gate 22, the conventional source 16, the conventional drain 20, or any combination thereof.

Figure 3:
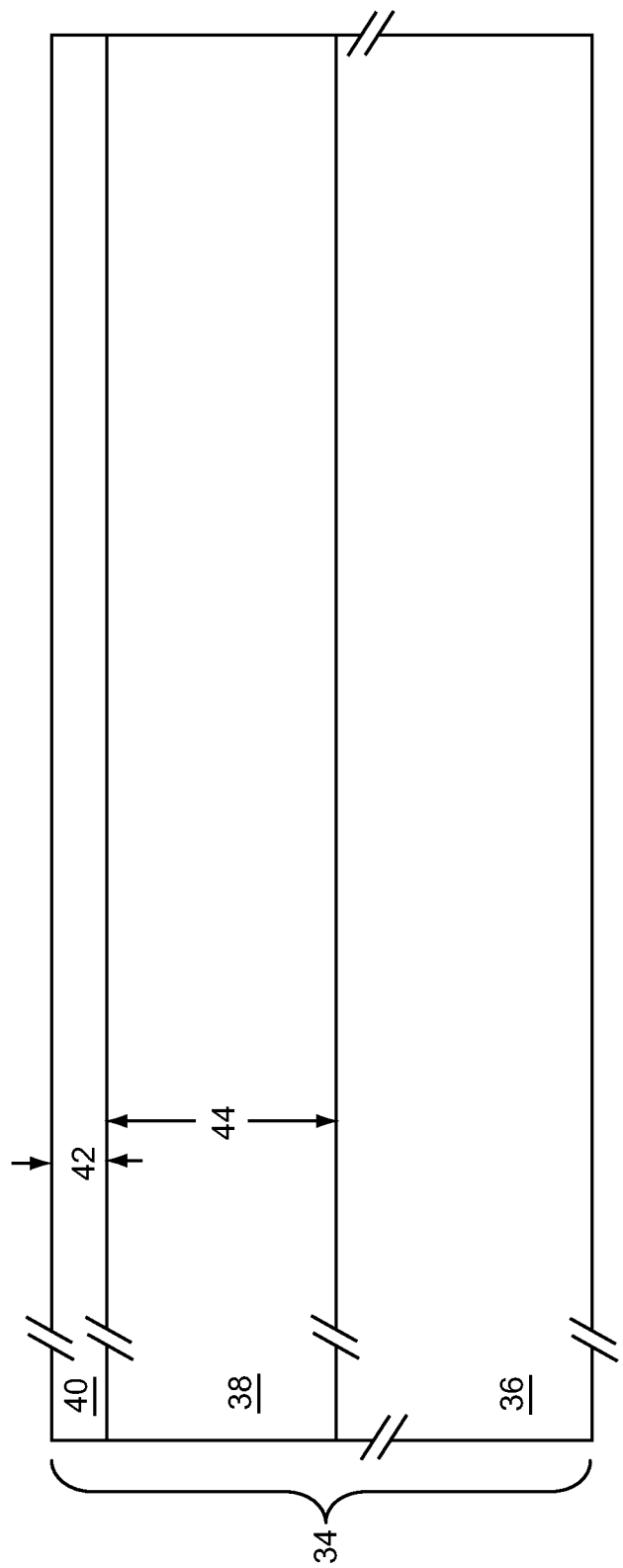
FIG. 3 shows a cross-section of a thin-film semiconductor die according to one embodiment of the thin-film semiconductor die.

FIG. 3 shows a cross-section of a thin-film semiconductor die 34, which may be a thin-film silicon-on-insulator (SOI) semiconductor die, according to one embodiment of the thin-film semiconductor die 34. The thin-film semiconductor die 34 includes a substrate 36, which may be an SOI substrate; an insulating layer 38, which may be an SOI insulating layer, over the substrate 36; and a thin-film semiconductor device layer 40, which may be a thin-film SOI device layer, over the insulating layer 38. The thin-film semiconductor device layer 40 has a semiconductor device layer thickness 42 and the insulating layer 38 has an insulating layer thickness 44. The substrate 36 may include silicon, sapphire, other semiconductor material, insulating material, or any combination thereof. The substrate 36 may be provided from a silicon handle wafer.

The insulating layer 38 may include oxide, buried oxide, silicon dioxide, other insulating material, or any combination thereof. The thin-film semiconductor device layer 40 is a thin-film layer that includes silicon and is used to form electronic devices, such as transistor elements, diode elements, resistive elements, capacitive elements, or the like. The insulating layer 38 may be used to electrically isolate the thin-film semiconductor device layer 40 from the substrate 36.

In one embodiment of the thin-film semiconductor device layer 40, the thin-film semiconductor device layer 40 is partially-depleted SOI and not fully-depleted SOI. As the insulating layer thickness 44 increases, RF coupling to adjacent devices through the substrate 36 may be reduced, thereby improving isolation. Additionally, as resistivity of the substrate 36 increases, RF coupling to adjacent devices may be reduced, thereby improving RF performance of active RF devices and passive RF devices, such as inductors and transmission lines.

In a first exemplary embodiment of the substrate 36, the resistivity of the substrate 36 is greater than about 100 ohm-centimeters. In a second exemplary embodiment of the substrate 36, the resistivity of the substrate 36 is greater than about 500 ohm-centimeters. In a third exemplary embodiment of the substrate 36, the resistivity of the substrate 36 is greater than about 1000 ohm-centimeters. In one embodiment of the thin-film semiconductor die 34, the insulating layer thickness 44 is greater than the semiconductor device layer thickness 42. In a first exemplary embodiment of the thin-film semiconductor device layer 40, the semiconductor device layer thickness 42 is between about 100 nanometers and about 300 nanometers. In a second exemplary embodiment of the thin-film semiconductor device layer 40, the semiconductor device layer thickness 42 is less than about 900 nanometers. In a third exemplary embodiment of the thin-film semiconductor device layer 40, the semiconductor device layer thickness 42 is less than about 700 nanometers. In a fourth exemplary embodiment of the thin-film semiconductor device layer 40, the semiconductor device layer thickness 42 is less than about 500 nanometers. In a fifth exemplary embodiment of the thin-film semiconductor device layer 40, the semiconductor device layer thickness 42 is less than about 300 nanometers. In a sixth exemplary embodiment of the thin-film semiconductor device layer 40, the semiconductor device layer thickness 42 is less than about 200 nanometers. In a seventh exemplary embodiment of the thin-film semiconductor device layer 40, the semiconductor device layer thickness 42 is less than about 100 nanometers.

In a first exemplary embodiment of the insulating layer 38, the insulating layer thickness 44 is between about 200 nanometers and about 1000 nanometers. In a second exemplary embodiment of the insulating layer 38, the insulating layer thickness 44 is greater than about 200 nanometers. In a third exemplary embodiment of the insulating layer 38, the insulating layer thickness 44 is greater than about 600 nanometers. In a fourth exemplary embodiment of the insulating layer 38, the insulating layer thickness 44 is greater than about 1000 nanometers. In a fifth exemplary embodiment of the insulating layer 38, the insulating layer thickness 44 is greater than about 1500 nanometers. In a sixth exemplary embodiment of the insulating layer 38, the insulating layer thickness 44 is greater than about 2000 nanometers.

Figure 4:
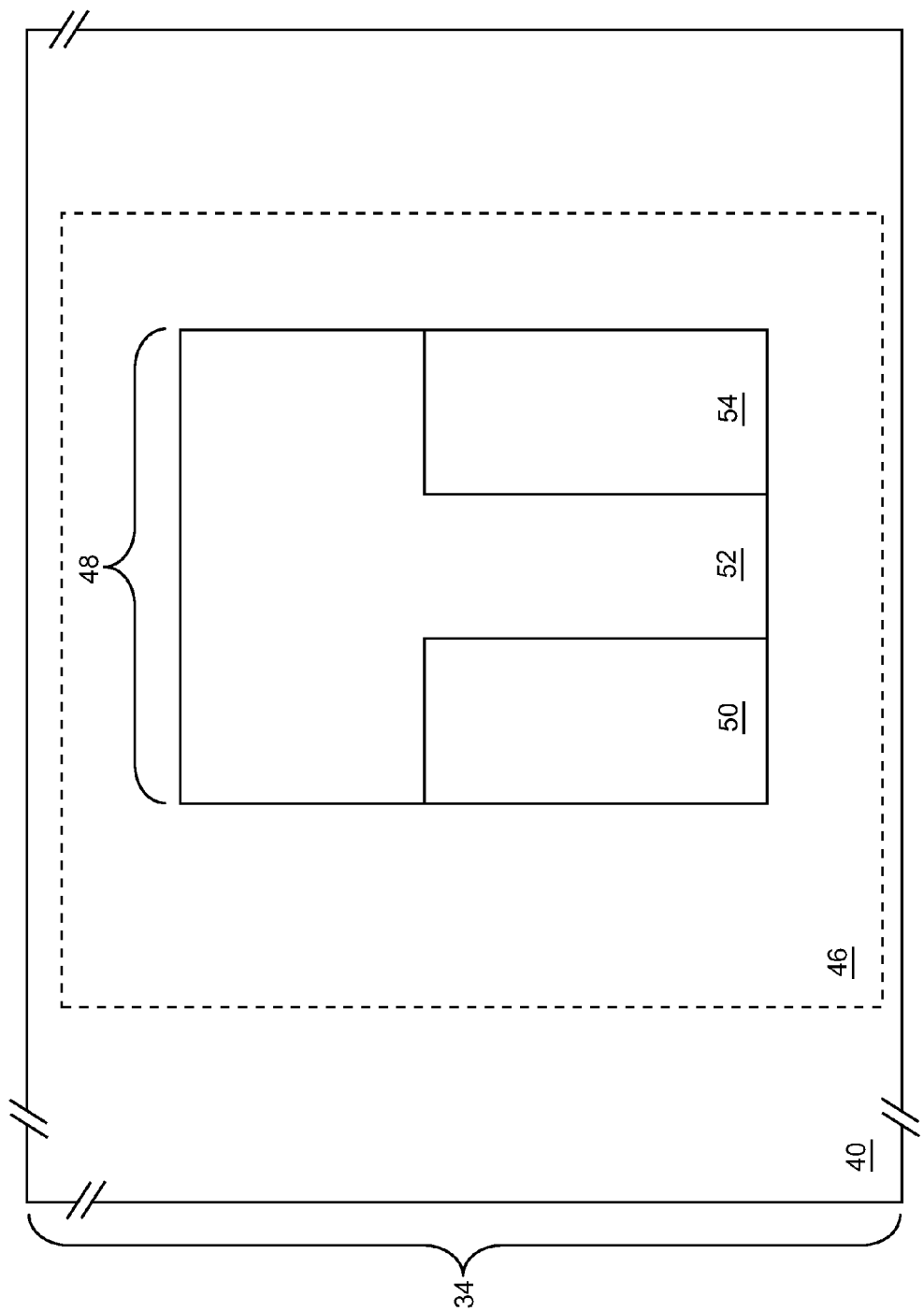
FIG. 4 shows a top view of a first body-contacted FET element formed using the thin-film semiconductor die illustrated in FIG. 3 according to one embodiment of the first body-contacted FET element.

FIG. 4 shows a top view of a first body-contacted FET element 46 formed using the thin-film semiconductor die 34 illustrated in FIG. 3 according to one embodiment of the first body-contacted FET element 46. The first body-contacted FET element 46 includes an active region 48, which is formed in the thin-film semiconductor device layer 40. The active region 48 includes a first source 50, a first body 52, and a first drain 54. The first body 52 is between the first source 50 and the first drain 54 and provides a channel for the first body-contacted FET element 46. Either or both of the first source 50 and the first drain 54 may include heavily doped semiconductor material to increase connectivity and provide one or more regions for making electrical connections to the first source 50 and the first drain 54, respectively.

In a first exemplary embodiment of the first body-contacted FET element 46, the first source 50 and the first drain 54 include N-type semiconductor material, and the first body 52 includes P-type semiconductor material. In a second exemplary embodiment of the first body-contacted FET element 46, the first source 50 and the first drain 54 include heavily doped N-type semiconductor material, and the first body 52 includes P-type semiconductor material. In a third exemplary embodiment of the first body-contacted FET element 46, the first source 50 and the first drain 54 include P-type semiconductor material, and the first body 52 includes N-type semiconductor material. In a fourth exemplary embodiment of the first body-contacted FET element 46, the first source 50 and the first drain 54 include heavily doped P-type semiconductor material, and the first body 52 includes N-type semiconductor material.

Figure 5:
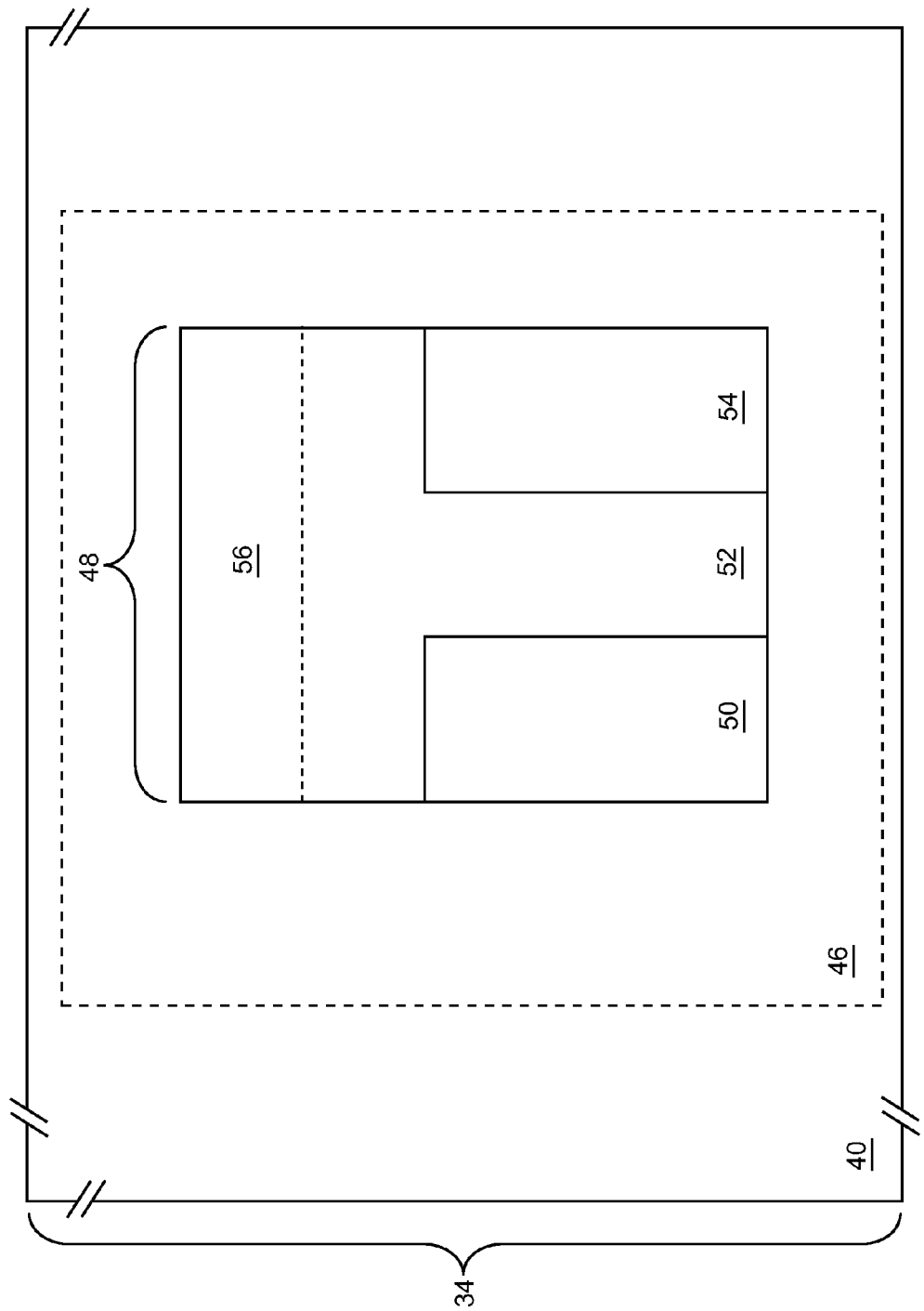
FIG. 5 shows a top view of details of the first body-contacted FET element illustrated in FIG. 4 according to an alternate embodiment of the first body-contacted FET element.

FIG. 5 shows a top view of details of the first body-contacted FET element 46 illustrated in FIG. 4 according to an alternate embodiment of the first body-contacted FET element 46. The first body 52 of the first body-contacted FET element 46 includes a first body contact region 56, which may include heavily doped semiconductor material to increase connectivity and provide one or more regions for making electrical connections to the first body 52. In a first exemplary embodiment of the first body 52, the first body 52 includes P-type semiconductor material and the first body contact region 56 includes heavily doped P-type semiconductor material. In a second exemplary embodiment of the first body 52, the first body 52 includes N-type semiconductor material and the first body contact region 56 includes heavily doped N-type semiconductor material.

Figure 6:
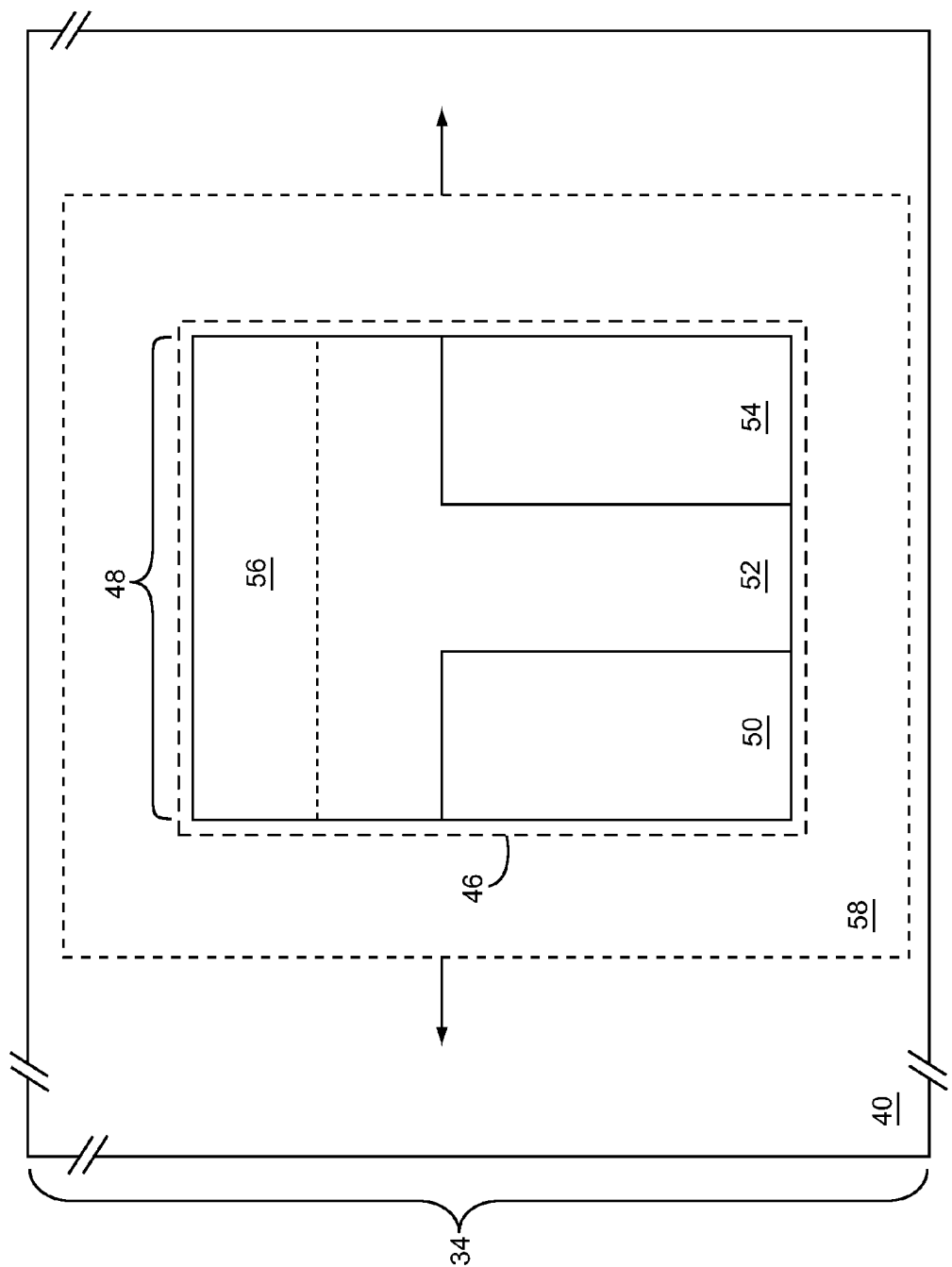
FIG. 6 shows a top view of details of the first body-contacted FET element illustrated in FIG. 5 according to an additional embodiment of the first body-contacted FET element.

FIG. 6 shows a top view of details of the first body-contacted FET element 46 illustrated in FIG. 5 according to an additional embodiment of the first body-contacted FET element 46. The first body-contacted FET element 46 includes insulating material 58 in the thin-film semiconductor device layer 40 and may completely surround the active region 48. Completely surrounding the active region 48 with the insulating material 58 may substantially eliminate conduction paths between the first body-contacted FET element 46 and other devices through the thin-film semiconductor device layer 40. In general, in thin-film semiconductor processing, all regions outside of the active region 48 may be fully oxide isolated as part of the normal CMOS process. A CMOS shallow trench may be everywhere outside of active regions 48 and may extend down to the insulating layer 38 (FIG. 3).

Figure 7:
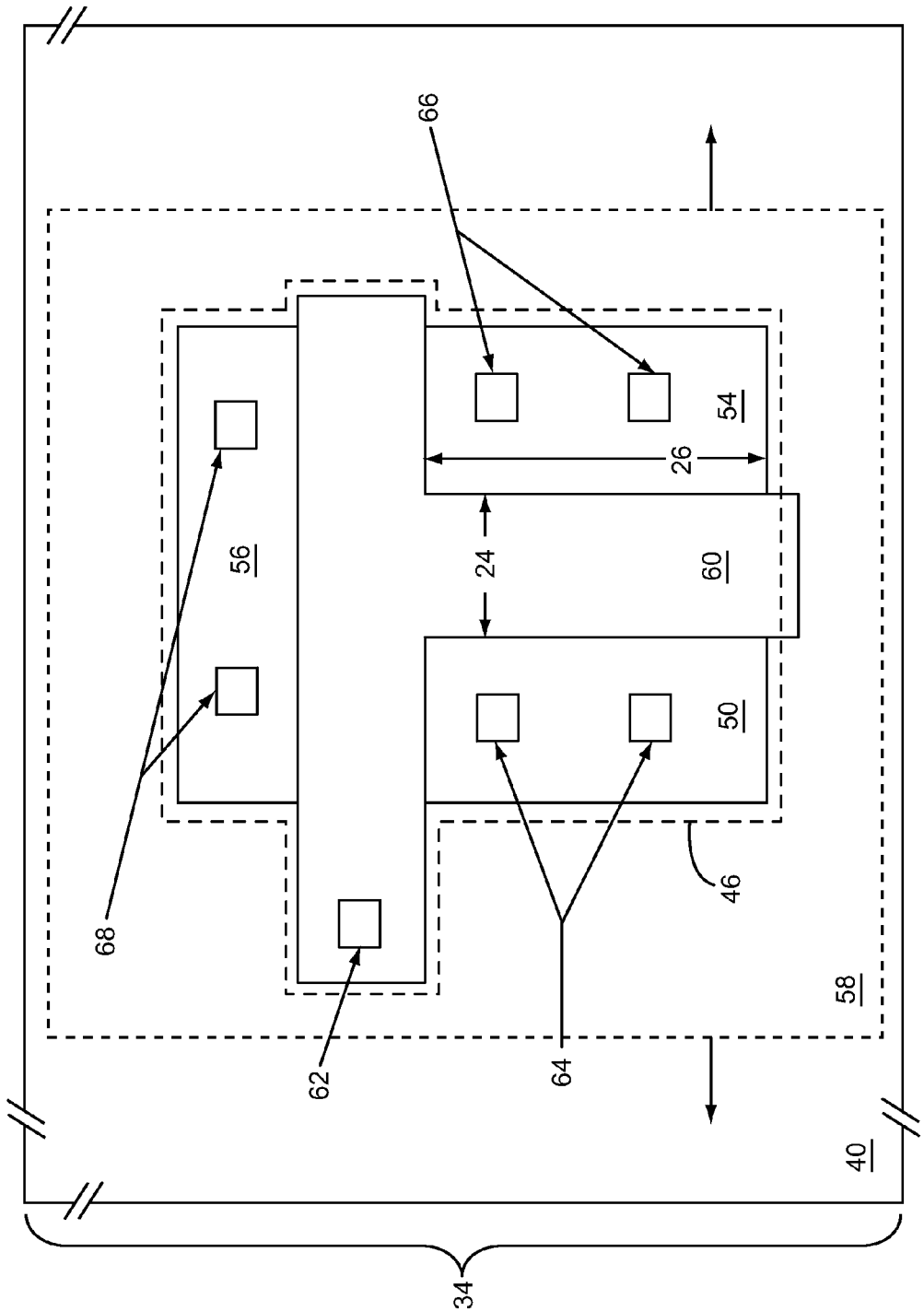
FIG. 7 shows a top view of details of the first body-contacted FET element illustrated in FIG. 4 according to another embodiment of the first body-contacted FET element.

FIG. 7 shows a top view of details of the first body-contacted FET element 46 illustrated in FIG. 4 according to another embodiment of the first body-contacted FET element 46. The first body-contacted FET element 46 includes a first gate 60 over the thin-film semiconductor device layer 40. The first gate 60 has the gate length 24 and the gate width 26 over the channel of the first body-contacted FET element 46. The first gate 60 may have a first gate contact 62, the first source 50 may have first source contacts 64, the first drain 54 may have first drain contacts 66, and the first body contact region 56 may have first body contacts 68. The first gate, the first source, the first drain, and the first body contacts 62, 64, 66, 68 may provide electrical connectivity to the first gate 60, the first source 50, the first drain 54, and the first body 52, respectively. The first gate 60 may extend over the insulating material 58, beyond the insulating material 58, or both. In one embodiment of the first gate 60, the first gate 60 includes polysilicon.

Figure 8:
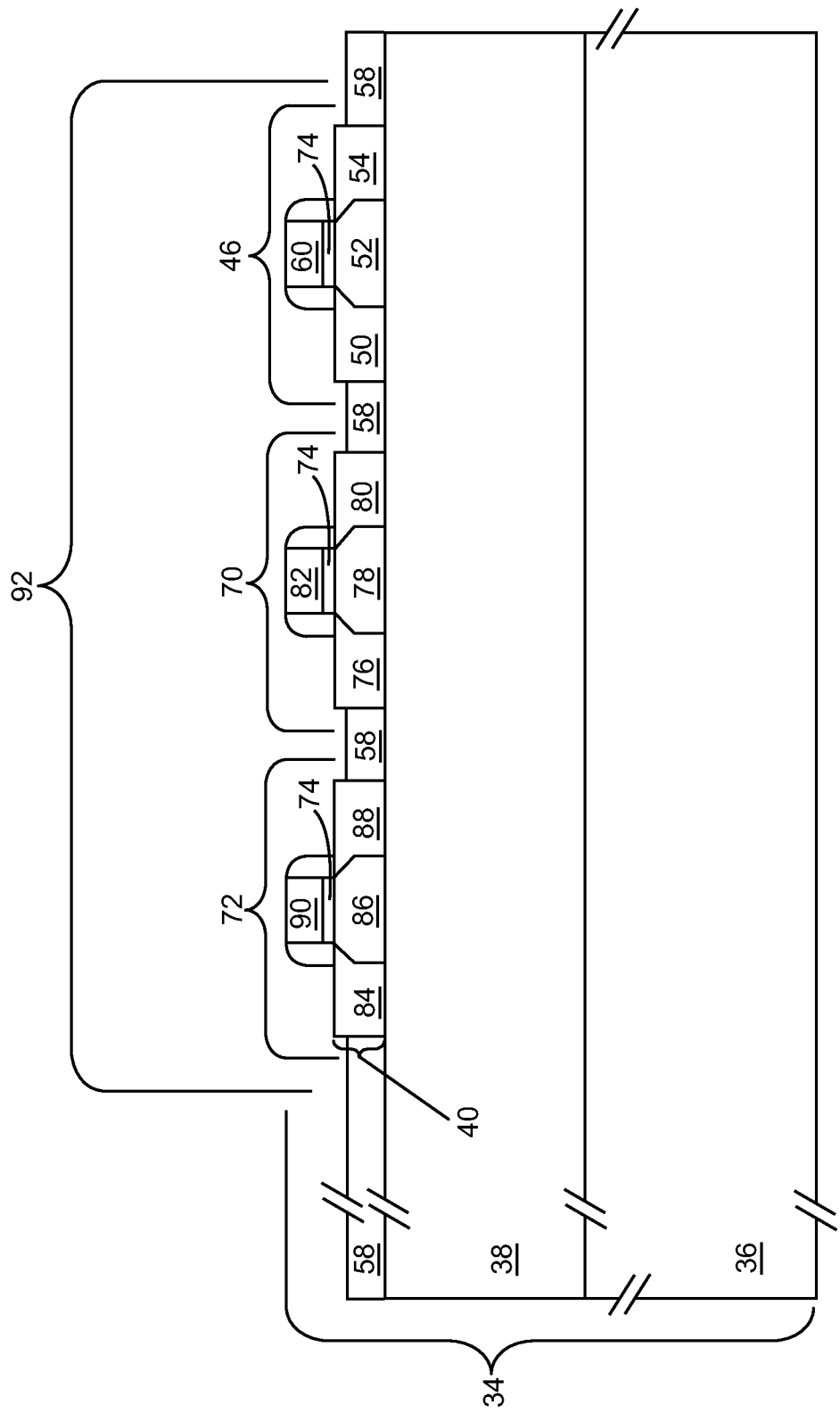
FIG. 8 shows a cross-section of the thin-film semiconductor die according to an alternate embodiment of the thin-film semiconductor die.

FIG. 8 shows a cross-section of the thin-film semiconductor die 34 illustrated in FIG. 3 according to an alternate embodiment of the thin-film semiconductor die 34. FIG. 8 shows a cross-section of the first body-contacted FET element 46, a second body-contacted FET element 70, and a third body-contacted FET element 72 formed using the thin-film semiconductor device layer 40. The first body-contacted FET element 46 includes the first source 50, the first body 52, the first drain 54, the insulating material 58, a gate oxide 74 over the first body 52, and the first gate 60 over the gate oxide 74. The first body 52 is between the first source 50 and the first drain 54, and the first source 50, the first body 52, and the first drain 54 are surrounded by the insulating material 58. The gate oxide 74 electrically insulates the first gate 60 from the first body 52. The first source 50, the first body 52, the first drain 54, or any combination thereof may completely traverse the semiconductor device layer thickness 42 (FIG. 3) of the thin-film semiconductor device layer 40. In one embodiment of the first body-contacted FET element 46, the first source 50 and the first drain 54 include N-type silicon, and the first body 52 includes P-type silicon. In an alternate embodiment of the first body-contacted FET element 46, the first source 50 and the first drain 54 include P-type silicon, and the first body 52 includes N-type silicon. Alternate embodiments of the first body-contacted FET element 46, the second body-contacted FET element 70, the third body-contacted FET element 72, the like, or any combination thereof may be formed using alternate layers, additional layers, or both having any type of implant or doping.

The second body-contacted FET element 70 may be similar to the first body-contacted FET element 46 and may include a second source 76, a second body 78, a second drain 80, the insulating material 58, the gate oxide 74 over the second body 78, and a second gate 82 over the gate oxide 74. The second body 78 is between the second source 76 and the second drain 80, and the second source 76, the second body 78, and the second drain 80 are surrounded by the insulating material 58. The gate oxide 74 electrically insulates the second gate 82 from the second body 78. The second body-contacted FET element 70 may include a second body contact region (not shown) and second body contacts (not shown). The second source 76, the second body 78, the second drain 80, or any combination thereof may completely traverse the semiconductor device layer thickness 42 (FIG. 3) of the thin-film semiconductor device layer 40. In one embodiment of the second body-contacted FET element 70, the second source 76 and the second drain 80 include N-type silicon, and the second body 78 includes P-type silicon. In an alternate embodiment of the second body-contacted FET element 70, the second source 76 and the second drain 80 include P-type silicon, and the second body 78 includes N-type silicon.

The third body-contacted FET element 72 may be similar to the first body-contacted FET element 46 and may include a third source 84, a third body 86, a third drain 88, the insulating material 58, the gate oxide 74 over the third body 86, and a third gate 90 over the gate oxide 74. The third body 86 is between the third source 84 and the third drain 88, and the third source 84, the third body 86, and the third drain 88 are surrounded by the insulating material 58. The gate oxide 74 electrically insulates the third gate 90 from the third body 86. The third body-contacted FET element 72 may include a third body contact region (not shown) and third body contacts (not shown). The third source 84, the third body 86, the third drain 88, or any combination thereof may completely traverse the semiconductor device layer thickness 42 (FIG. 3) of the thin-film semiconductor device layer 40. In one embodiment of the third body-contacted FET element 72, the third source 84 and the third drain 88 include N-type silicon, and the third body 86 includes P-type silicon. In an alternate embodiment of the third body-contacted FET element 72, the third source 84 and the third drain 88 include P-type silicon, and the third body 86 includes N-type silicon.

A first body-contacted RF switch 92 includes the first body-contacted FET element 46, the second body-contacted FET element 70, and the third body-contacted FET element 72 according to one embodiment of the first body-contacted RF switch 92. In an exemplary embodiment of the first body-contacted RF switch 92, the insulating material 58 extends completely though the thin-film semiconductor device layer 40 down to the insulating layer 38, such that the insulating material 58 completely surrounds each of the first body-contacted FET element 46, the second body-contacted FET element 70, and the third body-contacted FET element 72, thereby substantially eliminating conduction paths between the first, the second, and the third body-contacted FET elements 46, 70, 72 through the substrate 36, through the thin-film semiconductor device layer 40, or both.

Figure 9:
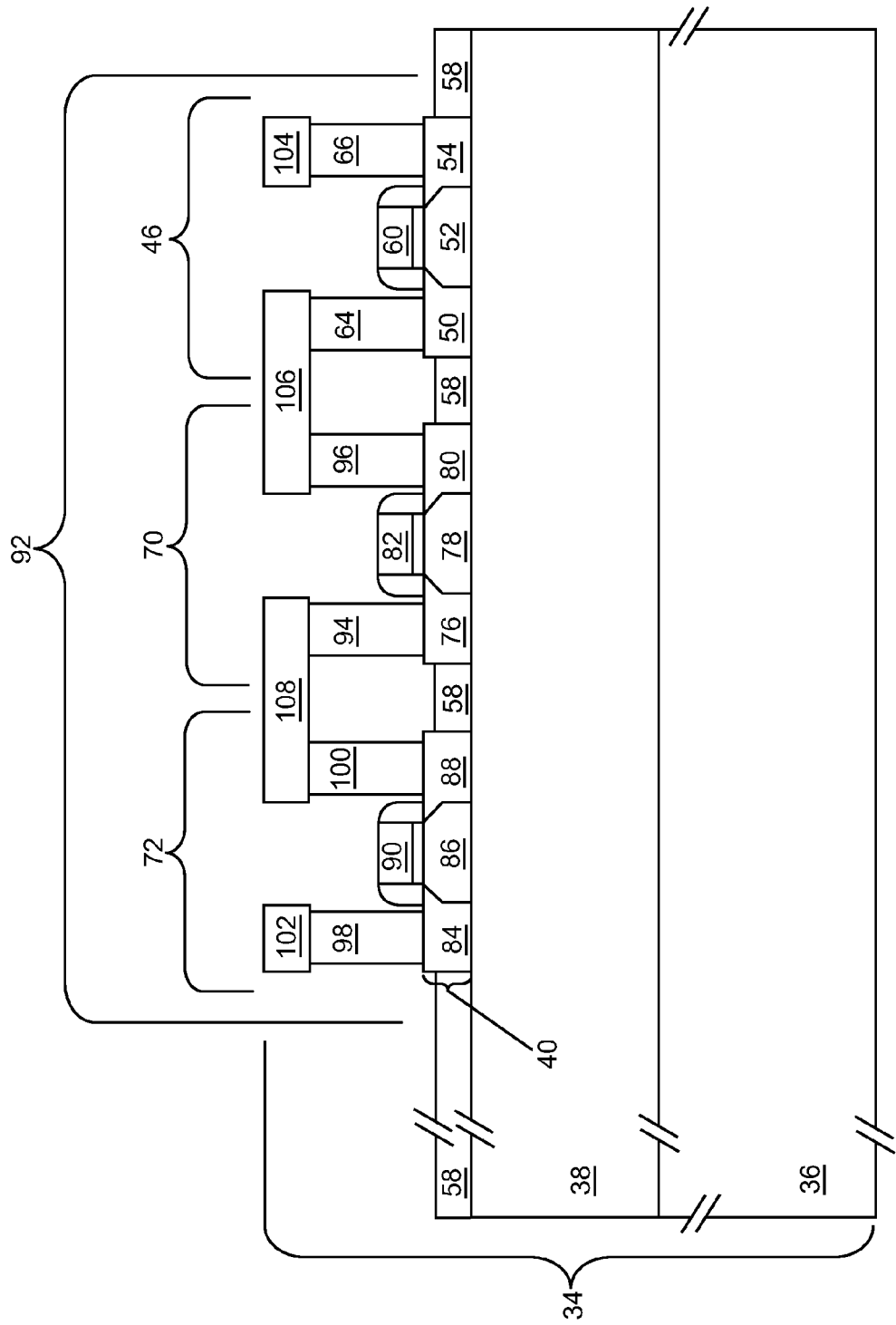
FIG. 9 shows a cross-section of the thin-film semiconductor die according to an additional embodiment of the thin-film semiconductor die.

FIG. 9 shows a cross-section of the thin-film semiconductor die 34 according to an additional embodiment of the thin-film semiconductor die 34. The thin-film semiconductor die 34 illustrated in FIG. 9 is similar to the thin-film semiconductor die 34 illustrated in FIG. 8, except that the thin-film semiconductor die 34 illustrated in FIG. 9 further includes the first source contact 64, the first drain contact 66, a second source contact 94, a second drain contact 96, a third source contact 98, a third drain contact 100, a first switch connection node 102, a second switch connection node 104, a first FET interconnect 106, and a second FET interconnect 108. The contacts 64, 66, 94, 96, 98, 100 may be vias that traverse one or more layers of the thin-film semiconductor die 34. Any or all of the first switch connection node 102, the second switch connection node 104, the first FET interconnect 106, and the second FET interconnect 108 may be provided by one or more metallization layers of the thin-film semiconductor die 34.

The first source contact 64 is electrically connected to the first source 50; the first drain contact 66 is electrically connected to the first drain 54; the second source contact 94 is electrically connected to the second source 76; the second drain contact 96 is electrically connected to the second drain 80; the third source contact 98 is electrically connected to the third source 84; and the third drain contact 100 is electrically connected to the third drain 88. The first switch connection node 102 of the first body-contacted RF switch 92 is electrically connected to the third source 84 through the third source contact 98. The second switch connection node 104 of the first body-contacted RF switch 92 is electrically connected to the first drain 54 through the first drain contact 66. The first FET interconnect 106 electrically connects the first source 50 to the second drain 80 through the first source contact 64 and the second drain contact 96, respectively. The second FET interconnect 108 electrically connects the second source 76 to the third drain 88 through the second source contact 94 and the third drain contact 100, respectively. As such, the first body-contacted FET element 46, the second body-contacted FET element 70, and the third body-contacted FET element 72 are coupled in series between the first switch connection node 102 and the second switch connection node 104.

Figure 10:
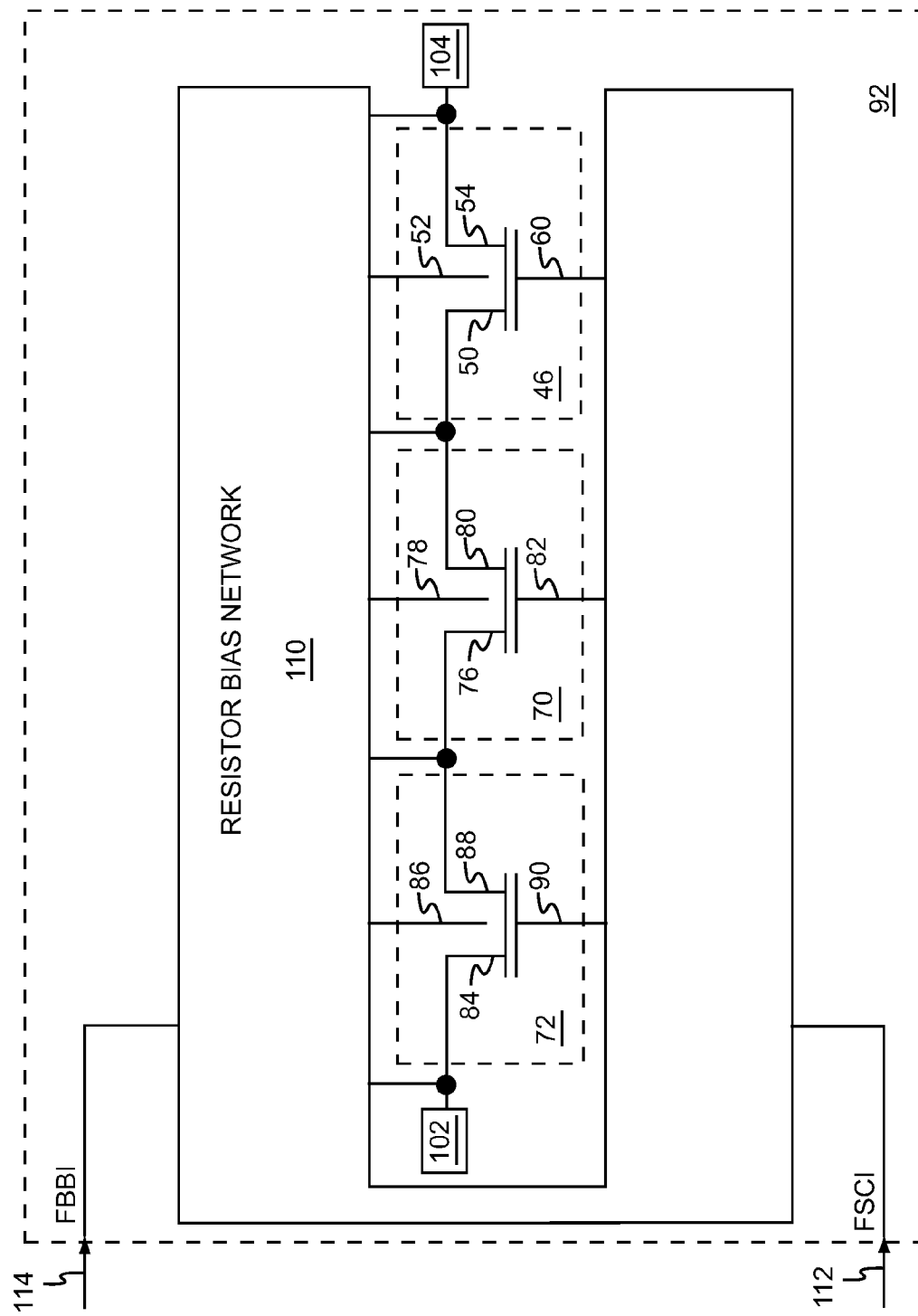
FIG. 10 is a schematic diagram showing the first body-contacted RF switch illustrated in FIG. 9 according to one embodiment of the first body-contacted RF switch.

FIG. 10 is a schematic diagram showing the first body-contacted RF switch 92 illustrated in FIG. 9 according to one embodiment of the first body-contacted RF switch 92. The first body-contacted RF switch 92 includes the first body-contacted FET element 46, the second body-contacted FET element 70, the third body-contacted FET element 72, the first switch connection node 102, the second switch connection node 104, a first body bias input FBBI, a first switch control input FSCI, and a resistor bias network 110. During operation of the first body-contacted RF switch 92, the first switch control input FSCI may receive a first switch control signal 112 and the first body bias input FBBI may receive a first body bias control signal 114. The first body-contacted FET element 46, the second body-contacted FET element 70, and the third body-contacted FET element 72 are coupled in series between the first switch connection node 102 and the second switch connection node 104, such that the third source 84 is coupled to the first switch connection node 102, the third drain 88 is coupled to the second source 76, the second drain 80 is coupled to the first source 50, and the first drain 54 is coupled to the second switch connection node 104.

The resistor bias network 110 is coupled to the first source 50, the first body 52, the first drain 54, the first gate 60, the second source 76, the second body 78, the second drain 80, the second gate 82, the third source 84, the third body 86, the third drain 88, the third gate 90, the first body bias input FBBI, and the first switch control input FSCI. During operation of the first body-contacted RF switch 92, the resistor bias network 110 may provide appropriate bias behavior to the first source 50, the first body 52, the first drain 54, the first gate 60, the second source 76, the second body 78, the second drain 80, the second gate 82, the third source 84, the third body 86, the third drain 88, and the third gate 90 based on the first switch control signal 112, the first body bias control signal 114, signals between the first switch connection node 102 and the second switch connection node 104, or any combination thereof.

Figure 11:
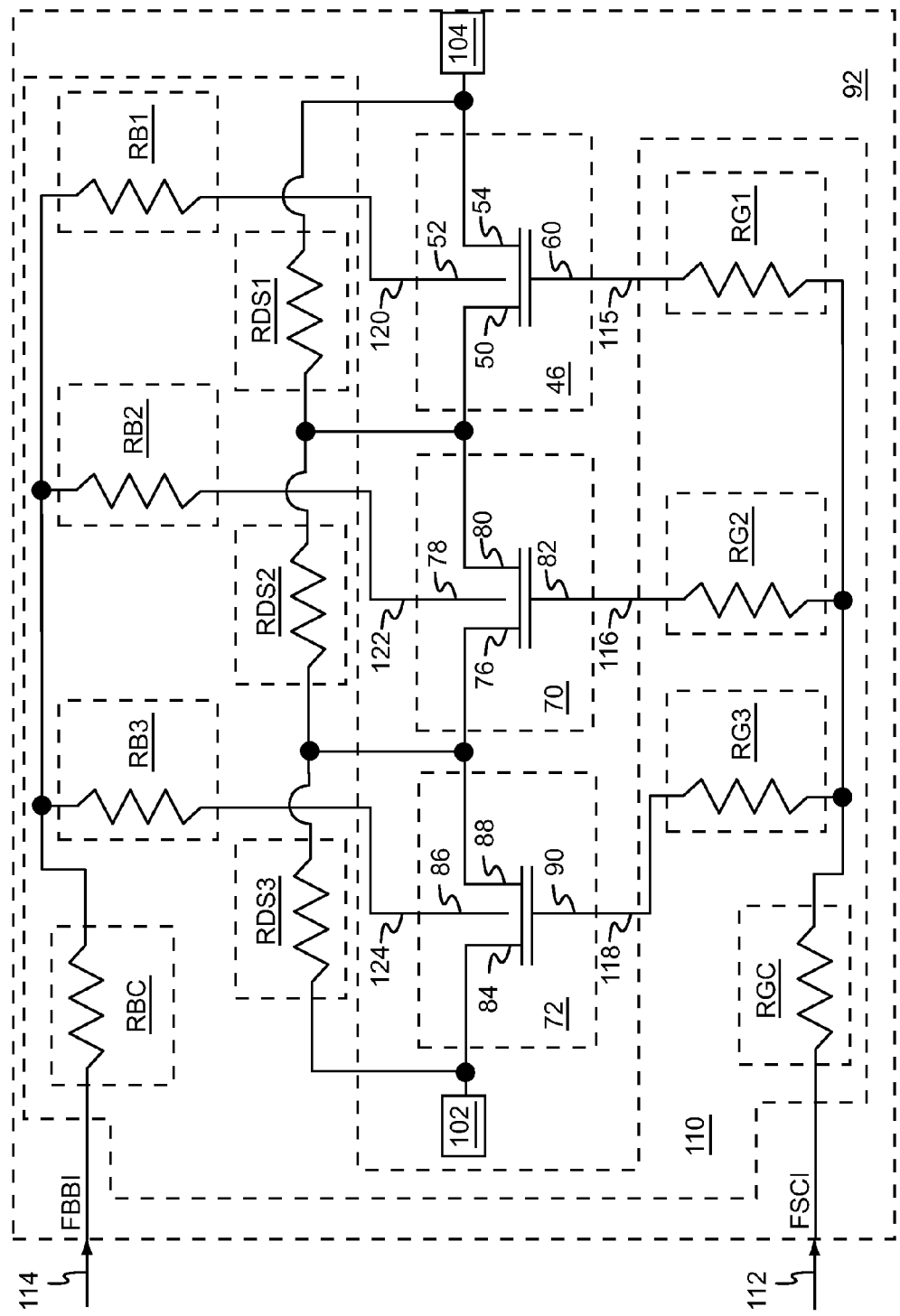
FIG. 11 is a schematic diagram showing details of a resistor bias network illustrated in FIG. 10 according to one embodiment of the resistor bias network.

FIG. 11 is a schematic diagram showing details of the resistor bias network 110 illustrated in FIG. 10 according to one embodiment of the resistor bias network 110. The resistor bias network 110 includes a first body bias resistive element RB1, a second body bias resistive element RB2, a third body bias resistive element RB3, a common body bias resistive element RBC, a first gate resistive element RG1, a second gate resistive element RG2, a third gate resistive element RG3, a common gate resistive element RGC, a first drain-to-source resistive element RDS1, a second drain-to-source resistive element RDS2, and a third drain-to-source resistive element RDS3.

The first gate resistive element RG1 is coupled between the first gate 60 and a gate node (not shown) to provide a first gate signal 115 to the first gate 60. The second gate resistive element RG2 is coupled between the second gate 82 and the gate node to provide a second gate signal 116 to the second gate 82. The third gate resistive element RG3 is coupled between the third gate 90 and the gate node to provide a third gate signal 118 to the third gate 90. The common gate resistive element RGC is coupled between the gate node and the first switch control input FSCI. During operation of the first body-contacted RF switch 92, the first switch control input FSCI may receive the first switch control signal 112, such that the first, the second, and the third gate signals 115, 116, 118 are based on the first switch control signal 112. The first switch control signal 112 is used to select either the ON state or the OFF state of the first body-contacted RF switch 92. Selection between the ON state and the OFF state normally occurs at a much lower frequency than the frequency of RF signals between the first and the second switch connection nodes 102, 104. As such, the first switch control signal 112 may have direct current (DC)-like influences on the first body-contacted RF switch 92. To minimize the impact of such DC influences, the first, the second, and the third gate resistive elements RG1, RG2, RG3 may have large values of resistance to isolate the first, the second, and the third gates 60, 82, 90 from one another. Normally, the first body-contacted RF switch 92 will have one of the ON state, the OFF state, or a non-operating state.

The first body bias resistive element RB1 is coupled between the first body 52 and a body bias node (not shown) to provide a first body bias signal 120 to the first body 52. The second body bias resistive element RB2 is coupled between the second body 78 and the body bias node to provide a second body bias signal 122 to the second body 78. The third body bias resistive element RB3 is coupled between the third body 86 and the body bias node to provide a third body bias signal 124 to the third body 86. The common body bias resistive element RBC is coupled between the body bias node and the first body bias input FBBI. During operation of the first body-contacted RF switch 92, the first body bias input FBBI may receive the first body bias control signal 114, such that the first, the second, and the third body bias signals 120, 122, 124 are based on the first body bias control signal 114. The first body bias control signal 114 may be used to provide an appropriate body bias to the first, the second, and the third bodies 52, 78, 86, depending on whether the ON state or the OFF state of the first body-contacted RF switch 92 is selected. As mentioned above, selection between the ON state and the OFF state normally occurs at a much lower frequency than the frequency of RF signals between the first and the second switch connection nodes 102, 104. Since the first body bias control signal 114 is based on OFF state or ON state selection, the frequency of the first body bias control signal 114 normally occurs at a much lower frequency than the frequency of RF signals between the first and the second switch connection nodes 102, 104. As such, the first body bias control signal 114 may have DC like influences on the first body-contacted RF switch 92. To minimize the impact of such DC influences, the first, the second, and the third body bias resistive elements RB1, RB2, RB3 may have large values of resistance to isolate the first, the second, and the third bodies 52, 78, 86 from one another.

The first drain-to-source resistive element RDS1 is coupled between the first drain 54 and the first source 50, the second drain-to-source resistive element RDS2 is coupled between the second drain 80 and the second source 76, and the third drain-to-source resistive element RDS3 is coupled between the third drain 88 and the third source 84. During the OFF state, the first, the second, and the third drain-to-source resistive elements RDS1, RDS2, RDS3 may provide about equal voltage division across the first, the second, and the third body-contacted FET elements 46, 70, 72.

In a first exemplary embodiment of the first body-contacted RF switch 92, during the OFF state of the first body-contacted RF switch 92, a magnitude of the first body bias control signal 114 is about equal to a magnitude of the first switch control signal 112, and during the ON state of the first body-contacted RF switch 92, the magnitude of the first body bias control signal 114 is not equal to the magnitude of the first switch control signal 112.

In a second exemplary embodiment of the first body-contacted RF switch 92, during the OFF state of the first body-contacted RF switch 92, the magnitude of the first body bias control signal 114 is about equal to the magnitude of the first switch control signal 112, the magnitude of the first switch control signal 112 is negative relative to a DC voltage at the first switch connection node 102, and the magnitude of the first switch control signal 112 is negative relative to a DC voltage at the second switch connection node 104. During the ON state of the first body-contacted RF switch 92, the magnitude of the first switch control signal 112 is positive relative to the magnitude of the first body bias control signal 114.

In a third exemplary embodiment of the first body-contacted RF switch 92, during the OFF state of the first body-contacted RF switch 92, the magnitude of the first body bias control signal 114 is about equal to the magnitude of the first switch control signal 112, the magnitude of the first switch control signal 112 is positive relative to the DC voltage at the first switch connection node 102, and the magnitude of the first switch control signal 112 is positive relative to the DC voltage at the second switch connection node 104. During the ON state of the first body-contacted RF switch 92, the magnitude of the first switch control signal 112 is negative relative to the magnitude of the first body bias control signal 114.

In a fourth exemplary embodiment of the first body-contacted RF switch 92, during the OFF state of the first body-contacted RF switch 92, the first body bias control signal 114 is equal to between about −1 volt DC (VDC) and about −5VDC, the first switch control signal 112 is equal to between about −1VDC and about −5VDC, the DC voltage at the first switch connection node 102 is equal to about zero volts, and the DC voltage at the second switch connection node 104 is equal to about zero volts. During the ON state of the first body-contacted RF switch 92, the first body bias control signal 114 is equal to about zero VDC, the first switch control signal 112 is equal to between about 1VDC and about 5VDC, the DC voltage at the first switch connection node 102 is equal to about zero volts, and the DC voltage at the second switch connection node 104 is equal to about zero volts.

During the OFF state of the first body-contacted RF switch 92, the first body-contacted RF switch 92 has an OFF state impedance between the first and the second switch connection nodes 102, 104. During the ON state of the first body-contacted RF switch 92, the first body-contacted RF switch 92 has an ON state impedance between the first and the second switch connection nodes 102, 104. In the illustrated embodiment of the first body-contacted RF switch 92, the first, the second, and the third body-contacted FET elements 46, 70, 72 are coupled in series between the first and the second switch connection nodes 102, 104. As such, three body-contacted FET elements are coupled in series. In an alternate embodiment of the first body-contacted RF switch 92, the second body-contacted FET element 70 is omitted, such that the third drain 88 is directly coupled to the first source 50. As such, two body-contacted FET elements are coupled in series. In additional embodiments of the first body-contacted RF switch 92, any number of body-contacted FET elements may be coupled in series.

Figure 12:
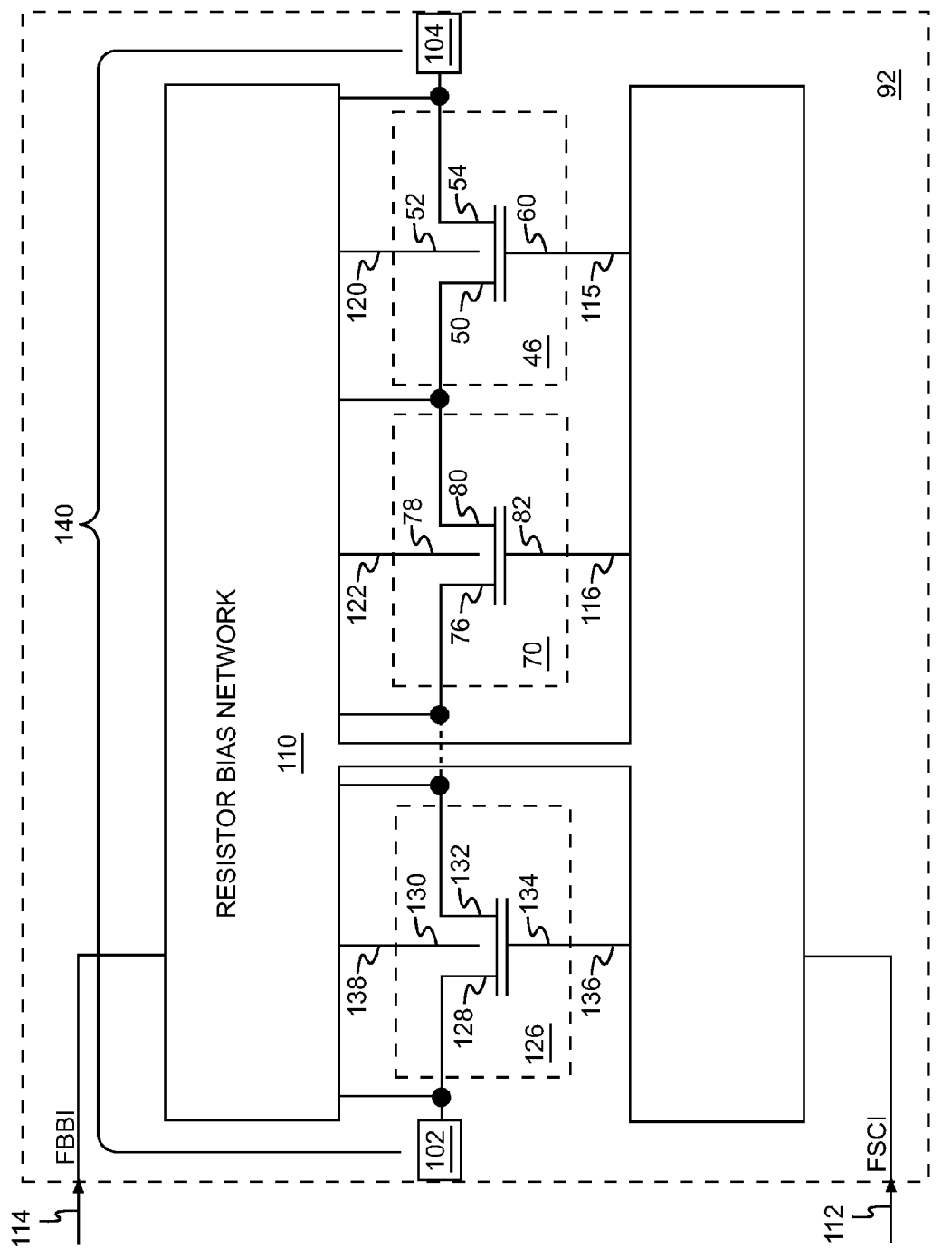
FIG. 12 is a schematic diagram showing the first body-contacted RF switch according to an alternate embodiment of the first body-contacted RF switch.

FIG. 12 is a schematic diagram showing the first body-contacted RF switch 92 according to an alternate embodiment of the first body-contacted RF switch 92. The first body-contacted RF switch 92 illustrated in FIG. 12 is similar to the first body-contacted RF switch 92 illustrated in FIG. 10, except the first body-contacted RF switch 92 illustrated in FIG. 12 may include any number of body-contacted FET elements. The first body-contacted RF switch 92 includes the first body-contacted FET element 46, the second body-contacted FET element 70, and up to and including an $N^{TH}$ body-contacted FET element 126. The $N^{TH}$ body-contacted FET element 126 includes an $N^{TH}$ source 128, an $N^{TH}$ body 130, an $N^{TH}$ drain 132, and an $N^{TH}$ gate 134. The $N^{TH}$ body-contacted FET element 126 and any intervening body-contacted FET elements (not shown) between the second body-contacted FET element 70 and the $N^{TH}$ body-contacted FET element 126 may be similar to the first body-contacted FET element 46 as previously described.

The first body-contacted FET element 46, the second body-contacted FET element 70, and up to and including the $N^{TH}$ body-contacted FET element 126 are coupled in series between the first switch connection node 102 and the second switch connection node 104, such that the $N^{TH}$ source 128 is coupled to the first switch connection node 102, the $N^{TH}$ drain 132 is coupled to the second source 76 through any intervening body-contacted FET elements (not shown), the second drain 80 is coupled to the first source 50, and the first drain 54 is coupled to the second switch connection node 104. The resistor bias network 110 provides the first gate signal 115 to the first gate 60, the second gate signal 116 to the second gate 82, and an $N^{TH}$ gate signal 136 to the $N^{TH}$ gate 134. During operation of the first body-contacted RF switch 92, the first switch control input FSCI may receive the first switch control signal 112, such that the first, the second, and up to and including the $N^{TH}$ gate signals 115, 116, 136 are based on the first switch control signal 112. The first switch control signal 112 is used to select either the ON state or the OFF state of the first body-contacted RF switch 92.

The resistive bias network 110 provides the first body bias signal 120 to the first body 52, the second body bias signal 122 to the second body 78, and an $N^{TH}$ body bias signal 138 to the $N^{TH}$ body 130. During operation of the first body-contacted RF switch 92, the first body bias input FBBI may receive the first body bias control signal 114, such that the first, the second, and up to and including the $N^{TH}$ body bias signals 120, 122, 138 are based on the first body bias control signal 114. The first body bias control signal 114 may be used to provide an appropriate body bias to the first, the second, and up to and including the $N^{TH}$ bodies 52, 78, 130, depending on whether the ON state or the OFF state of the first body-contacted RF switch 92 is selected.

The first body-contacted RF switch 92 includes a quantity of series coupled body-contacted FET elements equal to N, such that N is any positive whole number greater than one. An RF signal 140 between the first and the second switch connection nodes 102, 104 may be present due to the first body-contacted RF switch 92 interacting with other circuit elements (not shown). In one embodiment of the first body-contacted RF switch 92, a frequency of the RF signal 140 is greater than about 100 megahertz. During the OFF state of the first body-contacted RF switch 92, the RF signal 140 may be distributed across the first body-contacted FET element 46, the second body-contacted FET element 70, and up to and including the $N^{TH}$ body-contacted FET element 126. In an exemplary embodiment of the first body-contacted RF switch 92, during the OFF state of the first body-contacted RF switch 92, the RF signal 140 is distributed about equally across the first body-contacted FET element 46, the second body-contacted FET element 70, and up to and including the $N^{TH}$ body-contacted FET element 126.

Figure 13:
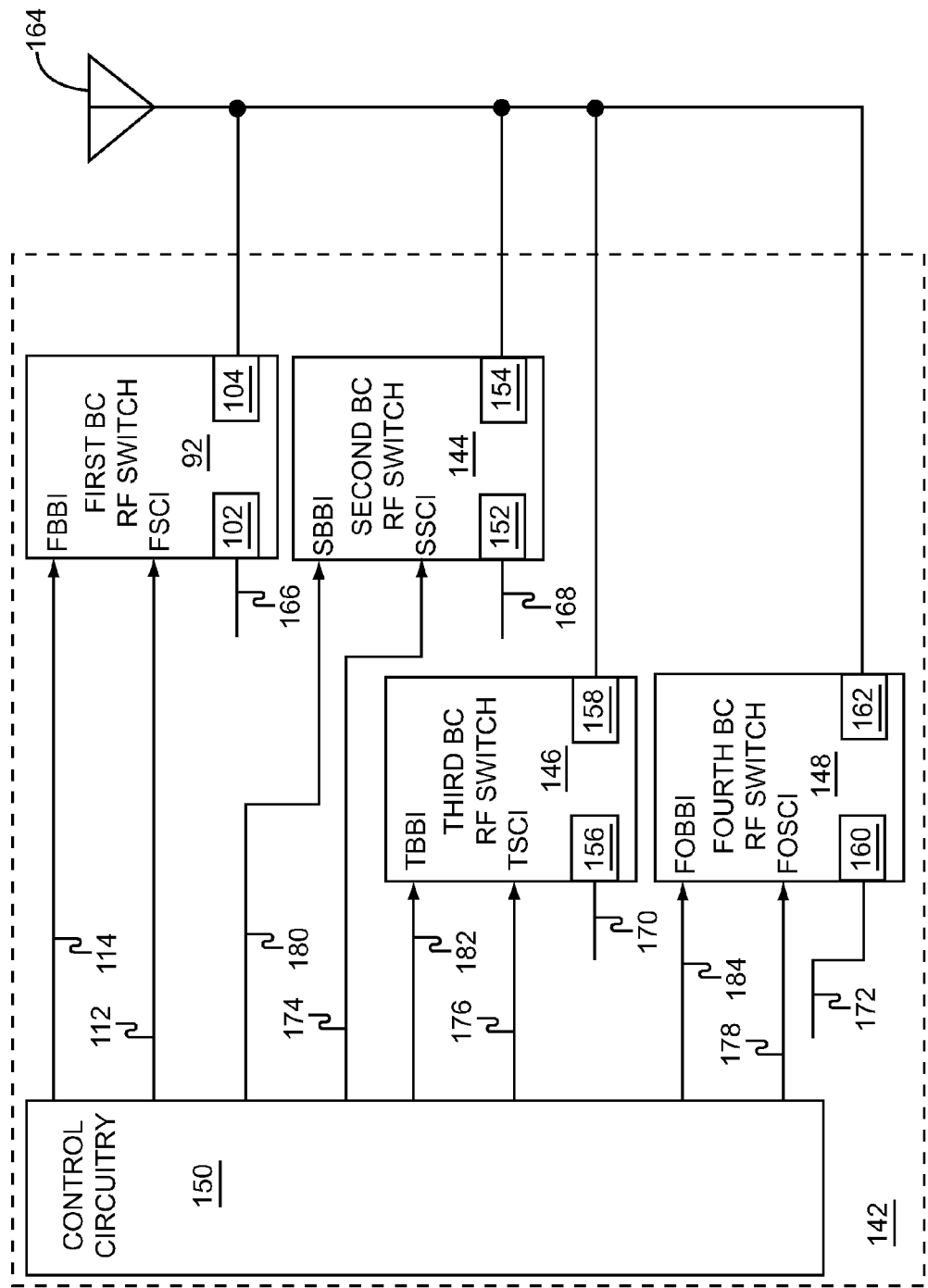
FIG. 13 shows an RF switch system according to one embodiment of the RF switch system.

FIG. 13 shows an RF switch system 142 according to one embodiment of the RF switch system 142. The RF switch system 142 provides four switched ports and includes the first body-contacted RF switch 92, a second body-contacted RF switch 144, a third body-contacted RF switch 146, a fourth body-contacted RF switch 148, and control circuitry 150. The second, the third, and the fourth body-contacted RF switches 144, 146, 148 may be similar to the first body-contacted RF switch 92. The second body-contacted RF switch 144 has a third switch connection node 152 and a fourth switch connection node 154, which may be similar to the first switch connection node 102 and the second switch connection node 104, respectively. Further, the second body-contacted RF switch 144 has a second body bias input SBBI and a second switch control input SSCI, which may be similar to the first body bias input FBBI and the first switch control input FSCI, respectively.

The third body-contacted RF switch 146 has a fifth switch connection node 156 and a sixth switch connection node 158, which may be similar to the first switch connection node 102 and the second switch connection node 104, respectively. Further, the third body-contacted RF switch 146 has a third body bias input TBBI and a third switch control input TSCI, which may be similar to the first body bias input FBBI and the first switch control input FSCI, respectively.

The fourth body-contacted RF switch 148 has a seventh switch connection node 160 and an eighth switch connection node 162, which may be similar to the first switch connection node 102 and the second switch connection node 104, respectively. Further, the fourth body-contacted RF switch 148 has a fourth body bias input FOBBI and a fourth switch control input FOSCI, which may be similar to the first body bias input FBBI and the first switch control input FSCI, respectively.

Each of the first, the second, the third, and the fourth body-contacted RF switches 92, 144, 146, 148 provides a switched port of the RF switch system 142. The second, the fourth, the sixth, and the eighth switch connection nodes 104, 154, 158, 162 are coupled to an RF antenna 164. The first, the third, the fifth, and the seventh switch connection nodes 102, 152, 156, 160 provide a first port 166, a second port 168, a third port 170, and a fourth port 172, respectively. Therefore, the first, the second, the third, and the fourth body-contacted RF switches 92, 144, 146, 148 allow the first, the second, the third, and the fourth ports 166, 168, 170, 172 to share the RF antenna 164. Any or all of the first, the second, the third, and the fourth ports 166, 168, 170, 172 may be coupled to RF transmit circuitry (not shown), RF receive circuitry (not shown), RF diplexers (not shown), RF duplexers (not shown), the like (not shown), or any combination thereof (not shown).

The control circuitry 150 provides the first switch control signal 112, a second switch control signal 174, a third switch control signal 176, and a fourth switch control signal 178 to the first switch control input FSCI, the second switch control input SSCI, the third switch control input TSCI, and the fourth switch control input FOSCI, respectively. The control circuitry 150 selects either the OFF state of the first body-contacted RF switch 92 or the ON state of the first body-contacted RF switch 92 and provides the first switch control signal 112 based on the selected one of the OFF state and the ON state to indicate which state was selected. The control circuitry 150 selects either an OFF state of the second body-contacted RF switch 144 or an ON state of the second body-contacted RF switch 144 and provides the second switch control signal 174 based on the selected one of the OFF state and the ON state to indicate which state was selected. The control circuitry 150 selects either an OFF state of the third body-contacted RF switch 146 or an ON state of the third body-contacted RF switch 146 and provides the third switch control signal 176 based on the selected one of the OFF state and the ON state to indicate which state was selected. The control circuitry 150 selects either an OFF state of the fourth body-contacted RF switch 148 or an ON state of the fourth body-contacted RF switch 148 and provides the fourth switch control signal 178 based on the selected one of the OFF state and the ON state to indicate which state was selected.

The control circuitry 150 provides the first body bias control signal 114, a second body bias control signal 180, a third body bias control signal 182, and a fourth body bias control signal 184 to the first body bias input FBBI, the second body bias input SBBI, the third body bias input TBBI, and the fourth body bias input FOBBI, respectively. The control circuitry 150 provides the first body bias control signal 114 based on the selected one of the OFF state and the ON state of the first body-contacted RF switch 92 to provide the appropriate body biasing to the body-contacted FET elements (not shown) in the first body-contacted RF switch 92. The control circuitry 150 provides the second body bias control signal 180 based on the selected one of the OFF state and the ON state of the second body-contacted RF switch 144 to provide the appropriate body biasing to the body-contacted FET elements (not shown) in the second body-contacted RF switch 144. The control circuitry 150 provides the third body bias control signal 182 based on the selected one of the OFF state and the ON state of the third body-contacted RF switch 146 to provide the appropriate body biasing to the body-contacted FET elements (not shown) in the third body-contacted RF switch 146. The control circuitry 150 provides the fourth body bias control signal 184 based on the selected one of the OFF state and the ON state of the fourth body-contacted RF switch 148 to provide the appropriate body biasing to the body-contacted FET elements (not shown) in the fourth body-contacted RF switch 148.

Alternate embodiments of the RF switch system 142 may omit any or all of the second, the third, and the fourth body-contacted RF switches 144, 146, 148, or may include additional body-contacted RF switches (not shown). Further, the body-contacted RF switches may be arranged in any manner.

Figure 14:
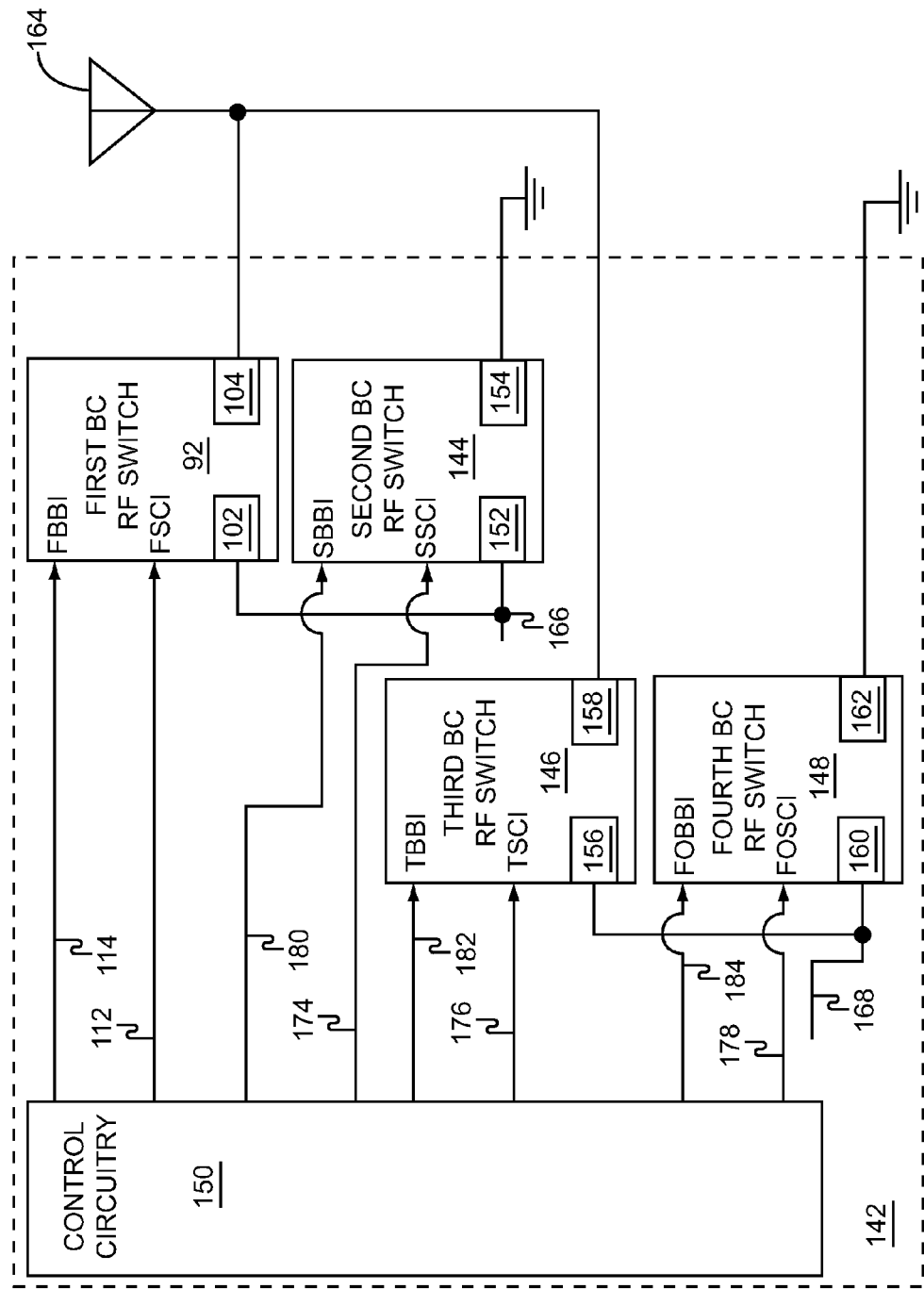
FIG. 14 shows the RF switch system according to an alternate embodiment of the RF switch system.

FIG. 14 shows the RF switch system 142 according to an alternate embodiment of the RF switch system 142. The RF switch system 142 illustrated in FIG. 14 is similar to the RF switch system 142 illustrated in FIG. 13 except the RF switch system 142 illustrated in FIG. 14 uses the second, the third, and the fourth body-contacted RF switches 144, 146, 148 in a different manner. In FIG. 13, the second, the fourth, the sixth, and the eighth switch connection nodes 104, 154, 158, 162 are coupled to the RF antenna 164. The first, the third, the fifth, and the seventh switch connection nodes 102, 152, 156, 160 provide the first, the second, the third, and the fourth ports 166, 168, 170, 172, respectively. In FIG. 14, the third and the fourth ports 170, 172 are omitted. The first and the third switch connection nodes 102, 152 provide the first port 166, and the fifth and the seventh switch connection nodes 156, 160 provide the second port 168. The second and the sixth switch connection nodes 104, 158 are coupled to the RF antenna 164, and the fourth and the eighth switch connection nodes 154, 162 are coupled to ground. As such, the second and the fourth body-contacted RF switches 144, 148 function as shunt switches.

Normally, when the first body-contacted RF switch 92 is in the OFF state, the second body-contacted RF switch 144 is in the ON state and vice versa. By coupling the first switch connection node 102 to ground when the first body-contacted RF switch 92 is in the OFF state and the second body-contacted RF switch 144 is in the ON state may improve isolation characteristics of the first body-contacted RF switch 92. Similarly, normally, when the third body-contacted RF switch 146 is in the OFF state, the fourth body-contacted RF switch 148 is in the ON state and vice versa. By coupling the fifth switch connection node 156 to ground when the third body-contacted RF switch 146 is in the OFF state and the fourth body-contacted RF switch 148 is in the ON state may improve isolation characteristics of the third body-contacted RF switch 146. Alternate embodiments of the RF switch system 142 may omit any or all of the second, the third, and the fourth body-contacted RF switches 144, 146, 148, or may include additional body-contacted RF switches (not shown). Further, the body-contacted RF switches may be arranged in any manner.

Figure 15:
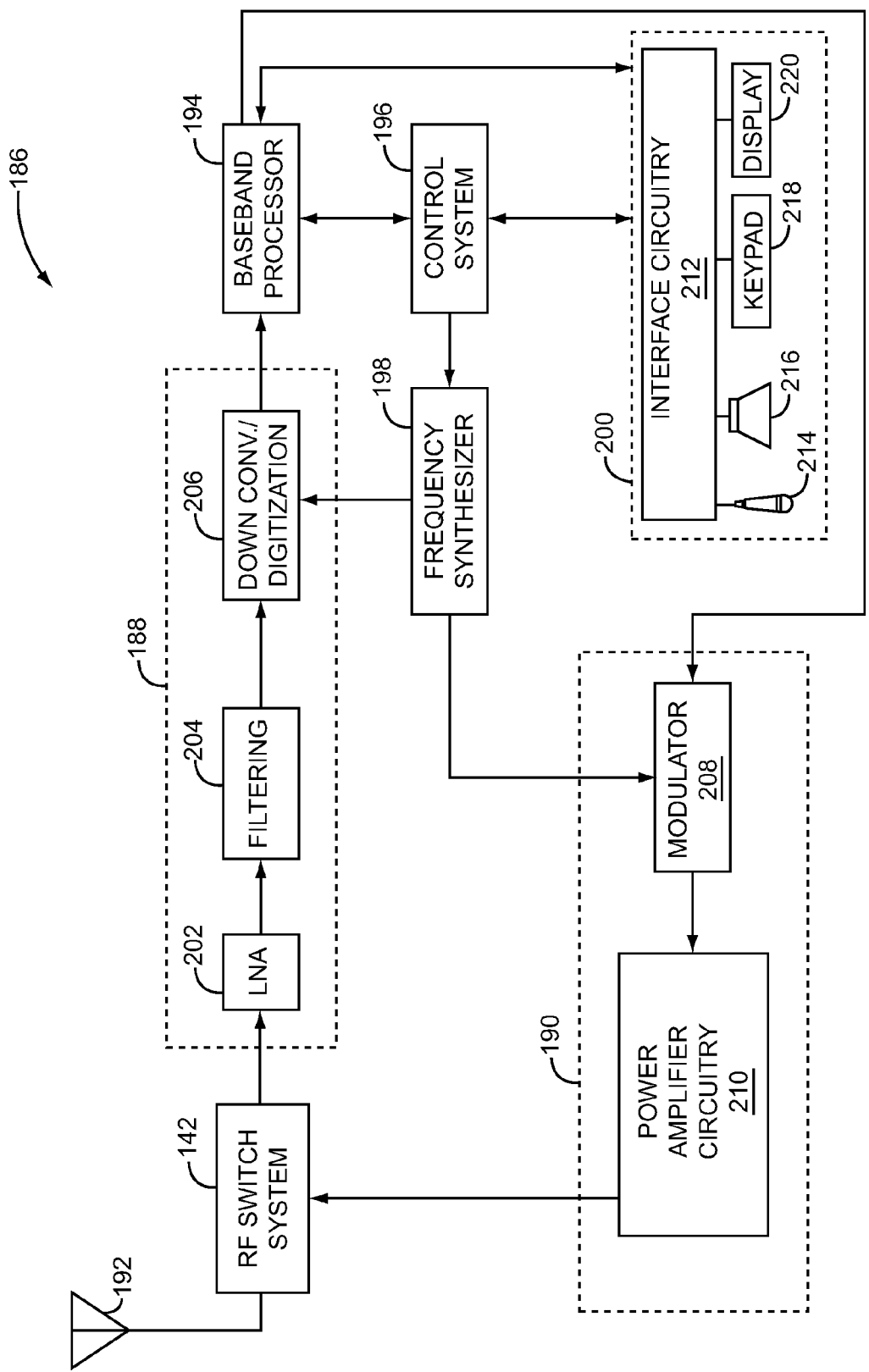
FIG. 15 shows an application example of the present disclosure used in a mobile terminal.

An application example of the RF switch system 142 is its use in a mobile terminal 186, the basic architecture of which is represented in FIG. 15. The mobile terminal 186 may include a receiver front end 188, a radio frequency transmitter section 190, an antenna 192, the RF switch system 142, a baseband processor 194, a control system 196, a frequency synthesizer 198, and an interface 200. The receiver front end 188 receives information bearing radio frequency signals from one or more remote transmitters provided by a base station (not shown). A low noise amplifier (LNA) 202 amplifies the signal. A filter circuit 204 minimizes broadband interference in the received signal, while down conversion and digitization circuitry 206 down converts the filtered, received signal to an intermediate or baseband frequency signal, which is then digitized into one or more digital streams. The receiver front end 188 typically uses one or more mixing frequencies generated by the frequency synthesizer 198. The baseband processor 194 processes the digitized received signal to extract the information or data bits conveyed in the received signal. This processing typically comprises demodulation, decoding, and error correction operations. As such, the baseband processor 194 is generally implemented in one or more digital signal processors (DSPs).

On the transmit side, the baseband processor 194 receives digitized data, which may represent voice, data, or control information, from the control system 196, which it encodes for transmission. The encoded data is output to the transmitter 190, where it is used by a modulator 208 to modulate a carrier signal that is at a desired transmit frequency. Power amplifier circuitry 210 amplifies the modulated carrier signal to a level appropriate for transmission, and delivers the amplified and modulated carrier signal to the antenna 192 through the RF switch system 142.

A user may interact with the mobile terminal 186 via the interface 200, which may include interface circuitry 212 associated with a microphone 214, a speaker 216, a keypad 218, and a display 220. The interface circuitry 212 typically includes analog-to-digital converters, digital-to-analog converters, amplifiers, and the like. Additionally, it may include a voice encoder/decoder, in which case it may communicate directly with the baseband processor 194. The microphone 214 will typically convert audio input, such as the user's voice, into an electrical signal, which is then digitized and passed directly or indirectly to the baseband processor 194. Audio information encoded in the received signal is recovered by the baseband processor 194, and converted by the interface circuitry 212 into an analog signal suitable for driving the speaker 216. The keypad 218 and display 220 enable the user to interact with the mobile terminal 186, input numbers to be dialed, address book information, or the like, as well as monitor call progress information.

Figure 16:
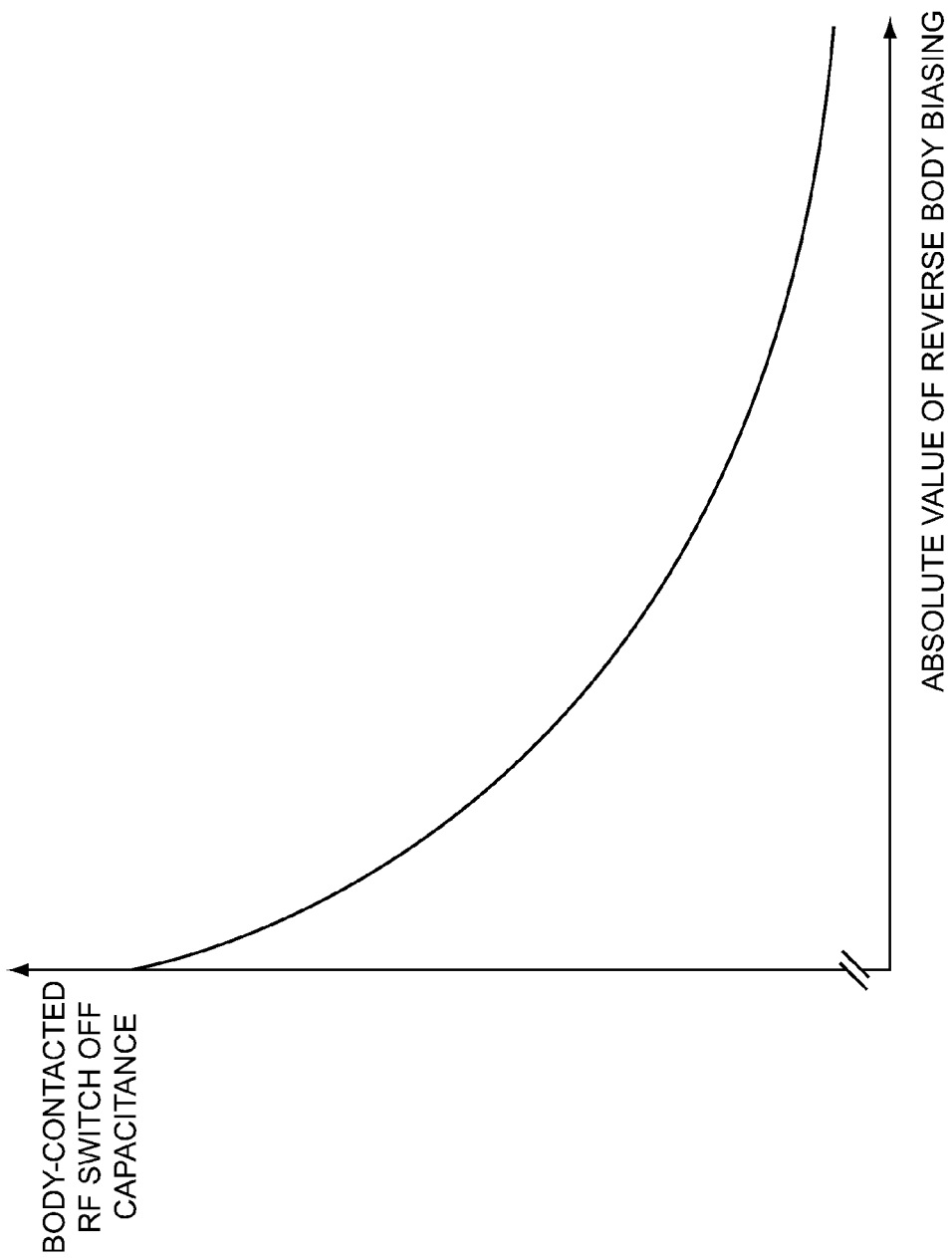
FIG. 16 is a graph illustrating a relationship between a body-contacted RF switch OFF capacitance of the first body-contacted RF switch and an absolute value of reverse body biasing of the first body-contacted RF switch.

FIG. 16 is a graph illustrating a relationship between a body-contacted RF switch OFF capacitance of the first body-contacted RF switch 92 (FIGS. 13 and 14) and an absolute value of reverse body biasing of the first body-contacted RF switch 92. The body-contacted RF switch OFF capacitance is between the first and the second switch connection nodes 102, 104 (FIGS. 13 and 14) when the first body-contacted RF switch 92 is in an OFF state. As mentioned above, reverse body biasing each FET element, which is in an OFF state, in the first body-contacted RF switch 92 may reduce drain-to-source capacitance of each FET element. Since the FET elements are coupled in series, the body-contacted RF switch OFF capacitance may be reduced by the reverse body biasing.

FIG. 16 shows that as the absolute value of the reverse body biasing increases, the body-contacted RF switch OFF capacitance decreases, which may effectively increase RF isolation of the first body-contacted RF switch 92. The insertion loss of the first body-contacted RF switch 92 may be similar to the insertion loss of a similarly constructed floating-body RF switch. Therefore, reverse body biasing may improve the trade-off between insertion loss and RF isolation.

Additionally, reverse body biasing may improve the linearity of the first body-contacted RF switch 92 by operating where the slope of the capacitance versus the reverse body biasing curve illustrated in FIG. 16 is shallow instead of steep. Linearity of an RF switch is provided by maintaining a constant RF switch OFF capacitance over changes in magnitudes of RF signal levels across the RF switch. RF signals across an RF switch modulate the body biasing of the RF switch. However, modulating body biasing modulates the RF switch OFF capacitance as illustrated in FIG. 16. As magnitudes of the RF signals increase, magnitudes of the modulations increase, thereby causing non-linearity in the RF switch 92. Further, by examining the shape of the curve illustrated in FIG. 16, when the absolute value of reverse body biasing is close to zero, the slope of the curve is steep, thereby causing large modulations of the RF switch OFF capacitance due to modulations of the body biasing. Such large modulations of the RF switch OFF capacitance may cause significant non-linearity in the RF switch. However, when the absolute value of reverse body biasing is large, the slope of the curve is shallow, thereby reducing modulations of the RF switch OFF capacitance due to modulations of the body biasing. Such reduced modulations of the body-contacted RF switch OFF capacitance may significantly improve linearity in the first body-contacted RF switch 92.

Figure 17:
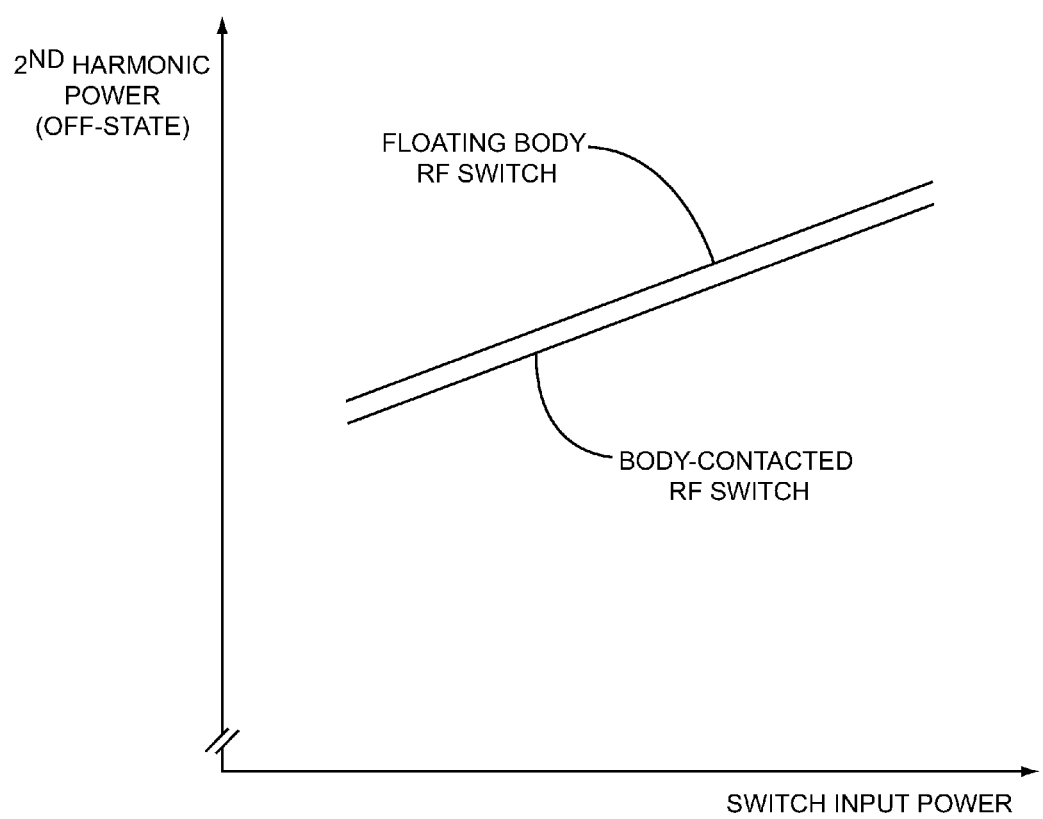
FIG. 17 is a graph illustrating a relationship between second harmonic power of both floating-body and body-contacted RF switches in an OFF state and input power to the RF switches.
Figure 18:
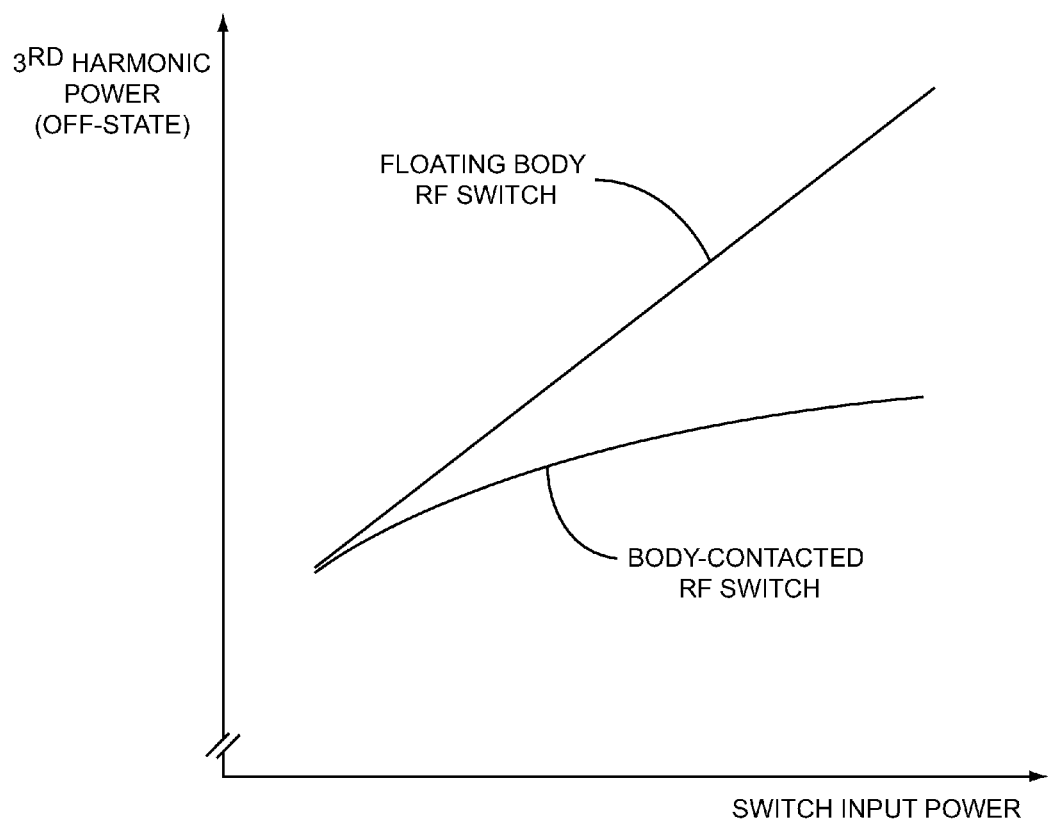
FIG. 18 is a graph illustrating a relationship between third harmonic power of both floating-body and body-contacted RF switches in an OFF state and input power to the RF switches.

FIG. 17 is a graph illustrating a relationship between second harmonic power of both floating-body and body-contacted RF switches in an OFF state and input power to the RF switches. Further, FIG. 18 is a graph illustrating a relationship between third harmonic power of both floating-body and body-contacted RF switches in an OFF state and input power to the RF switches. Harmonic power may be one measure of harmonic distortion, which may degrade the linearity of the first body-contacted RF switch 92 (FIGS. 13 and 14). Harmonic distortion may be caused by changes in the body-contacted RF switch OFF capacitance resulting from the time-varying nature of RF signals between the first and the second switch connection nodes 102, 104 of the first body-contacted RF switch 92. As mentioned above, the body-contacted RF switch OFF capacitance may result from capacitances of series-coupled FET elements in the first body-contacted RF switch 92. Each FET element may have a drain-to-body capacitance, a drain-to-gate capacitance, and a drain-to-source capacitance. By applying reverse body biasing, the drain-to-body capacitance may be reduced and may have a reduced sensitivity to changes in input power, when compared to a floating-body RF switch. As a result, as illustrated in FIG. 17, the second harmonic power of the first body-contacted RF switch 92 is slightly less than corresponding second harmonic power of the floating-body RF switch. However, as illustrated in FIG. 18, the third harmonic power of the first body-contacted RF switch 92 is significantly less than the third harmonic power of the floating-body RF switch, particularly as input power increases.

Figure 19:
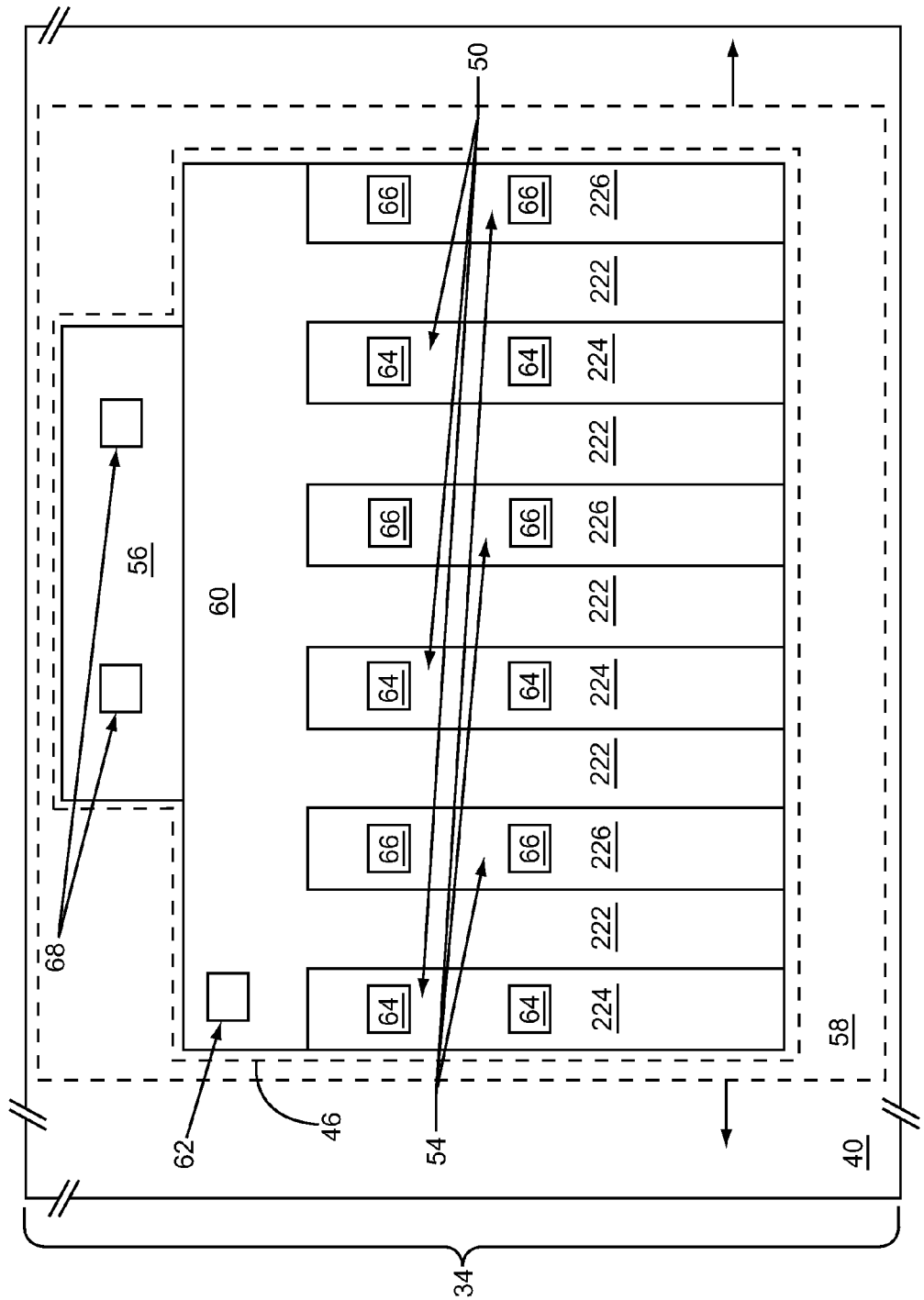
FIG. 19 shows a top view of details of the first body-contacted FET element illustrated in FIG. 4 according to one embodiment of the first body-contacted FET element.

FIG. 19 shows a top view of details of the first body-contacted FET element 46 illustrated in FIG. 4 according to one embodiment of the first body-contacted FET element 46. The first body-contacted FET element 46 illustrated in FIG. 19 is similar to the first body-contacted FET element 46 illustrated in FIG. 7, except in the first body-contacted FET element 46 illustrated in FIG. 19, the first gate 60 has multiple gate fingers 222, the first source 50 has multiple source fingers 224, and the first drain 54 has multiple drain fingers 226. Each of the multiple gate fingers 222 may be between one of the multiple source fingers 224 and one of the multiple drain fingers 226. Further, each of the multiple source fingers 224 may have at least one of the first source contacts 64. Similarly, each of the multiple drain fingers 226 may have at least one of the first drain contacts 66. Other embodiments of the first body-contacted FET element 46 may have any arrangement of the first gate 60, the first drain 54, and the first source 50 including any number of source fingers 224, drain fingers 226, and gate fingers 222.

Figure 20:
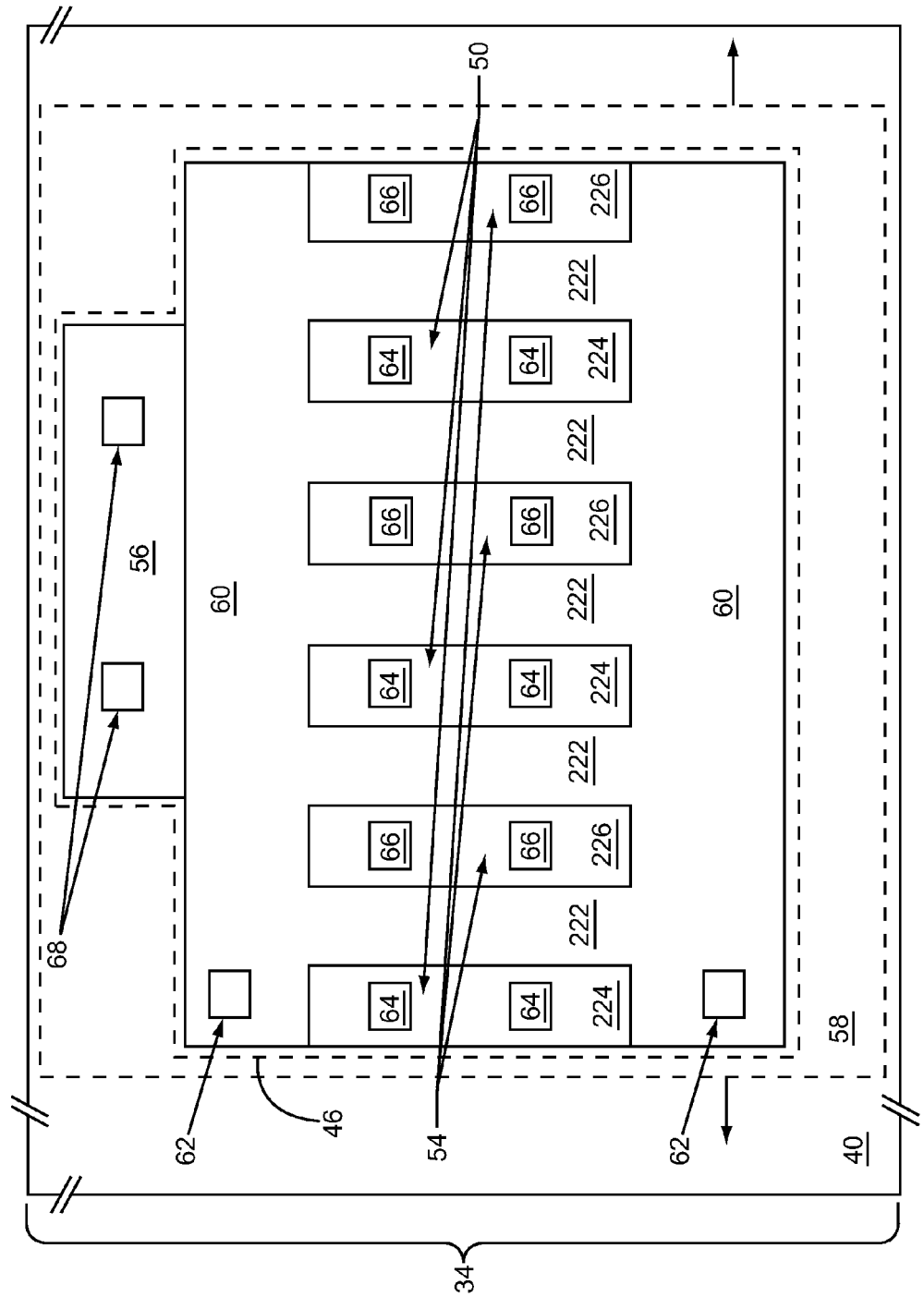
FIG. 20 shows a top view of details of the first body-contacted FET element illustrated in FIG. 4 according to an alternate embodiment of the first body-contacted FET element.

FIG. 20 shows a top view of details of the first body-contacted FET element 46 illustrated in FIG. 4 according to an alternate embodiment of the first body-contacted FET element 46. The first body-contacted FET element 46 illustrated in FIG. 20 is similar to the first body-contacted FET element 46 illustrated in FIG. 19, except in the first body-contacted FET element 46 illustrated in FIG. 20, the multiple gate fingers 222 are coupled together at both ends instead of only at one end as illustrated in FIG. 19. Further, both ends of the first gate 60 may have at least one first gate contact 62.

Some of the circuitry previously described may use discrete circuitry, integrated circuitry, programmable circuitry, non-volatile circuitry, volatile circuitry, software executing instructions on computing hardware, firmware executing instructions on computing hardware, the like, or any combination thereof. The computing hardware may include mainframes, micro-processors, micro-controllers, DSPs, the like, or any combination thereof.

None of the embodiments of the present disclosure are intended to limit the scope of any other embodiment of the present disclosure. Any or all of any embodiment of the present disclosure may be combined with any or all of any other embodiment of the present disclosure to create new embodiments of the present disclosure.

Those skilled in the art will recognize improvements and modifications to the preferred embodiments of the present disclosure. All such improvements and modifications are considered within the scope of the concepts disclosed herein and the claims that follow.

What is claimed is:
1. A semiconductor die comprising:
an insulating layer;
a thin-film semiconductor device layer over the insulating layer;
a first body-contacted radio frequency (RF) switch having one of an ON state and an OFF state, and a non-operating state and comprising a first plurality of body-contacted field effect transistor (FET) elements coupled in series, such that each body-contacted FET element comprises a source, a drain, and a body formed in at least a part of the thin-film semiconductor device layer, wherein each one of the first plurality of body-contacted FET elements are separated from one another in the thin-film semiconductor device layer by an insulating material; and
control circuitry coupled to each one of the first plurality of body-contacted FET elements, wherein during the OFF state of the first body-contacted RF switch, the control circuitry provides each body a body bias signal, such that each body and each corresponding source are reverse biased and each body and each corresponding drain are reverse biased to provide reverse body biasing of each corresponding body-contacted FET element.

2. The semiconductor die of claim 1 wherein:
the control circuitry is further adapted to:
  select the OFF state of the first body-contacted RF switch; and
  provide a first body bias control signal, such that each body bias signal is based on the first body bias control signal.

3. The semiconductor die of claim 2 wherein the first body-contacted RF switch further comprises:
  a first body bias input adapted to receive the first body bias control signal; and
  a resistor bias network comprising a plurality of body bias resistive elements, such that each of at least some of the plurality of body bias resistive elements is coupled between a body of a corresponding one of the first plurality of body-contacted FET elements and the first body bias input.

4. The semiconductor die of claim 3 wherein:
the control circuitry is further adapted to provide a first switch control signal based on one of the OFF state and the ON state;
the first body-contacted RF switch further comprises a first switch connection node and a second switch connection node, such that all of the first plurality of body-contacted FET elements are coupled in series between the first switch connection node and the second switch connection node;
during the OFF state, the first body-contacted RF switch has an OFF state impedance between the first switch connection node and the second switch connection node; and
during the ON state, the first body-contacted RF switch has an ON state impedance between the first switch connection node and the second switch connection node.

5. The semiconductor die of claim 4 wherein:
the first body-contacted RF switch further comprises a first switch control input adapted to receive the first switch control signal; and
each of the first plurality of body-contacted FET elements further comprises a gate, which is coupled to the first switch control input.

6. The semiconductor die of claim 5 wherein the resistor bias network further comprises a plurality of gate resistive elements, such that each of at least some of the plurality of gate resistive elements is coupled between the gate of a corresponding one of the first plurality of body-contacted FET elements and the first switch control input.

7. The semiconductor die of claim 6 wherein:
during the OFF state:
  the first switch connection node has a direct current (DC) voltage equal to about zero volts;
  the second switch connection node has a DC voltage equal to about zero volts;
  the first body bias control signal is equal to between about −1 volt DC (VDC) and about −5VDC; and
  the first switch control signal is equal to between about −1VDC and about −5VDC; and
during the ON state:
  the first switch connection node has a DC voltage equal to about zero volts;
  the second switch connection node has a DC voltage equal to about zero volts;
  the first body bias control signal is equal to about zero volts; and
  the first switch control signal is equal to between about 1VDC and about 5VDC.

8. The semiconductor die of claim 1 wherein a thickness of the thin-film semiconductor device layer is less than about 500 nanometers.

9. The semiconductor die of claim 8 wherein a thickness of the insulating layer is greater than the thickness of the thin-film semiconductor device layer.

10. The semiconductor die of claim 9 wherein the thickness of the thin-film semiconductor device layer is between about 100 nanometers and about 300 nanometers and the thickness of the insulating layer is between about 200 nanometers and about 1000 nanometers.

11. The semiconductor die of claim 9 further comprising a substrate, such that the insulating layer is over the substrate, and a resistivity of the substrate is greater than about 100 ohm-centimeters.

12. The semiconductor die of claim 1 wherein the source of each of the first plurality of body-contacted FET elements and the drain of each of the first plurality of body-contacted FET elements completely traverse a thickness of the thin-film semiconductor device layer.

13. The semiconductor die of claim 12 wherein:
the source of each of the first plurality of body-contacted FET elements comprises N-type silicon;
the drain of each of the first plurality of body-contacted FET elements comprises N-type silicon; and
the body of each of the first plurality of body-contacted FET elements comprises P-type silicon.

14. The semiconductor die of claim 12 wherein:
the source of each of the first plurality of body-contacted FET elements comprises P-type silicon;
the drain of each of the first plurality of body-contacted FET elements comprises P-type silicon; and
the body of each of the first plurality of body-contacted FET elements comprises N-type silicon.

15. The semiconductor die of claim 1 wherein the first body-contacted RF switch further comprises a first switch connection node and a second switch connection node, such that:
  all of the first plurality of body-contacted FET elements are coupled in series between the first switch connection node and the second switch connection node; and
  during the OFF state of the first body-contacted RF switch, an RF signal between the first switch connection node and the second switch connection node is distributed across the first plurality of body-contacted FET elements.

16. The semiconductor die of claim 15 wherein a frequency of the RF signal is greater than about 100 megahertz.

17. The semiconductor die of claim 16 wherein during the OFF state of the first body-contacted RF switch, the RF signal between the first switch connection node and the second switch connection node is distributed about equally across the first plurality of body-contacted FET elements.

18. The semiconductor die of claim 1 further comprising a substrate wherein:
  the insulating layer is over the substrate; and
  the insulating layer substantially eliminates conduction paths through the substrate to the other devices.

19. The semiconductor die of claim 1 wherein the thin-film semiconductor device layer is partially-depleted and not fully-depleted.

20. The semiconductor die of claim 1 further comprising a second body-contacted RF switch coupled between the first body-contacted RF switch and ground.

21. The semiconductor die of claim 1 wherein the thin-film semiconductor device layer comprises silicon.

22. The semiconductor die of claim 21 further comprising a silicon-on-insulator (SOI) substrate, such that:
   the semiconductor die is an SOI semiconductor die;
   the insulating layer is an SOI insulating layer, which is over the SOI substrate; and
   the thin-film semiconductor device layer is a thin-film SOI device layer.

23. The semiconductor die of claim 1 wherein the insulating layer provides a substrate of the semiconductor die.

24. The semiconductor die of claim 23 wherein the insulating layer comprises sapphire.

25. The semiconductor die of claim 1 further comprising a plurality of drain-to-source resistive elements, such that each of the plurality of drain-to-source resistive elements is coupled between a corresponding drain and a corresponding source of the first plurality of body-contacted FET elements.

* * * * *